(12) United States Patent
Ono et al.

(10) Patent No.: US 7,857,530 B2
(45) Date of Patent: Dec. 28, 2010

(54) DEVELOPING METHOD AND DEVELOPING UNIT

(75) Inventors: Yuko Ono, Nirasaki (JP); Junichi Kitano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 364 days.

(21) Appl. No.: 12/216,751

(22) Filed: Jul. 10, 2008

(65) Prior Publication Data
US 2008/0284989 A1 Nov. 20, 2008

Related U.S. Application Data

(62) Division of application No. 11/898,693, filed on Sep. 14, 2007, now Pat. No. 7,427,168, which is a division of application No. 11/181,770, filed on Jul. 15, 2005, now abandoned, which is a division of application No. 10/373,063, filed on Feb. 26, 2003, now Pat. No. 6,955,485.

(30) Foreign Application Priority Data

| Mar. 1, 2002 | (JP) | ............................. 2002-056563 |
| Mar. 1, 2002 | (JP) | ............................. 2002-056642 |
| Mar. 1, 2002 | (JP) | ............................. 2002-056665 |

(51) Int. Cl.
*G03D 5/00* (2006.01)
*G03C 5/00* (2006.01)
*B08B 3/12* (2006.01)

(52) U.S. Cl. .................... 396/578; 396/611; 430/30; 134/1.3; 134/902

(58) Field of Classification Search ................ 396/578, 396/611; 430/30; 134/1.3, 902; 438/745, 438/746, 747, 748
See application file for complete search history.

(56) References Cited

U.S. PATENT DOCUMENTS 4,755,844 A 7/1988 Tsuchiya et al.
(Continued)

FOREIGN PATENT DOCUMENTS

| JP | 63-172269 | 7/1988 |
| JP | 06-186754 | 7/1994 |
| JP | 06-267838 | 9/1994 |
| JP | 06-282080 A | 10/1994 |
| JP | 07-120935 A | 5/1995 |

(Continued)

OTHER PUBLICATIONS

JPO Office Action—Notification of Reason for Refusal (4 pages) with English translation (2 pages), App. No. 2003-053152, Dispatch No. 456814, Dispatch Date: Sep. 18, 2007.

(Continued)

*Primary Examiner*—Alan A Mathews
(74) *Attorney, Agent, or Firm*—Rader, Fishman & Graucer PLLC

(57) ABSTRACT

In a developing method for performing developing treatment of a substrate by supplying a developing solution onto a resist film formed on a surface of the substrate, the present invention controls a zeta potential of the surface of the substrate at a predetermined potential in the same polarity as that of a zeta potential of insoluble substances floating in the developing solution, thereby preventing or reducing the adhesion of the insoluble substances to the resist film and the substrate. This remedies the occurrence of development defects. The adhesion of the insoluble substances to the resist film and the substrate can also be prevented or inhibited by supplying an acid liquid to a liquid on the substrate, or controlling a pH value of the liquid on the substrate to control an absolute value of the zeta potential of the insoluble substances.

4 Claims, 43 Drawing Sheets

U.S. PATENT DOCUMENTS

| | | |
|---|---|---|
| 5,575,706 A | 11/1996 | Tsai et al. |
| 6,191,040 B1 | 2/2001 | Glass |
| 6,277,203 B1 | 8/2001 | Jiang et al. |
| 6,488,038 B1 | 12/2002 | Bergman |
| 2002/0157686 A1* | 10/2002 | Kenny et al. ............ 134/1.3 |
| 2002/0170572 A1 | 11/2002 | Tomita et al. |

FOREIGN PATENT DOCUMENTS

| | | |
|---|---|---|
| JP | 07-142342 | 6/1995 |
| JP | 08-055776 A | 2/1996 |
| JP | 08-083745 A | 3/1996 |
| JP | 08-102456 A | 4/1996 |
| JP | 08-167551 A | 6/1996 |
| JP | 09-134899 A | 5/1997 |
| JP | 11-288105 | 10/1999 |
| JP | 11-295902 | 10/1999 |
| JP | 2001-070898 A | 3/2001 |
| JP | 2001-077006 A | 3/2001 |
| JP | 2001-215734 | 8/2001 |

OTHER PUBLICATIONS

JPO Office Action—Notification for Reason for Refusal (3 pages) with English translation (2 pages), App. No. 2003-053152, Dispatch No. 638648, Dispatch Date: Dec. 18, 2007.

Japanese Notification of Reason for Refusal w/ English translation, DN163865, May 17, 2005.

Notification of Reason for Refusal, Japanese Patent Application No. 2003-053101, Dispatch No. 136002, Dispatch Date: Apr. 11, 2006.

* cited by examiner

DEVELOPING METHOD AND DEVELOPING UNIT

The present application is a divisional of application Ser. No. 11/898,693, filed on Sept. 14, 2007, which is a divisional of Ser. No. 11/181,770, filed on Jul. 15, 2005, now abandoned, which was a divisional of application Ser. No. 10/373,063, filed on Feb. 26, 2003, now U.S. Pat. No. 6,955,485 which is based on Japanese Priority Application Nos. JP2002-056563 filed in the Japanese Patent Office on Mar. 1, 2002, JP2002-056642, filed on Mar. 1, 2002 and JP2002-056665, filed on Mar. 1, 2002.

BACKGROUND OF THE INVENTION

1. Field of the Invention

The present invention relates to a substrate developing method and a substrate developing unit.

2. Description of the Related Art

In a photolithography step of semiconductor device fabricating processes, resist coating treatment of applying a resist solution being, for example, a photosensitive resin to a surface of a wafer to form a resist film on the wafer, exposure processing of exposing a predetermined circuit pattern on the wafer on which this resist film is formed, and developing treatment of supplying a developing solution onto the wafer after the exposure processing to dissolve the resist film at exposed portions are performed in sequence.

In the abovementioned developing treatment, a strong alkaline developing solution is supplied onto the wafer, and is loaded on the wafer. Then, while this liquid loaded state is maintained for a predetermined period of time, the wafer is subjected to static development. In this static development, a part of the resist film, that is, exposed portions caused to have solubility in the developing solution by the exposure dissolve in the developing solution. When the static development for the predetermined period of time is finished, the wafer is rotated and a cleaning liquid, for example, a pure water is supplied onto the wafer so that the developing solution is replaced with the pure water. Thereafter, the supply of the pure water is stopped and the wafer is dried by liquid shaking-off by a centrifugal force so that a series of the developing treatment is finished.

In the actual static development described above, however, the resist film at all the exposed portions does not appropriately dissolve in the developing solution, and so-called insoluble substances which are in an insoluble state in the developing solution are precipitated in the developing solution from the exposed portions having been subjected to insufficient exposure, boundaries between the exposed portions given an insufficient exposure amount and unexposed portions, and so on.

Here, particles of insoluble substances dispersed in a liquid are usually electrically charged, and the electrically charged state of the surface of the particle (a surface potential) is generally evaluated by a zeta potential. The zeta potential represents a potential near the surface of the particle, and more precisely, is a potential at a part of a diffusion layer (sliding surface) on the periphery of a fixed layer formed around the particle in the liquid, with a position at infinity from the particle being a reference. Since the zeta potential of the particle is dependent on the polarity of the liquid surrounding the particle, it is influenced by the number of ions, that is, a pH value of the liquid. Generally, the zeta potential tends to be low in an alkaline liquid due to the existence of many negative ions while, in an acid liquid, it tends to be high due to the existence of many positive ions.

It has been confirmed from experiments conducted by the inventors that, in the above-described developing treatment, the zeta potential of the insoluble substances floating in the developing solution is negative due to the strong alkaline developing solution. It has been also confirmed that the zeta potential of the surface of the wafer in contact with the developing solution is also negatively charged.

The inventors has also confirmed that, when the developing solution is replaced with the pure water after the pure water is supplied onto the rotated wafer as described above, the pH value of the developing solution drastically lowers, resulting in the increase of the zeta potential of the insoluble substances toward 0 mV. Such decrease in the absolute value of the zeta potential of the insoluble substances weakens an electrostatic repulsive force between the insoluble substances and the surface of the wafer, and, in turn, relatively strengthens an intermolecular force to cause adhesion of the insoluble substances onto the surface of the wafer. Especially, when the absolute value of the zeta potential of the insoluble substances is decreased, the insoluble substances cohere together to grow into particles having a larger intermolecular force so that they easily adhere onto the wafer.

As a result, the insoluble substances adhering to the wafer cannot be removed easily even by the wafer cleaning at the time of rinsing, and the residual insoluble substances have been a cause of development defects. Further, it is necessary to keep supplying the pure water to the wafer for a long time in order to wash and remove the insoluble substances adhering to the surface of the wafer, resulting in increase in a total developing time, which lowers a throughput of the wafer treatment.

Further, a resist used in the above-described resist coating treatment includes a photoacid generator (PAG) which generates acid when being irradiated with light. For example, in a positive resist, a protecting group having an insolubilizing function in the developing solution and being releasable with acid is released therefrom due to the acid generated by the exposure, so that the exposed portions thereof are caused to have solubility in the developing solution. In a negative resist, the acid generated by the exposure induces a cross-linking reaction of a resin soluble in the developing solution, and thus the exposed portions thereof are caused to have insolubility in the developing solution. Then, by the supply of the developing solution in the above-described developing treatment, the exposed portions dissolve in the developing solution in the case of the positive resist while, in the case of the negative resist, the unexposed portions dissolve in the developing solution with the exposed portions kept undissolved, so that a predetermined resist pattern is formed on the wafer.

Actually, however, a sufficient amount of exposure is not given to the boundaries between the exposed portions and the unexposed portions in a chemical point of view. This means that the boundary is inferior in solubility in the developing solution. Further, in the case of, for example, the positive resist, the surface portions of even the unexposed portions of the resist slightly dissolve in the developing solution. So-called film-reduced portions of the unexposed portions are extremely inferior in solubility in the developing solution so that they are easily precipitated in the developing solution. Such existence of the portions inferior in solubility in the developing solution causes, for example, resist polymers half-released from the protecting group to float in the developing solution and, due to the cohesion or the like of the resist polymers, these resist polymers thereafter grow into resist particles, which sometimes adhere to the wafer. This re-adhesion of the resist particles causes development defects and prevents proper developing treatment. Moreover, in this case, a sufficient cleaning time is required for removing the adhering resist particles, resulting in an increase in a total developing time, which lowers throughput.

In a developing step in the above-described developing treatment, a predetermined portions of the resist film, for example, the exposed portions are dissolved due to the developing solution, and the insoluble substances which are kept undissolved and float in the developing solution are rinsed by the pure water in a cleaning step.

However, when the pure water is supplied onto the wafer after the aforesaid static development, the developing solution on the wafer is diluted so that the pH value of the liquid on the wafer drastically lowers to be close to neutrality. When the liquid on the wafer thus becomes closer to neutrality, the zeta potential of the insoluble substances, for example, the resist particles dispersed in this liquid becomes closer to 0 mV.

Since the decrease in the absolute value of the zeta potential of the insoluble substances lowers the electrical repulsive force among the insoluble substances, the insoluble substances cohere together to grow the particle size of the insoluble substances. The insoluble substances whose particle size has grown turn into impurities liable to influence the developing treatment, which has been a cause of the development defects.

Moreover, when the insoluble substances cohere together, they easily adhere to the wafer and the resist film. It can be reasoned that this adhesion is caused because an intermolecular force among the insoluble substances is strengthened. The insoluble substances once adhering onto the wafer and so on cannot be removed easily even when the wafer is rotated in an attempt to shake them off by the centrifugal force, and the residual insoluble substances have been a cause of the development defects. In addition, the pure water needs to be kept supplied to the wafer for a long time in order to remove the adhering insoluble substances from the surface of the wafer and so on.

SUMMARY OF THE INVENTION

The present invention is made in consideration of the above circumstances, and an object thereof is to prevent the adhesion of insoluble substances floating in a developing solution onto the surface of a substrate such as a wafer, thereby reducing development defects and a developing treatment time. Another object of the present invention is to sufficiently secure solubility in the developing solution of predetermined portions of a resist, thereby performing proper developing treatment. Still another object of the present invention is to prevent the insoluble substances floating in the developing solution from cohering together.

In order to attain these objects, in a developing method of the present invention, developing treatment is performed by controlling a zeta potential of a substrate surface to be a predetermined potential in the same polarity as that of a zeta potential of insoluble substances floating in a developing solution.

According to another aspect, in a developing method of the present invention, a charged member electrically charged in an opposite polarity to that of a zeta potential of insoluble substances floating in a developing solution is brought into contact with the developing solution.

According to still another aspect, in a developing method of the present invention, a charged member electrically charged to the same polarity as that of a zeta potential of insoluble substances floating in a developing solution is brought into contact with the developing solution on the substrate and the charged member is moved.

According to yet another aspect, in a developing method of the present invention, a potential gradient is given to a substrate supplied with a developing solution, and a potential of the substrate is cocentrically changed with time.

According to yet another aspect, in a developing method of the present invention, a developing solution is supplied onto a resist film while the resist film is set to a room temperature or higher, for example, 25° C. to 100° C., more preferably, 40° C. to 80° C.

According to yet another aspect, in a developing method of the present invention, a developing solution is supplied onto a resist film while a substrate is set to a room temperature or higher, for example, 40° C. to 200° C., more preferably, 40° C. to 160° C.

According to yet another aspect, a developing method of the present invention has a first step of loading a developing solution on a substrate, a second step of subjecting the substrate to static development while the developing solution is loaded on the substrate, and a third step of supplying a cleaning liquid to the substrate to clean the substrate after the static development, and between the second step and the third step, the substrate is supplied with a liquid larger in specific gravity than the cleaning liquid, for forming a liquid layer between the developing solution and a surface of a resist film.

According to yet another aspect, in a developing method of the present invention, an ionic surfactant having a predetermined polarity is added to a developing solution, and the ionic surfactant is made to adhere to insoluble substances floating in the developing solution and a surface of a substrate.

According to yet another aspect, a developing method of the present invention is a developing method for performing developing treatment of a substrate by applying a resist solution onto a surface of a substrate to form a resist film and supplying a developing solution onto the formed resist film, in which the resist solution is applied to the surface of the substrate, with an ionic surfactant in a predetermined polarity being mixed in the resist solution.

According to yet another aspect, a developing method of the present invention is a developing method for performing developing treatment of a substrate by supplying a developing solution onto a resist film formed on a surface of the substrate, in which an ionic surfactant in a predetermined polarity is supplied onto a surface of the resist film before the developing solution is supplied.

A polymer nonionic surfactant may be used in place of the ionic surfactant.

According to yet another aspect, in a developing method of the present invention, when a resist film formed on a surface of a substrate has conductivity, a voltage is applied to this resist film to keep this resist film at a potential in the same polarity as that of insoluble substances in a developing solution at least during developing treatment.

A developing unit of the present invention is a developing unit performing developing treatment of a substrate by supplying a developing solution onto a resist film formed on a surface of the substrate, and has a charging unit electrically charging the surface of the substrate to a zeta potential in a predetermined polarity.

According to yet another aspect, a developing unit of the present invention has an ion atmosphere supply section supplying a periphery of a substrate with an atmosphere including ions in a predetermined polarity.

According to yet another aspect, a developing unit of the present invention has a charged member electrically chargeable to a predetermined polarity and a charged member carrier carrying the charged member to bring the charged member into contact with a developing solution on a substrate.

According to yet another aspect, a developing unit of the present invention has a surfactant supply section supplying an ionic surfactant in a predetermined polarity onto a substrate.

According to yet another aspect, a developing unit of the present invention has a surfactant supply section supplying a nonionic surfactant onto a substrate.

According to yet another aspect, a developing unit of the present invention has a charging unit electrically charging a developing solution to a zeta potential in a predetermined polarity.

According to yet another aspect, a developing unit of the present invention has a charged member electrically charged to the same polarity as that of insoluble substances in a developing solution loaded on a resist film on a surface of a substrate, and a moving member moving the charged member above the substrate.

According to yet another aspect, a developing unit of the present invention has a plurality of electrodes disposed cocentrically on an upper surface of a mounting table on which a substrate is to be placed, a power supply applying a voltage to each of the electrodes, and a control section changing a potential of each of the electrodes with time.

According to yet another aspect, a developing unit of the present invention has a heating unit heating a substrate.

According to yet another aspect, a developing unit of the present invention has a mounting table supporting a substrate by clamping and a unit applying a voltage to a resist film on a substrate placed on the mounting table.

According to the present invention, since the adhesion of the insoluble substances floating in the developing solution to the surface of the substrate can be prevented or inhibited, proper developing treatment is achieved and yields are improved. Further, since the cleaning time during the developing treatment can be shortened, enhancement in throughput of substrate treatment is achieved.

According to yet another aspect of the present invention, the present invention is a developing method for performing developing treatment of a substrate by supplying a developing solution to the substrate coated with a resist and exposed in a predetermined pattern, in which an acid liquid is supplied to the substrate at a stage prior to the supply of the developing solution to the substrate after the substrate is coated with the resist.

According to yet another aspect of the present invention, the present invention is a developing method for performing developing treatment of a substrate by supplying a developing solution to the substrate coated with a resist and exposed in a predetermined pattern, in which an acid liquid is supplied to the substrate after the developing solution is supplied to the substrate.

According to yet another aspect of the present invention, the present invention is a developing method for performing developing treatment of a substrate by supplying a developing solution to the substrate coated with a resist and exposed in a predetermined pattern, in which an acid liquid is supplied to the substrate when the developing solution is washed away by a cleaning liquid after the developing treatment is performed by supplying the developing solution to the substrate.

According to yet another aspect of the present invention, the present invention is a developing method for performing developing treatment of a substrate by supplying a developing solution to the substrate coated with a resist and exposed in a predetermined pattern, in which an acid liquid is supplied to the substrate after the developing solution is washed away by a cleaning liquid after the developing treatment is performed by supplying the developing solution to the substrate, and thereafter, the cleaning liquid is supplied again to the substrate for cleaning.

According to yet another aspect of the present invention, the present invention is a developing method for performing developing treatment of a substrate by supplying a developing solution to the substrate coated with a resist and exposed in a predetermined pattern, in which an acid gas is supplied to the substrate at a stage prior to the supply of the developing solution to the substrate after the resist is applied to the substrate.

According to yet another aspect of the present invention, the present invention is a developing method for performing developing treatment of a substrate by supplying a developing solution to the substrate coated with a resist and exposed in a predetermined pattern, in which an acid gas is supplied to the substrate after the developing solution is supplied to the substrate.

According to yet another aspect of the present invention, the present invention is a developing method for performing developing treatment of a substrate by supplying a developing solution to the substrate coated with a resist and exposed in a predetermined pattern, in which an acid gas is supplied to the substrate after the developing solution is washed away by a cleaning liquid after the developing treatment is performed by supplying the substrate with the developing solution, and thereafter, the cleaning liquid is supplied again to the substrate for cleaning.

According to yet another aspect of the present invention, the present invention is a developing unit performing developing treatment of a substrate by supplying a developing solution to the substrate coated with a resist and having undergone exposure, and has an acid liquid supply section supplying an acid liquid to the substrate.

According to yet another aspect of the present invention, the present invention is a developing unit performing developing treatment of a substrate by supplying a developing solution to the substrate coated with a resist and having undergone exposure, and has an acid gas supply section supplying an acid gas to the substrate.

According to the present invention, solubility in the developing solution of a predetermined portion of the resist can be ensured so that the predetermined portion of the resist appropriately dissolves in the developing solution to enable the formation of a desired resist pattern. This can enhance yields. Further, the insoluble substances do not float in the developing solution and thus the re-adhesion of the insoluble substances to the substrate can be prevented, so that a cleaning time for removing the adhering insoluble substances can be shortened and enhancement in throughput can be also achieved.

According to yet another aspect of the present invention, the present invention is a developing method for performing developing treatment of a substrate having: a developing step of developing the substrate by supplying a developing solution onto the substrate on which a resist film is formed; and a cleaning step of supplying a cleaning liquid onto the substrate to clean the substrate after the developing step, and a pH value of a liquid on the substrate during the cleaning step is adjusted to such a pH value that an absolute value of a zeta potential of insoluble substances floating in the liquid becomes a maximum value.

The pH value of the liquid on the substrate during the cleaning step may be adjusted to such a pH value that the absolute value of the zeta voltage of the insoluble substances floating in the liquid becomes equal to or larger than a set value and the set value may be defined as a value equal to or larger than a minimum value with which the insoluble substances start to cohere together.

According to yet another aspect, the present invention is a developing unit performing a developing step of supplying a developing solution to a substrate and thereafter, a cleaning step of supplying a cleaning liquid to the substrate, and has a pH adjusting liquid supply section supplying a pH adjusting liquid onto the substrate in order to adjust a pH value of a liquid on the substrate during the cleaning step.

The inventors of the present invention has confirmed that a pH value of a liquid and a zeta potential of insoluble substances in the liquid has a certain correlation. According to the present invention, the pH value of the liquid on the substrate is so adjusted in the cleaning step that the absolute value of the zeta potential of the insoluble substances becomes the maximum value, and consequently, it is possible to prevent the insoluble substances from cohering together due to a decreased absolute value of the zeta potential of the insoluble substances during the cleaning step. Accordingly, neither the growth of the particle size of the insoluble substances nor the adhesion of the insoluble substances to the substrate or the like is caused, which enables reduction in development defects. Further, substances precipitated from the resist film, substances originally existing in the liquid, and substances entering the liquid from the outside may also be treated as the insoluble substances.

Moreover, when the pH value of the liquid on the substrate during the cleaning step is adjusted and the absolute value of the zeta voltage of the insoluble substances is maintained at a value equal to or a larger than a predetermined value with which the insoluble substances do not cohere together, the growth of the particle size of the insoluble substances can be prevented.

DETAILED DESCRIPTION OF THE INVENTION

Figure 1:
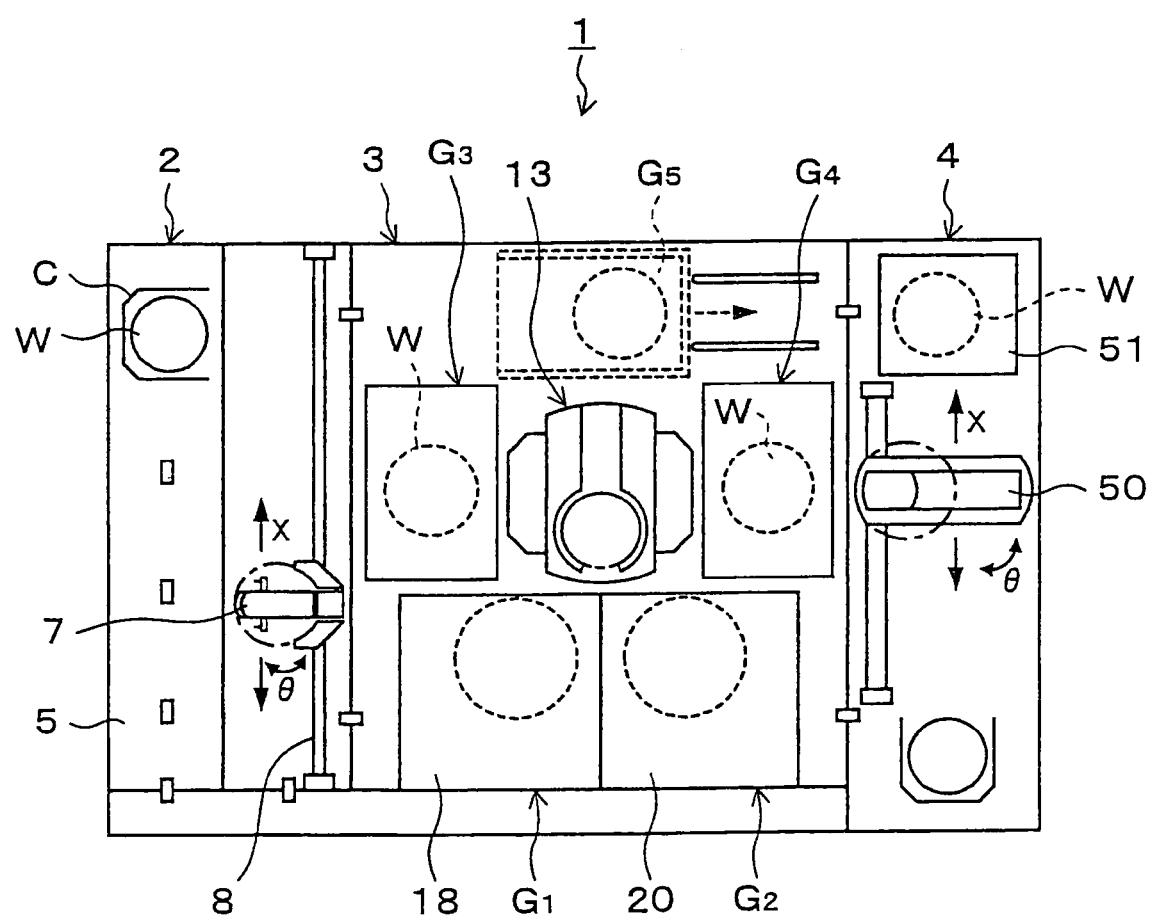
FIG. 1 is a plan view showing an external appearance of a coating and developing system having a developing unit where a developing method according to an embodiment is performed.
Figure 2:
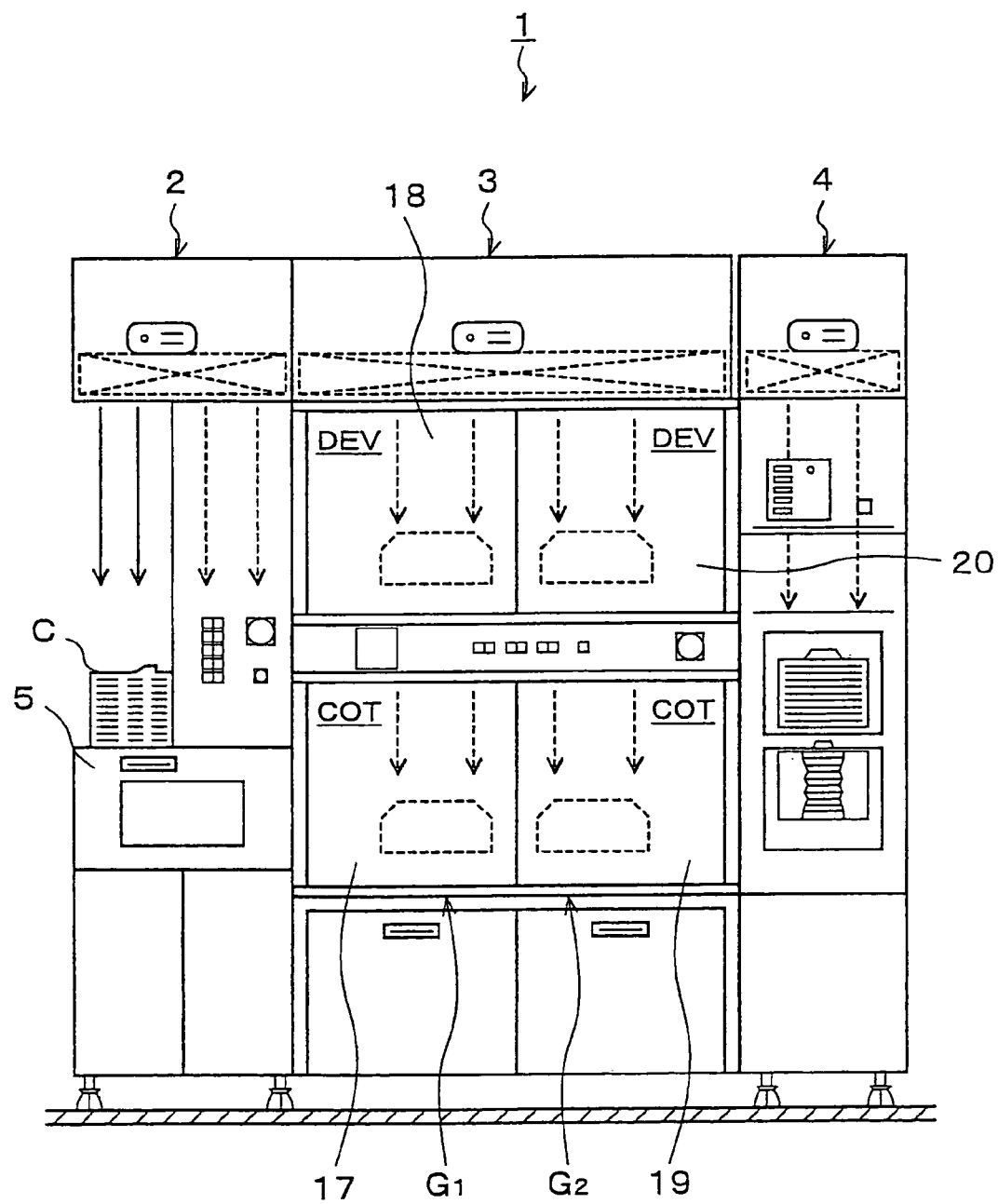
FIG. 2 is a front view of the coating and developing system in FIG. 1.
Figure 3:
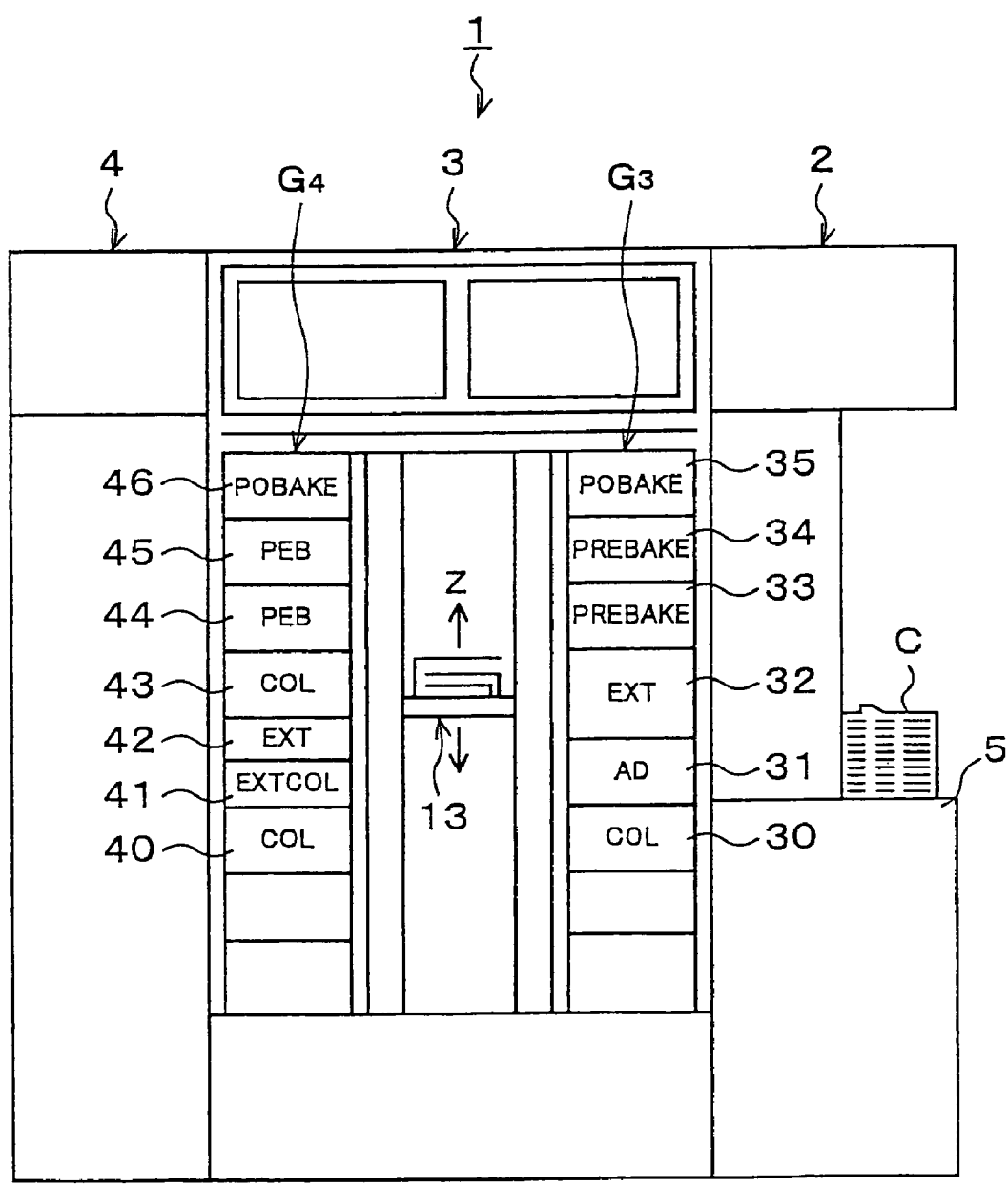
FIG. 3 is a rear view of the coating and developing system in FIG. 1.

Preferred embodiments of the present invention will be explained below. FIG. 1 is a plan view schematically showing the structure of a coating and developing system 1 having a developing unit where a developing method according to this embodiment is performed, FIG. 2 is a front view of the coating and developing system 1, and FIG. 3 is a rear view of the coating and developing system 1.

As shown in FIG. 1, the coating and developing system 1 has a structure in which integrally connected are a cassette station 2 for carrying, for example, 25 wafers W from/to the outside to/from the coating and developing system 1 in the unit of cassette and for carrying the wafers W into/from a cassette C, a processing station 3 in which various kinds of processing units for performing predetermined processing wafer by wafer in a coating and developing step are disposed in multi-tiers, and an interface section 4 provided adjacent to the processing station 3, for receiving and delivering the wafer W from/to a not-shown aligner.

In the cassette station 2, the plural cassettes C are mountable at predetermined positions on a cassette mounting table 5, which serves as a mounting section, in a line in an X-direction (a vertical direction in FIG. 1). Further, a wafer carrier 7, which is transferable in this cassette arrangement direction (the X-direction) and in a wafer arrangement direction of the wafers W housed in the cassette C (a Z-direction; a perpendicular direction), is provided to be movable along a carrier guide 8 so that it is structured to be able to selectively access each of the cassettes C.

The wafer carrier 7 has an alignment function of aligning the wafer. W. This wafer carrier 7 is structured to be capable of also accessing an extension unit 32 belonging to a third processing unit group G3 on the side of the processing station 3 as will be described later.

In the processing station 3, a main carrier 13 is provided in a center part thereof, and various kinds of the processing units are multi-tiered on the periphery of the main carrier 13 to constitute processing unit groups. In the coating and developing system 1, four processing unit groups G1, G2, G3 and G4 are disposed, and the first and second processing unit groups G1 and G2 are disposed on a front side of the coating and developing system 1, the third processing unit group G3 is disposed adjacent to the cassette station 2, and the fourth processing unit group G4 is disposed adjacent to the interface section 4. Further, as an option, a fifth processing unit group G5 depicted by a broken line can be additionally arranged on a rear side. The main carrier 13 can carry the wafer W into/from various kinds of the later-described processing units disposed in these processing unit groups G1, G2, G3, G4, and G5. Incidentally, the number and the arrangement of the processing unit groups vary depending on the kind of the processing given to the wafer W and the number of the processing unit groups can be selected freely as long as it is one or more.

In the first processing unit group G1, for example, as shown in FIG. 2, a resist coating unit 17 applying a resist solution onto the wafer W to form a resist film on the wafer W and a developing unit 18 according to this embodiment are two-tiered in this order from the bottom. Similarly, in the second processing unit group G2, a resist coating unit 19 and a developing unit 20 are two-tiered in this order from the bottom.

In the third processing unit group G3, for example, as shown in FIG. 3, a cooling unit 30 for cooling the wafer W, an adhesion unit 31 for increasing fixability between the resist solution and the wafer W, the extension unit 32 for delivering the wafer W thereto and therefrom, pre-baking units 33 and 34 for evaporating a solvent in the resist solution, and a post-baking unit 35 for performing heating processing after the developing treatment are, for example, six-tiered in this order from the bottom.

In the fourth processing unit group G4, for example, a cooling unit 40, an extension and cooling unit 41 for spontaneously cooling the placed wafer W, an extension unit 42, a cooling unit 43, post-exposure baking units 44 and 45 for performing heating processing after exposure processing, and a post-baking unit are, for example, seven-tiered in this order from the bottom.

In a center part of the interface section 4, for example, a wafer carrier 50 is provided as shown in FIG. 1. This wafer carrier 50 is structured to be movable in the X-direction (the vertical direction in FIG. 1) and the Z-direction (the perpendicular direction), and to be rotatable in a θ-direction (a rotational direction about an axis Z), so that it can access the extension and cooling unit 41 and the extension unit 42 which belong to the fourth processing unit group G4, an edge exposure unit 51, and the not-shown aligner to carry the wafer W to each of them.

Figure 4:
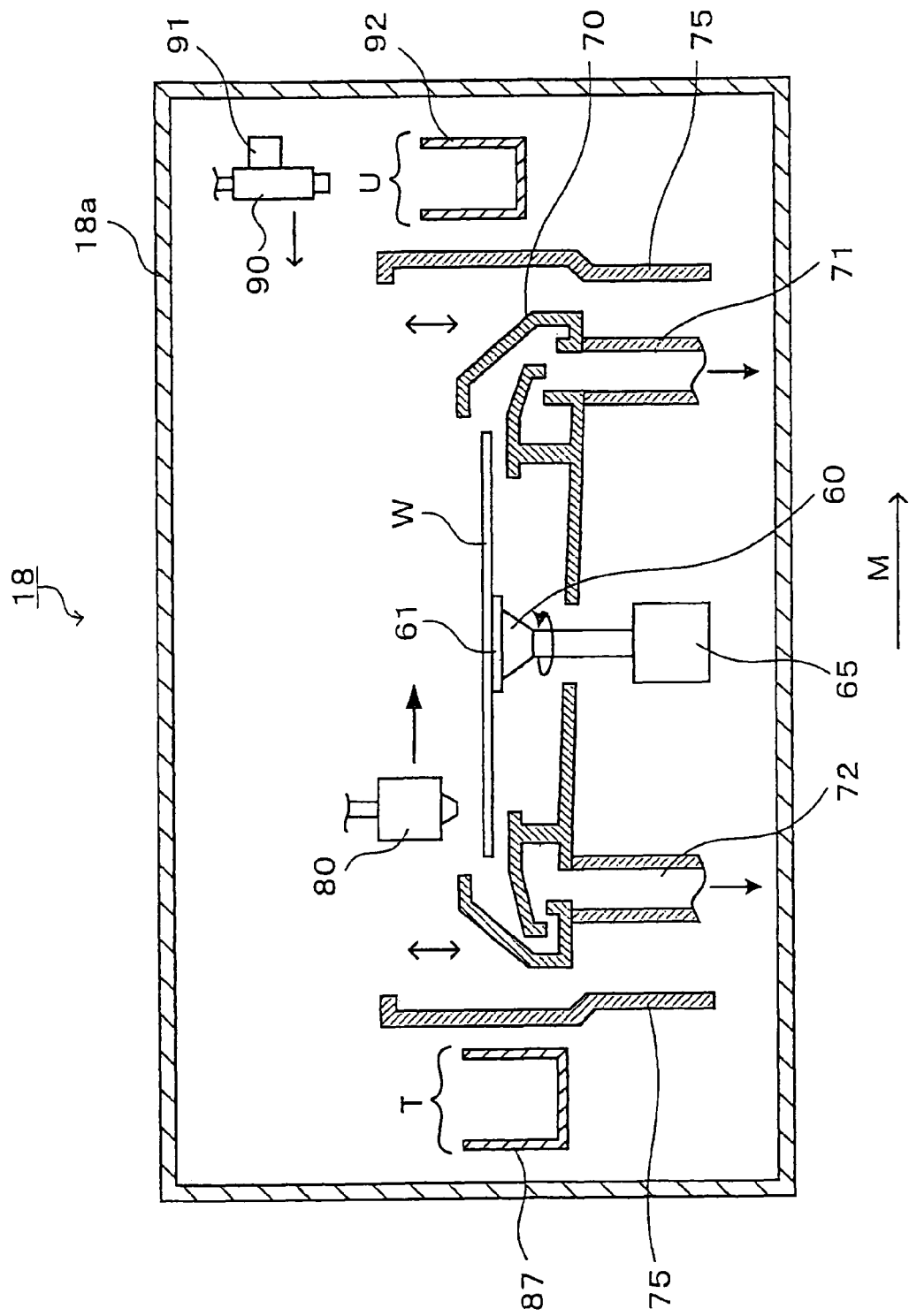
FIG. 4 is an explanatory view of a side section of the developing unit.
Figure 5:
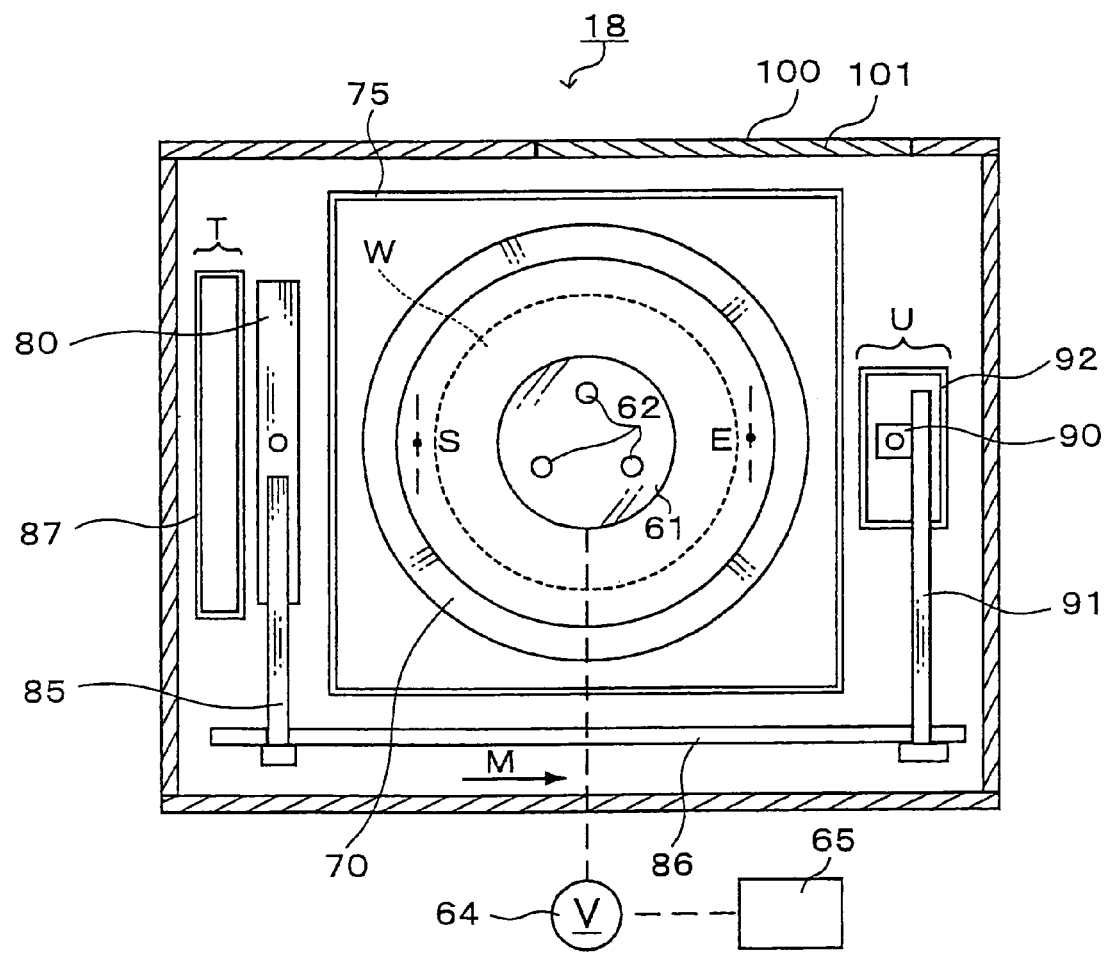
FIG. 5 is an explanatory view of a horizontal section of the developing unit.
Figure 6:
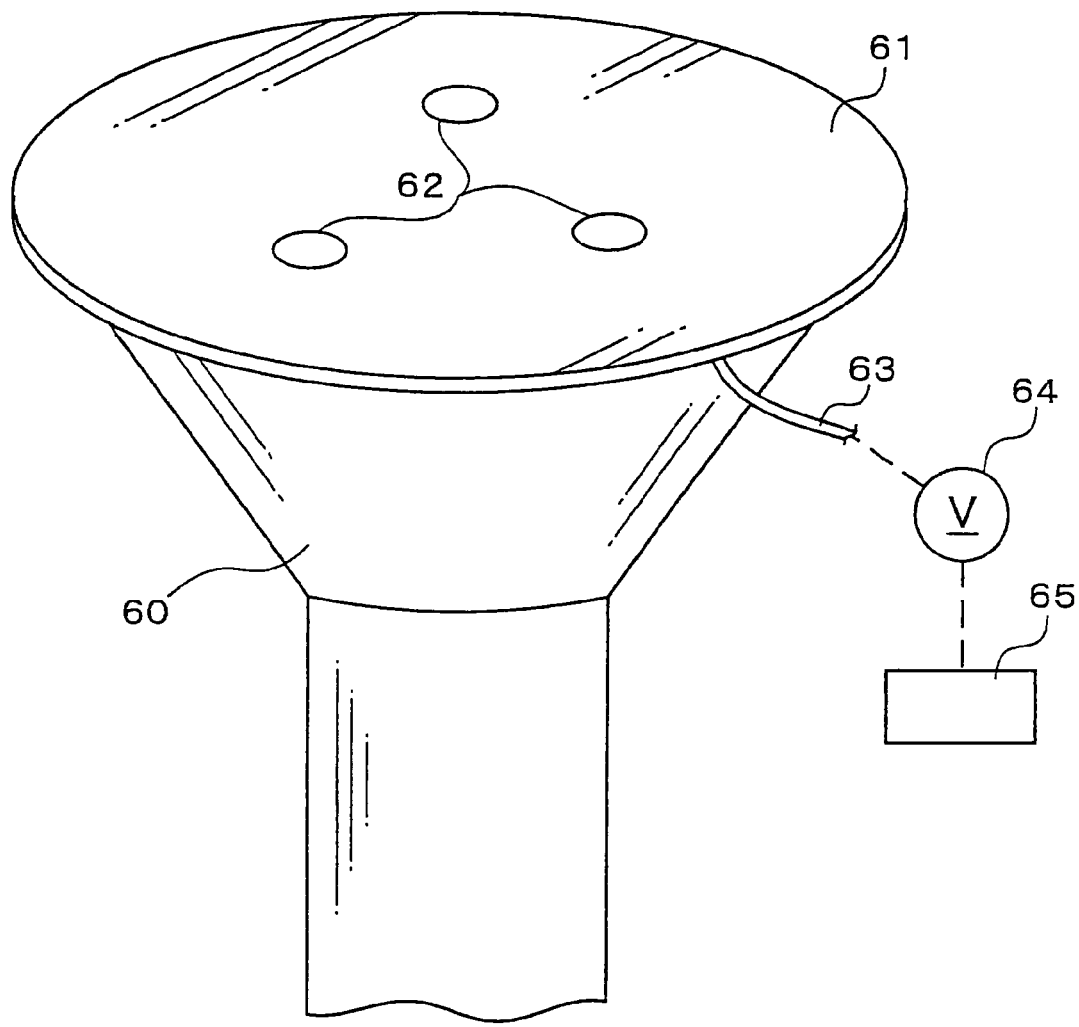
FIG. 6 is a perspective view of a spin chuck of the developing unit.

Next, the structure of the aforementioned developing unit 18 will be explained in detail. As shown in FIG. 4 and FIG. 5, a spin chuck 60 serving as a holding member for holding the wafer W by suction is provided in a casing 18a of the developing unit 18. On an upper surface of the spin chuck 60, a thin disk-shaped electrode plate 61 is attached as shown in FIG. 6. As a material of the electrode plate 61, a conductive material, for example, iron or copper is used. The electrode plate 61 has a horizontal upper surface and a suction port 62 is provided in the electrode plate 61, so that the spin chuck 60 is capable of making the wafer W adhere to the electrode 61 by suction from the suction port 62 to hold the wafer W horizontally.

A conducting wire 63 connected to a direct-current power supply 64 is attached to, for example, a lower surface of the electrode plate 61 so that a voltage can be applied to the electrode plate 61. In other words, the electrode plate 61 can be electrically charged by the application of a direct-current voltage to the electrode plate 61. The voltage of the direct-current power supply 64 and the polarity thereof can be controlled by a control section 65 so that the electrode plate 61 can be electrically charged to a predetermined potential in a predetermined polarity. As a result, it is made possible to induce electrons inside the wafer W held on the electrode plate 61 by suction, thereby controlling a zeta potential of a surface of the wafer W at a predetermined potential in a predetermined polarity. Incidentally, a charging unit in this embodiment is composed of the electrode plate 61, the conducting wire 63, the direct-current power supply 64, and the control section 65. The direct-current power supply 64 and the control section 65 constitute a voltage applying means in this embodiment.

A drive mechanism 65 for driving this spin chuck 60 is disposed, for example, under the spin chuck 60 as shown in FIG. 4. The drive mechanism 65 includes a rotation drive section (not shown), which is provided with a motor or the like, for rotating the spin chuck 60 at a predetermined rotation speed, and a hoisting and lowering drive section (not shown), which is provided with a motor, a cylinder, or the like, for vertically moving the spin chuck 60. A hoisting and lowering mechanism of this spin chuck 60 is intended for carrying the wafer W to/from the main carrier 13.

Outside the spin chuck 60, a ring-shaped cup 70 whose upper surface is open is provided, surrounding the spin chuck 60. This cup 70 receives a developing solution and so on scattering from the wafer W which is held on and rotated by the spin chuck 60, thereby preventing contamination of surrounding equipment. To a bottom surface of the cup 70, a drainpipe 71 for draining out the developing solution and so on scattering from the wafer W and so on and an exhaust duct 72 for exhausting an atmosphere inside the cup 70 are connected.

Outside this cup 70, a square outer cup 75 whose upper surface is open is provided, surrounding the cup 70, to receive the developing solution and so on from the wafer W, which the cup 70 fails to receive, thereby enabling the prevention of the developing solution and so on from scattering. Incidentally, a not-shown drive mechanism allowing the outer cup 75 to move in the vertical direction is provided in the outer cup 75, and for example, it moves up when the wafer W is to be cleaned so that a scattered cleaning liquid and so on can be more surely collected.

As shown in FIG. 5, a stand-by section T is provided outside the outer cup 75, for example, outside on a negative direction side of an M direction (a left side in FIG. 5), and in this stand-by section T, a developing solution supply nozzle 80 for supplying the developing solution to the wafer W can stand by.

Figure 7:
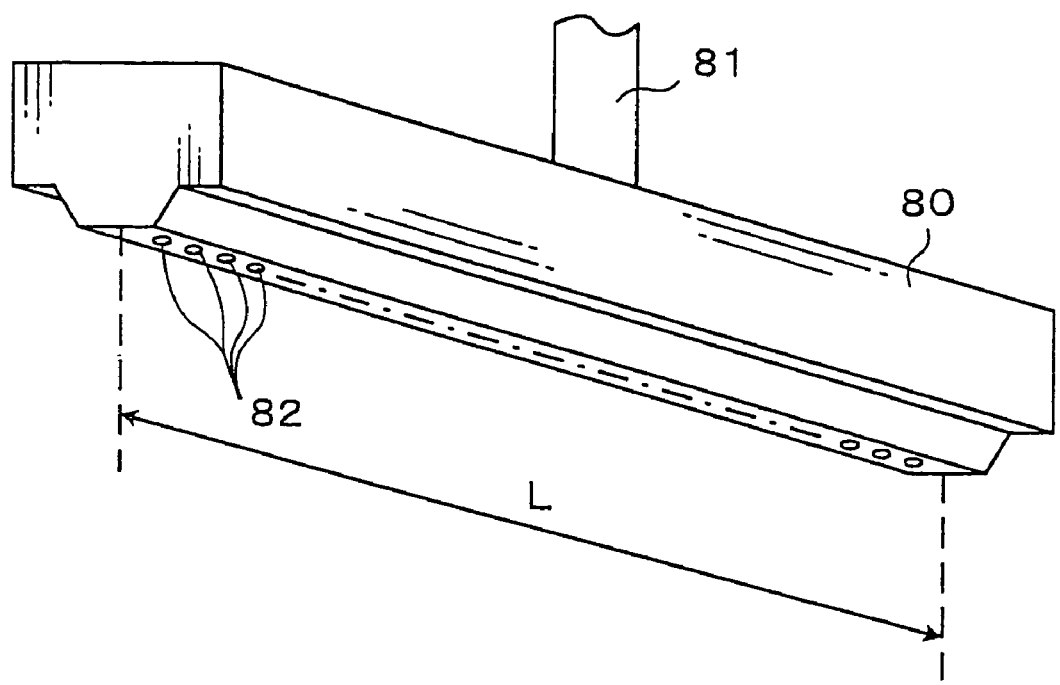
FIG. 7 is a perspective view of a developing solution supply nozzle.
Figure 8:
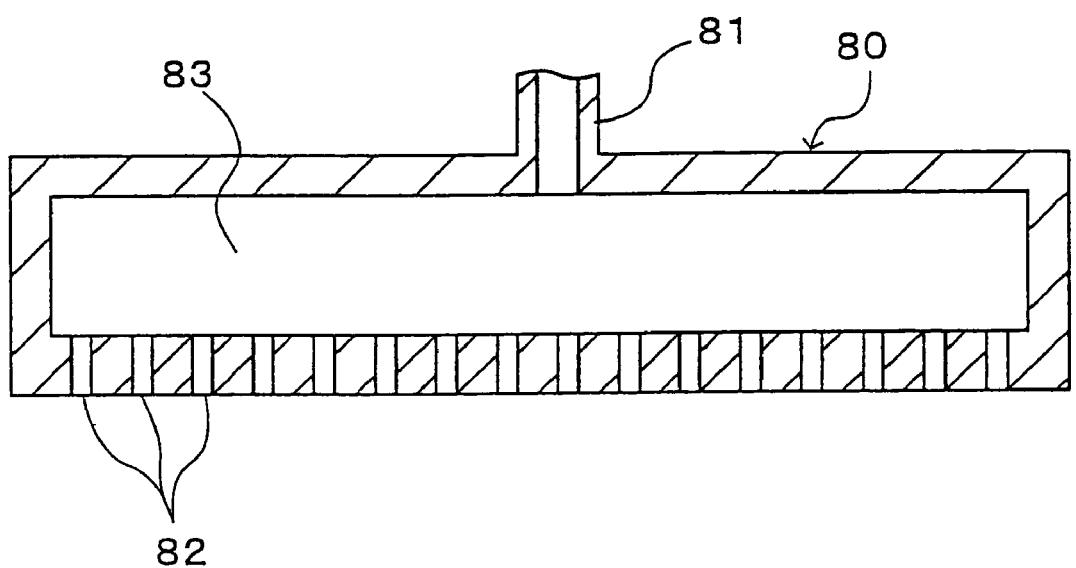
FIG. 8 is a vertical sectional view of a side surface of the developing solution supply nozzle in FIG. 6.

The developing solution supply nozzle 80 has a long and narrow shape as shown in FIG. 7, and a length L thereof is larger at least than the diameter of the wafer W. To an upper part of the developing solution supply nozzle 80, a pipe 81 communicating with a not-shown developing solution supply source is connected. In a lower part of the developing supply nozzle 80, a plurality of developing solution supply ports 82 are disposed in a line in a longitudinal direction. Further, inside the developing solution supply nozzle 80, a solution reservoir section 83 elongated in the longitudinal direction and communicating with each of the developing solution supply ports 82 and the pipe 81 is formed, as shown in FIG. 8 so that the developing solution flowing into the developing solution supply nozzle 80 from the pipe 81 can be temporarily stored therein and the developing solution can be discharged from each of the developing solution supply ports 82 simultaneously at the same flow rate and at the same pressure.

As shown in FIG. 5, the developing solution supply nozzle 80 is supported by an arm 85, and this arm 85 is movable on a rail 86 laid in the M direction (a right and left direction in FIG. 5) by a not-shown moving mechanism. The rail 86 extends from the stand-by section T to the outside of the outer cup 75 on a positive direction side of the M direction so that the developing solution supply nozzle 80 is movable at least from the stand-by section T to the outside of the cup 70 on the positive direction side of the M direction. The developing solution supply nozzle 80 is supported by the arm 85 with the longitudinal direction thereof being perpendicular to the M direction, and when the developing solution supply nozzle 80 moves above the wafer W while discharging the developing solution from each of the developing solution supply ports 82 of the developing solution supply nozzle 80, the developing solution can be supplied to the whole surface of the wafer W.

Incidentally, a not-shown hoisting and lowering mechanism, which is provided in the arm 85, is capable of vertically moving the developing solution supply nozzle 80 when necessary, thereby enabling the transfer of the developing solution supply nozzle 80 into/out of a later-described cleaning bath 87 of the stand-by section T, the adjustment of the distance thereof from the wafer W, and so on.

The stand-by section T has the cleaning bath 87 in which the developing solution supply nozzle 80 is cleaned. This cleaning bath 87 has a concave shaped cross section so as to accommodate the developing solution supply nozzle 80 in the long and narrow shape, and in this cleaning bath 87, a predetermined solvent for washing away the developing solution adhering to the developing solution supply nozzle 80 can be stored.

A stand-by section U for a cleaning liquid supply nozzle 90 for supplying a cleaning liquid to the wafer W is provided outside the outer cup 75 on the positive direction side of the M direction (the right side in FIG. 5). The cleaning liquid supply nozzle 90 is supported by a rinse arm 91, and this rinse arm 91 is movable on the rail 86 on which, for example, the aforesaid arm 85 also moves. The cleaning liquid supply nozzle 90 is supported by the rinse arm 91 so as to be able to supply the cleaning liquid to the center part of the wafer W when it is transferred to a position above the wafer W in the cup 70. In the stand-by section U, provided is a cleaning bath 92, for example, for the cleaning liquid supply nozzle 90, and when the cleaning liquid supply nozzle 90 is immersed in the cleaning bath 92 storing, for example, a solvent, impurities adhering to the cleaning liquid supply nozzle 90 can be removed.

A transfer port 100 through which the wafer W is carried into/out of the developing unit 18 is provided in a side surface of the casing 18a, and this transfer port 100 can be opened and closed freely by a shutter 101.

Next, a developing method carried out in the developing unit 18 as structured above will be explained along with processes of a photolithography step performed in the coating and developing system 1.

First, one unprocessed wafer W is taken out from the cassette C by the wafer carrier 7 and carried to the extension unit 32 belonging to the third processing unit group G3. Next, the main carrier 13 carries the wafer W into the adhesion unit 31 where, for example, HMDS for increasing fixability of the resist solution is applied onto the wafer W.

Next, the wafer W is carried to the cooling unit 30, where it is cooled to a predetermined temperature, and is thereafter carried to the resist coating unit 17. In the resist coating unit 17, for example, a positive resist solution which is a photosensitive resin is supplied to the wafer W so that a resist film is formed on the wafer W. Thereafter, the wafer W is carried by the main carrier 13 to the pre-baking unit 33 and the extension and cooling unit 41 in sequence, and further carried by the wafer carrier 50 to the edge exposure unit 51, thereby undergoing predetermined processing in each of the units. Next, the wafer W is carried to the aligner (not shown), where a predetermined circuit pattern is exposed on the wafer W by, for example ultraviolet irradiation. At this time, exposed portions of the resist film become soluble in an alkaline solution. The wafer W having undergone the exposure processing is carried to the extension unit 42 by the wafer carrier 50, and thereafter, after undergoing predetermined processing in the post-exposure baking unit 44 and the cooling unit 43, the wafer W is carried to the developing unit 18, where it undergoes the developing treatment.

The wafer W having undergone the developing treatment in the developing unit 18 is carried to the post-baking unit 46 and the cooling unit 30 in sequence to undergo predetermined processing in each of the units, and thereafter, is returned to the cassette C via the extension unit 32 so that a series of the photolithography step is finished.

Figure 9:
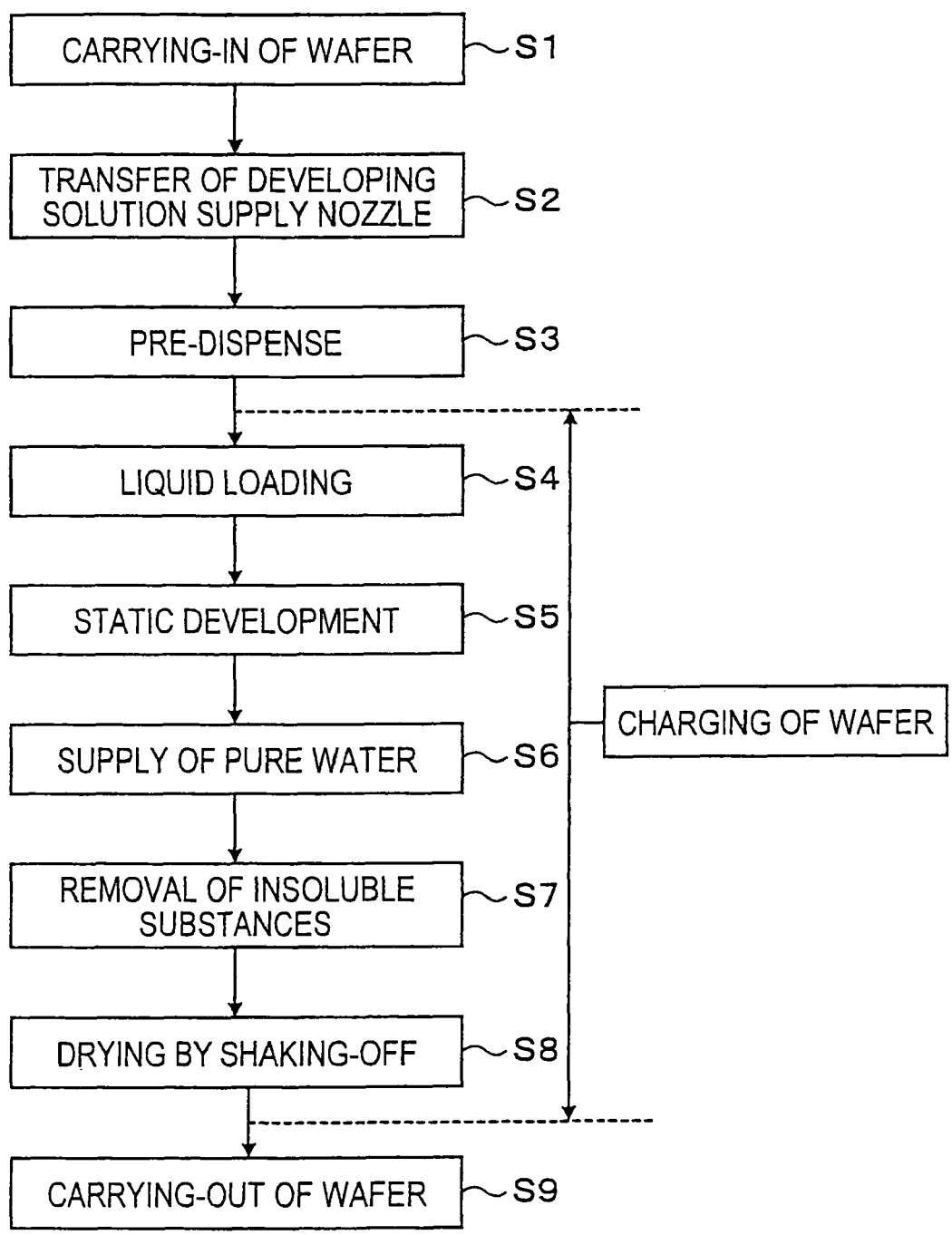
FIG. 9 is a flowchart of developing treatment.

Next, the developing treatment performed in the above-mentioned developing unit 18 will be explained in detail. FIG. 9 shows a flowchart of this developing treatment. In this embodiment, a strong alkaline aqueous solution, for example, TMAH(N(CH$_3$)$_4$OH) or the like of, for example, about pH 13 is used as the developing solution.

First, the wafer W is carried through the transfer port 100 into the casing 18a by the main carrier 13 and held on the spin chuck 60 by suction (Step S1). When the wafer W is held by suction, the developing solution supply nozzle 80 in the stand-by section T moves to a start position S inside the cup 70 near an edge portion of the wafer W on the negative direction side of the M direction (Step S2). Next, while the developing solution supply nozzle 80 is kept unmoved at the start position S, the discharge of the developing solution is started and so-called predispense is performed until the discharge condition of the developing solution from each of the developing solution supply ports 82 is stabilized (Step S3).

Figure 10:
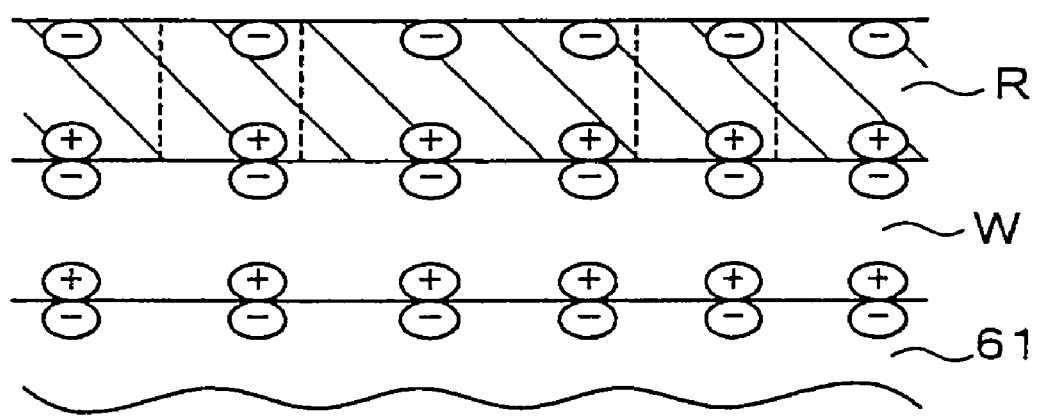
FIG. 10 is an explanatory view of a vertical section of a wafer, showing the state of electrical charges when the wafer is electrically charged.

Then, before proceeding to the subsequent Step S4, a cathodic voltage is applied to the electrode plate 61 on the spin chuck 60 by the direct-current power supply 64, and the electrode plate 61 is negatively charged as shown in FIG. 10.

As a result, a lower surface of the wafer W in contact with the electrode plate 61 is positively charged by electrostatic induction and an upper surface of the wafer W is negatively charge. Accordingly, a zeta potential of the surface of the wafer W becomes negative. Meanwhile, a lower part of a resist film R with the wafer W serving as a base thereof is positively charged and an upper part thereof is negatively charged. The control section 65 adjusts the voltage of the direct-current power supply 64, thereby controlling the zeta potential of the surface of the wafer W to be a predetermined set potential, for example, about −70 mV.

Incidentally, the polarity of the voltage applied to the electrode 61 is determined so as to be the same polarity as that of a zeta potential of later-described insoluble substances Y of the resist film R in the developing solution. The polarity of the zeta potential of the insoluble substances is obtained in advance, for example, by an experiment or the like, and the zeta potential of the insoluble substances in this embodiment is −20 mV in the developing solution of, for example, pH 13. As the set voltage of the surface of the wafer W, an optimum voltage at which the insoluble substances stop adhering to the surface of the wafer W is obtained in advance, for example, by an experiment or the like for each kind of the resist film and each kind of the developing solution and this obtained voltage is stored, for example, in the control section 65. Incidentally, it is also suitable that an adhesion amount or the like of the insoluble substances to the surface of the wafer W is measured after the developing treatment and the set potential is changed based on this measurement value.

After the discharge condition from the developing solution supply nozzle 80 is stabilized and the wafer W is electrically charged, the developing solution supply nozzle 80 moves to the positive direction side of the M direction while discharging the developing solution, passes above the wafer W, and moves up to an end position E near an edge portion of the wafer W on the positive direction side of the M direction. Through this operation, a predetermined amount of loading of the developing solution is formed on the wafer W (Step S4), and the wafer W is subsequently subjected to static development for a predetermined period of time (Step S5).

Figure 11:
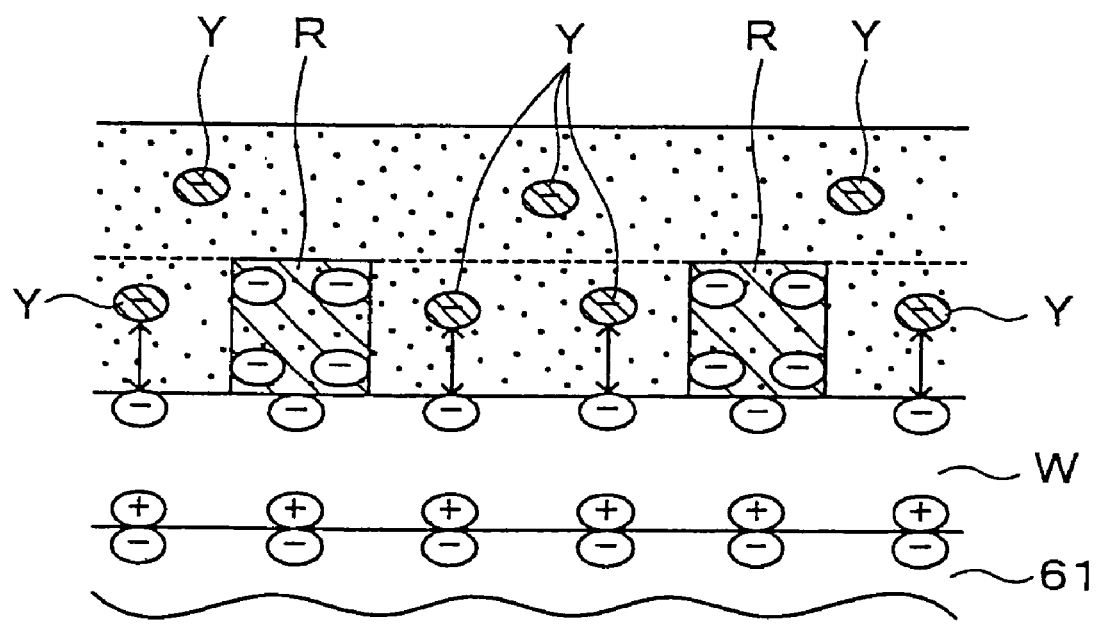
FIG. 11 is an explanatory view of a vertical section of the wafer, showing the state of insoluble substances in a developing solution.

As shown in FIG. 11, this supply of the developing solution causes most of the resist film R at the exposed portions to dissolve in the developing solution and other portions are partly precipitated and float in the developing solution as the insoluble substances Y. The insoluble substances Y have a negative zeta potential as described above to cause a repulsive force against the surface of the wafer W similarly negatively charged and the insoluble resist film R. As a result, the insoluble substances Y do not adhere to the surface of the wafer W and the insoluble portions of the resist film R. Incidentally, the developing solution supply nozzle 80 which stops moving in the end position E stops discharging the developing solution and is returned to the stand-by section T. Note that a first step and a second step correspond to Step S4 and Step S5 respectively in this embodiment.

Subsequently, when the static development for the predetermined period of time is finished, the cleaning liquid supply nozzle 90 moves to a position above the center part of the wafer W and discharges the cleaning liquid, for example, a pure water onto the wafer W (Step S6). The wafer W is rotated concurrently with the supply of, for example, this pure water and the developing solution on the wafer W is replaced with the pure water. At this time, pH of the developing solution on the wafer W drastically lowers to become close to pH 7, that is, neutrality. At this time, the zeta potential, which is −20 mV, of the insoluble substances lowers to, for example −60 mV to increase an absolute value of the zeta potential so that the tendency that the insoluble substances Y adhere to the surface of the wafer W is weakened compared with that at the time of the static development. Note that a third step corresponds to Step S6 in this embodiment.

The wafer W is kept rotated even after the developing solution is replaced with the pure water so that the insoluble substances Y on the wafer W are thoroughly removed (Step S7). Thereafter, the discharge of the pure water is stopped and the wafer W is rotated at a high speed so that the wafer W is dried by liquid shaking-off (Step S8). For example, when this drying processing of the wafer W is finished, the application of the voltage to the electrode plate 61 is finished and the electric charge electrically charging, for example, the wafer W is grounded. Then, the wafer W is delivered to the main carrier 13 from the spin chuck 60 to be carried out of the developing unit 18 (Step S9) so that a series of the developing treatment is finished.

According to the above-described embodiment, the electrode plate 61 is provided on the spin chuck 60 holding the wafer W thereon, and the zeta potential of the surface of the wafer W is made to have a negative polarity which is the same as that of the insoluble substances Y in the developing solution so that the repulsive force constantly acts between the insoluble substances Y and the surface of the wafer W. Further, since the absolute value of the zeta potential of the surface of the wafer W is set to a sufficiently large value, a strong repulsive force is maintained between the insoluble substances Y and the surface of the wafer W even when the zeta potential of the insoluble substances Y fluctuates. This can prevent or inhibit the adhesion of the insoluble substances Y to the surface of the wafer W.

Moreover, since the zeta potential of the surface of the wafer W is controlled over the period before Step S4 where the insoluble substances Y occur in the developing solution to Step S where the insoluble substances Y on the wafer W are removed, the adhesion of the insoluble substances Y can be completely prevented.

In the developing method described in the above embodiment, the surface of the wafer W serving as the base of the resist film R is electrically charged to a predetermined polarity, but the developing solution supplied onto the wafer W may be brought into contact with a charged member electrically charged to a predetermined polarity.

Figure 12:
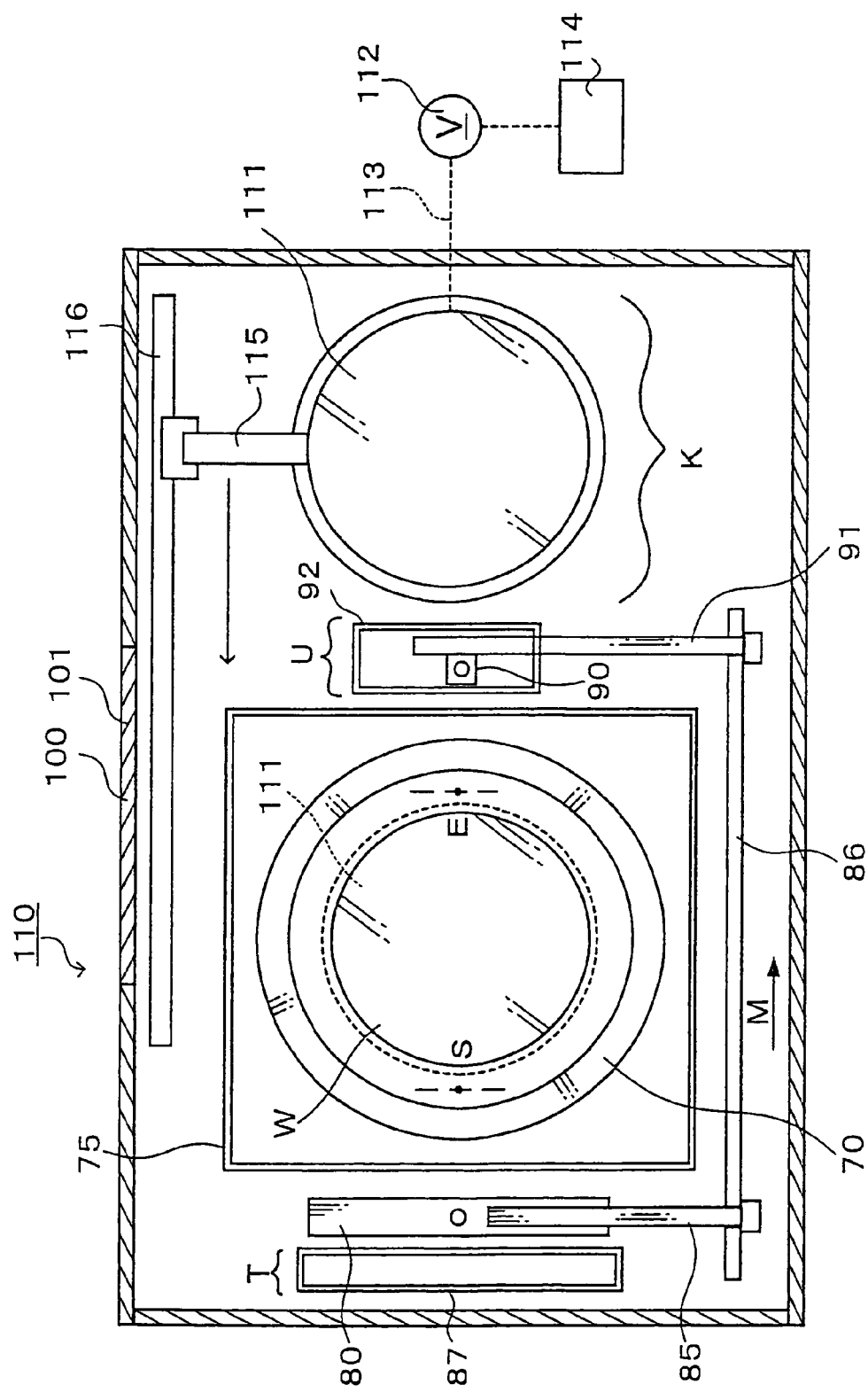
FIG. 12 is an explanatory view of a horizontal section of a developing unit having a charged member.

FIG. 12 shows an example of a developing unit 110 realizing such a developing method, in which a charged member 111 is on stand-by in a stand-by section K, for example, on a positive direction side of an M direction of an outer cup 75. The charged member 111 is formed, for example, in a disk shape similarly to the wafer W, and as a material thereof, for example, metal such as iron and copper excellent in conductivity is used. A conducting wire 113 connected to, for example, a direct-current power supply 112 is attached to an upper surface of the charged member 111, so that the polarity and amount of electric charge to be applied to the charged member 111 by a control section 114 of the direct-current power supply 112 can be adjusted.

Figure 13:
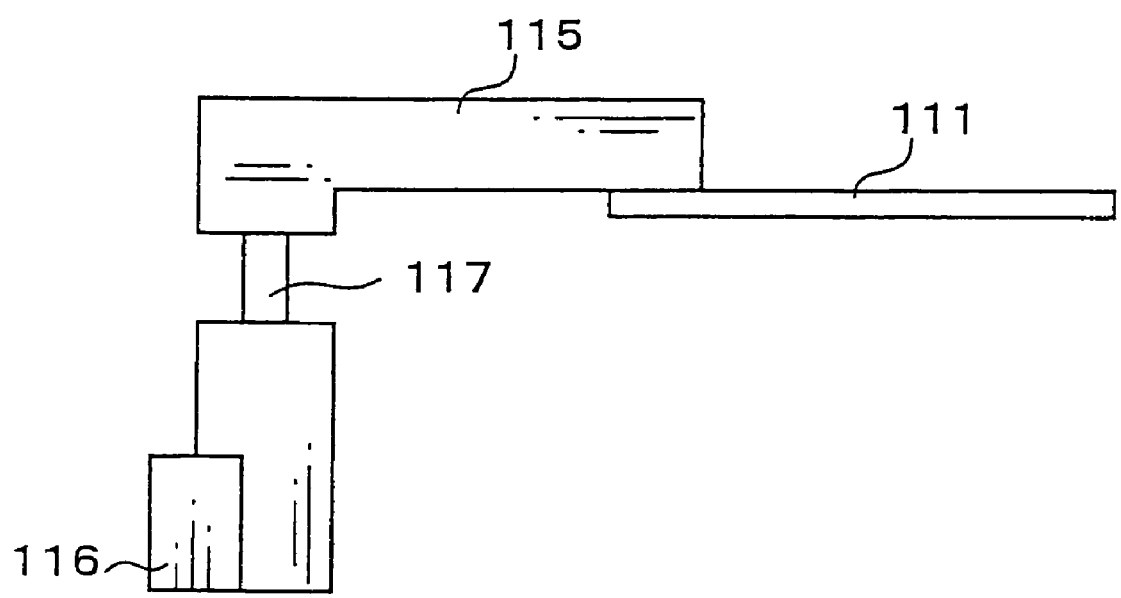
FIG. 13 is an explanatory view showing the structure of a supporting arm.

The charged member 111 is supported by a supporting arm 115 serving as a charged member carrying means. The supporting arm 115 is movable in the M direction on a rail 116 laid from the stand-by section K to the vicinity of a cup 70, thereby enabling the charged member 111 to move to a position above the wafer W in the cup 70. Further, as shown in FIG. 13, the supporting arm 115 has a cylinder 117 serving as a hoisting and lowering mechanism, which enables the vertical movement thereof. Therefore, the charged member 111 is capable of descending after moving to the position above the wafer W from the stand-by section K, and approaching the wafer W so as to coincide in position with the surface of the wafer W. A cleaning bath 118 in which the charged member 111 is immersed, for example, in a predetermined solution for cleaning is provided in the stand-by section K. The cleaning bath 118 has, for example, the same shape as that of the charged member 111, that is, for example, a circular shape in its plan view. Incidentally, other members of the developing unit 110 are the same as those of the developing unit 18, and therefore, the explanation thereof will be omitted.

Figure 14:
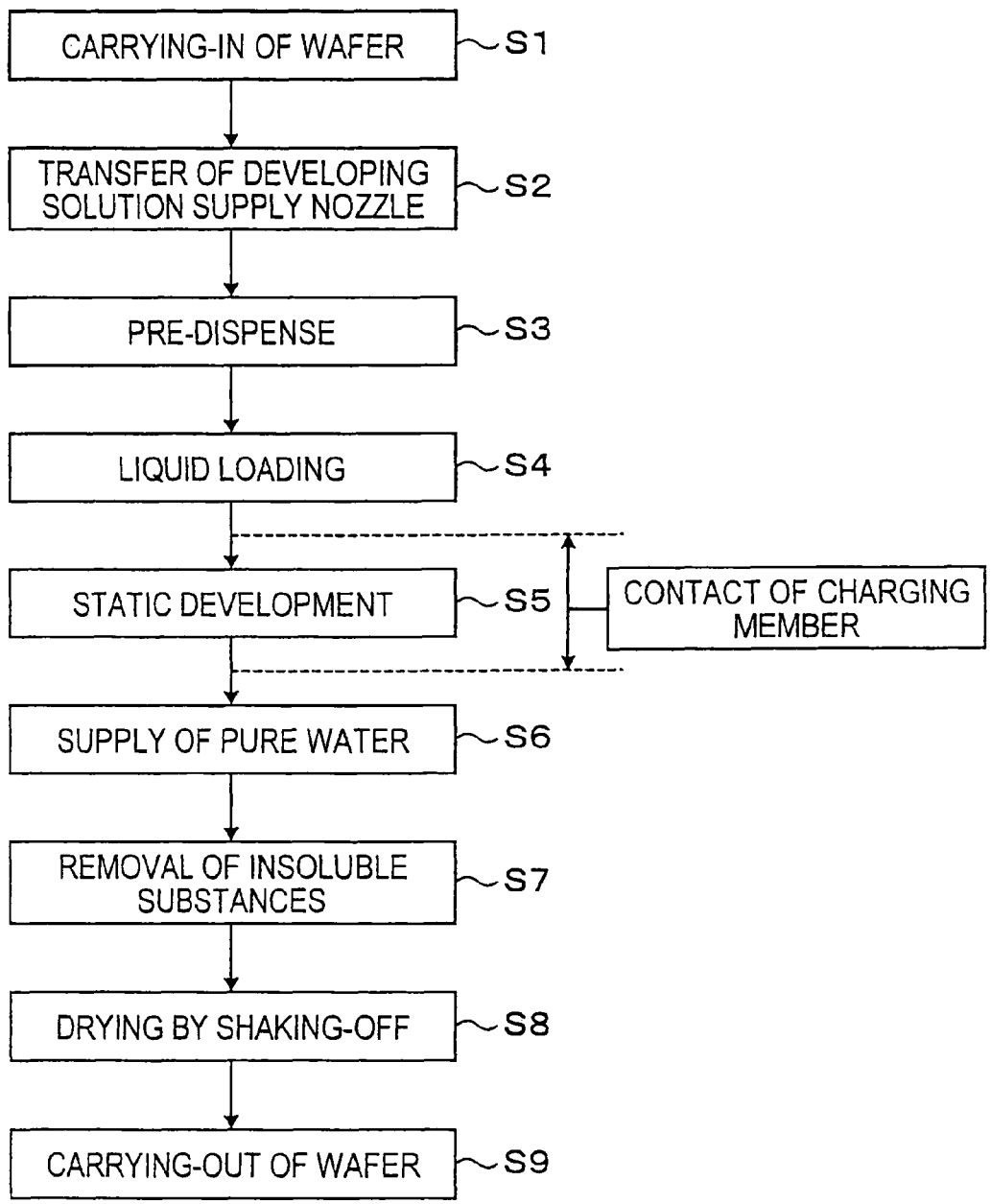
FIG. 14 is a flowchart of developing treatment using the charged member.
Figure 15:
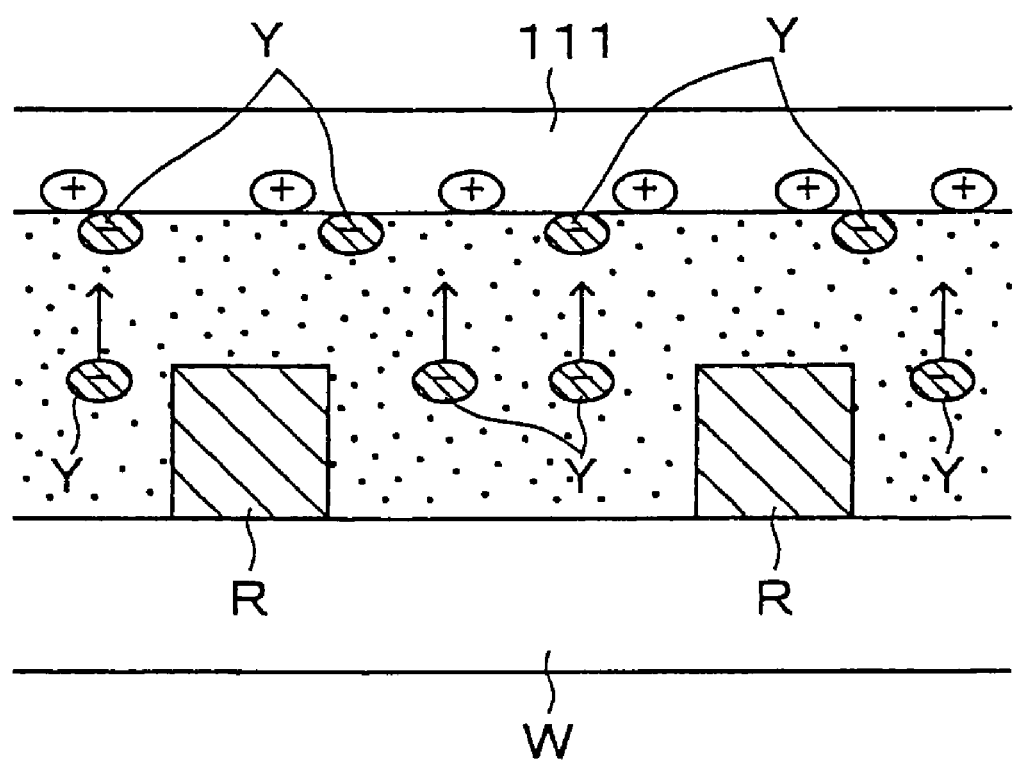
FIG. 15 is an explanatory view of a vertical section of the wafer, showing the state of insoluble substances when the charged member is brought into contact with the developing solution.

In developing treatment in this developing unit 110, for example, as shown in FIG. 14, the charged member 111, for example, positively charged is carried from the stand-by section K to a position facing the wafer W after Step S4 of loading the developing solution is finished, so that the charged member 111 is brought into contact with the developing solution on the wafer W. When static development for a predetermined period of time in Step S5 is performed in this state, the insoluble substances Y having a negative zeta potential, which are precipitated from the resist film R, are attracted to the charged member 111 to adhere to the charged member 111, as shown in FIG. 15. When the static development is finished, the charged member 111 which has collected a large amount of the insoluble substances Y retreats from the wafer W to be returned to the stand-by section K. The charged member 111 returned to the stand-by section K is immersed in the cleaning bath 118 and the insoluble substances Y are washed away.

According to this embodiment, the charged member 111 electrically charged to an opposite polarity to that of the insoluble substances Y is brought into contact with the developing solution on the wafer W so that the insoluble substances Y in the developing solution adhere to the charged member 111, thereby enabling the charged member 111 to collect the insoluble substances Y Consequently, the adhesion of the insoluble substances Y to the surface of the wafer W can be prevented.

Further, the supporting arm 115 may be moved to actively move the charged member 111, thereby promoting the adhesion of the insoluble substances Y in the developing solution to the charged member 111.

The charged member 111 may have a shape other than a circular shape, for example, a square shape or the like. Further, the adhesion of the insoluble substances Y to the wafer W may be prevented by, instead of the use of the charged member 111, supplying the periphery of the surface of the wafer W with an ion atmosphere having the same polarity as that of the insoluble substances Y and electrically charging the surface of the wafer W to a predetermined polarity.

Figure 16:
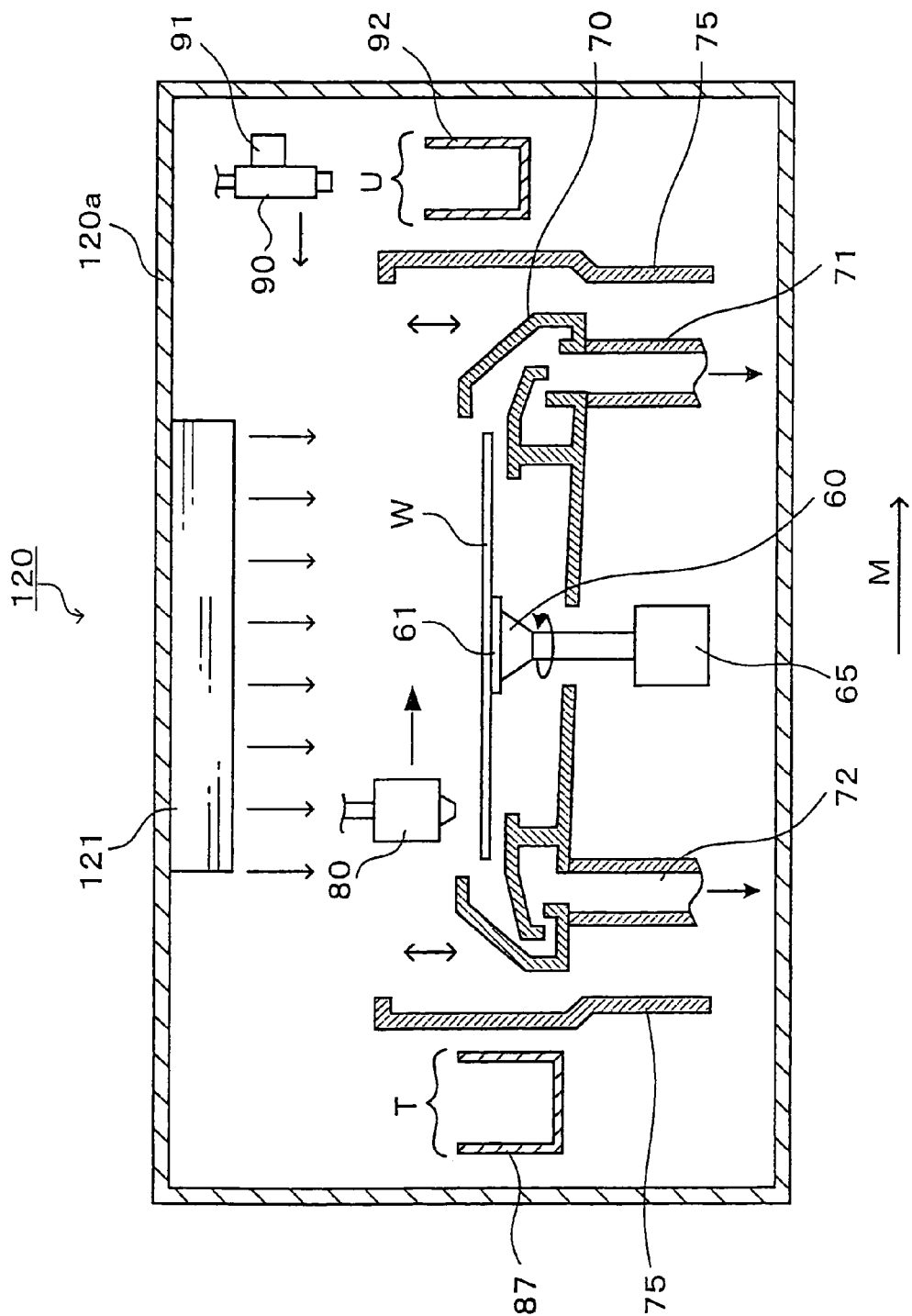
FIG. 16 is an explanatory view of a vertical section, showing the structure of a developing unit having an ionizer.

In such a case, an ionizer 121 serving as an ion atmosphere supply section which supplies the ion atmosphere including ions in a predetermined polarity is provided in a casing 120a in a developing unit 120, for example, as shown in FIG. 16. The inside of the casing 120a is kept under a negative ion atmosphere at least during the period from the occurrence of the insoluble substances Y to the removal of the insoluble substances Y. This ion atmosphere causes the surface of the wafer W to be negatively charged, thereby enabling the prevention of the adhesion of the insoluble substances Y, which is negatively charged, to the surface of the wafer W. Incidentally, the ionizer 121 may be disposed on an upstream side of an air current inside the developing unit 120 to supply the negative ion atmosphere more efficiently to the wafer W. Further, an ionizer utilizing corona discharge or soft X-rays may be used as the ionizer 121. Moreover, though such an ionizer is a means mainly for electrically charging a gas, a means for electrically charging vapor, mist, and the like may be used.

Instead of bringing the charged member 111 into contact with the developing solution, an ionic surfactant in a predetermined polarity may be added into the developing solution to prevent the adhesion of the insoluble substances Y to the surface of the wafer W.

Figure 17:
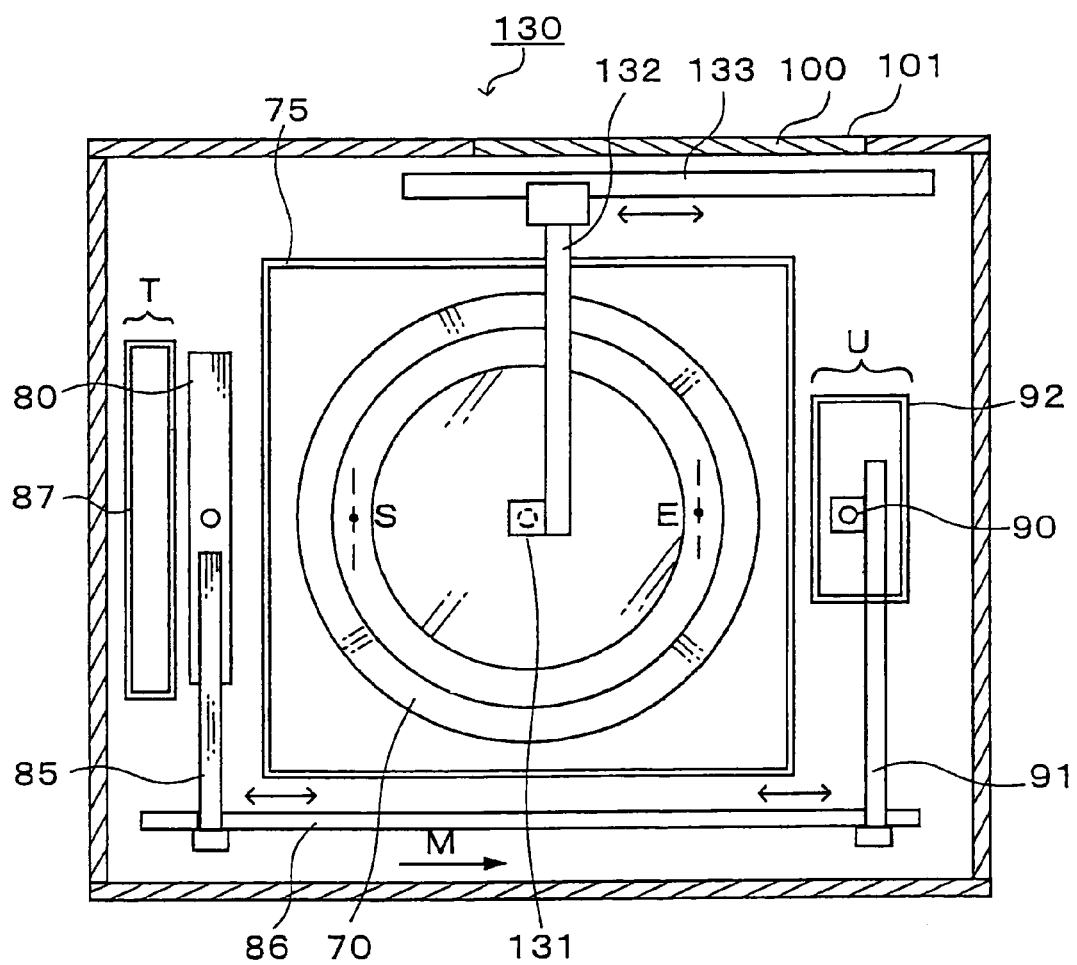
FIG. 17 is an explanatory view of a horizontal section, showing the structure of a developing unit having a surfactant supply nozzle.

FIG. 17 shows an example of a developing unit 130 realizing developing treatment in such a case, and, for example, a surfactant supply nozzle 131 serving as a surfactant supply section which supplies the ionic surfactant is provided in the developing unit 130 . . . . This surfactant supply nozzle 131 is supported by, for example, a nozzle arm 132, and this nozzle arm 132 is provided to be movable on a rail 133 extending in an M direction. The rail 133, which is laid on an opposite side of a rail 86, for example, for the developing solution supply nozzle 80 across a cup 70, enables the surfactant supply nozzle 131 to move to a position above the center of the wafer W on a spin chuck 60.

Figure 18:
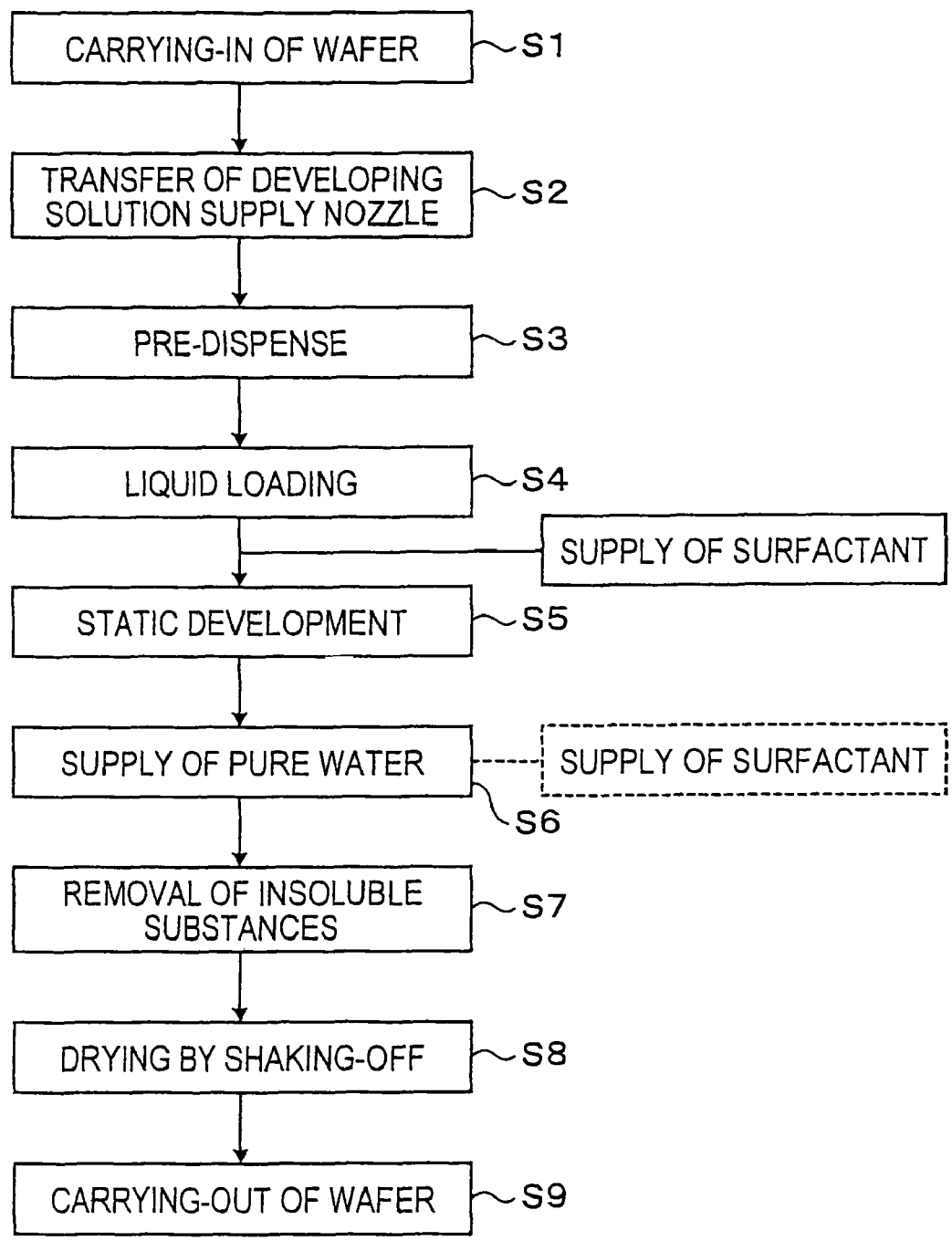
FIG. 18 is a flowchart of developing treatment in which a surfactant is supplied.
Figure 19:
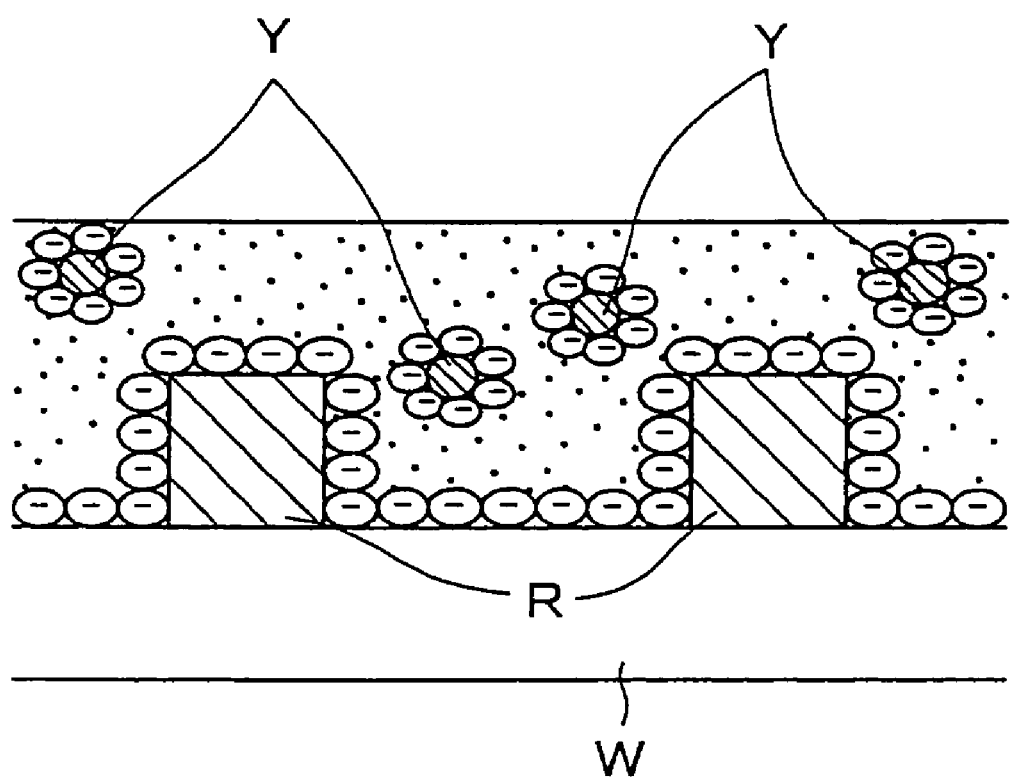
FIG. 19 is an explanatory view of a vertical section of the wafer, showing the state of the wafer when an ionic surfactant is added thereto.

In the developing treatment in this developing unit 130, the ionic surfactant is supplied to the wafer W immediately after the developing solution is loaded on the wafer W in Step S4, for example, as shown in FIG. 18. The surfactant supplied onto the wafer W adheres to the surfaces of the wafer W, the resist film R, and the insoluble substances Y, as shown in FIG. 19. As a result, the surface of the wafer W, the insoluble substances Y, and so on which are covered with ions in the same polarity, for example, negative ions repel one another to prevent the adhesion of the insoluble substances Y to the surface of the wafer W and so on. Further, in this case, the surfactant is supplied when the insoluble substances Y begin to occur, thereby enabling the surer prevention of the adhesion of the insoluble substances Y to the surface of the wafer and so on. Incidentally, the surfactant may be supplied either immediately before Step S4 or in Step S4.

The ionic surfactant may be supplied onto the wafer W also when a pure water is supplied in Step S6. The supply of the pure water compensates for the decreasing negative ions on the surface of the wafer W so that it is made possible to prevent the insoluble substances Y from adhering to the surface of the wafer W and so on at the time of cleaning. Incidentally, the ionic surfactant may be supplied only when the pure water is supplied in Step S6. This is superior in that the property of the developing solution is not at all influenced by the surfactant at the time of the static development in Step S5.

Further, the surfactant supply nozzle 131 may have the same structure as that of the aforementioned developing solution supply nozzle 80 to supply the surfactant to the entire surface of the wafer W by scan-moving.

Figure 20:
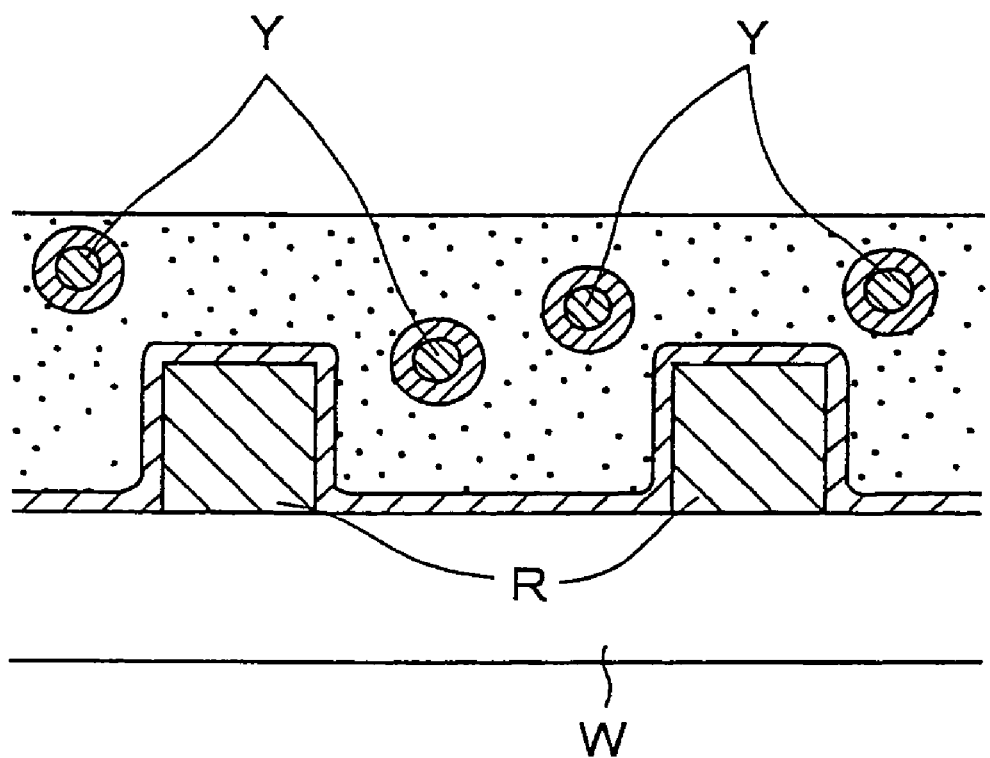
FIG. 20 is an explanatory view of the vertical section of the wafer, showing the state of the wafer when a nonionic surfactant is added thereto.

A polymer nonionic surfactant may be supplied onto the wafer W instead of the ionic surfactant. The polymer nonionic surfactant is, in its nature, absorbed to particles in a liquid, and a repulsive force is generated in tiered polymer layers resulting from this absorption, and as a result, the polymer nonionic surfactant has a function of improving dispersion stability of the particles. It is reasoned that this function is caused by an osmotic pressure effect or a capacity control effect of the polymer nonionic surfactant. Therefore, when the nonionic surfactant is supplied into the developing solution on the wafer W, the nonionic surfactant is absorbed to the insoluble substances Y, the surface of the wafer W, and the surface of the resist film R, as shown in FIG. 20, thereby enabling the prevention of the insoluble substances Y to the surface of the wafer W and so on owing to the dispersion stabilizing effect. Incidentally, as the nonionic surfactant, for example, polyoxyethylene alkylether, polyoxyalkylene alkylether, or the like is used.

Figure 21:
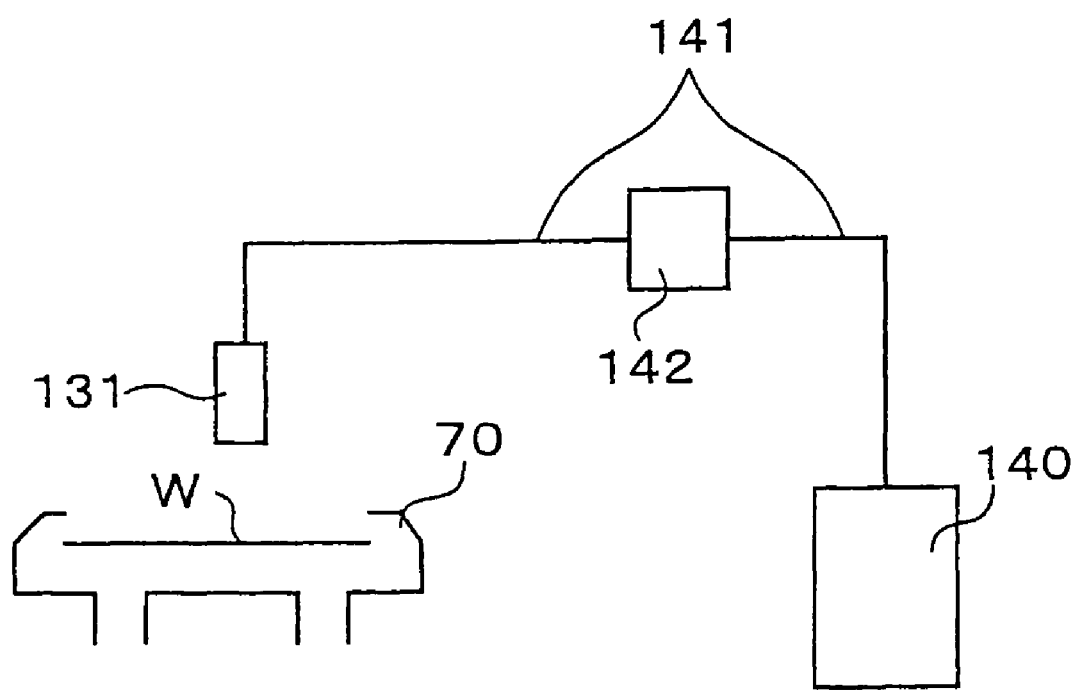
FIG. 21 is an explanatory view showing the structure of a supply system of the surfactant supply nozzle.

As shown in FIG. 21, a concentration adjusting unit 142 capable of adjusting the concentration of the surfactant may be provided in a supply pipe 141 connecting the surfactant supply nozzle 131 and a buffer tank 140 for the surfactant. The concentration of the surfactant supplied onto the wafer W is varied depending on the kind of the resist film, the kind of the developing solution, and so on. For example, when the insoluble substances Y have a relatively small absolute value in its zeta potential and thus easily cohere together, the concentration of the surfactant is set to a value in a higher range. This setting causes more of the surfactant to be absorbed to the insoluble substances Y and the surface of the wafer W, resulting in the increase in the repulsive force between, for example, the insoluble substances Y and the surface of the wafer W so that the adhesion of the insoluble substances Y can be appropriately prevented.

Incidentally, such a method is also adoptable that an optimum concentration of the surfactant causing the decrease in the adhesion amount of the insoluble substances Y is obtained for each kind of the resist film and the developing solution in advance by an experiment or the like, this optimum concentration is stored in the concentration adjusting unit 142 or the like, and the concentration of the surfactant is adjusted to this optimum concentration. Further, the concentration adjusting unit 142 may be a unit performing concentration adjustment by mixing a solvent, an amount of which is predetermined according to the set concentration, into the surfactant passing through, for example, the supply pipe 141.

Figure 22:
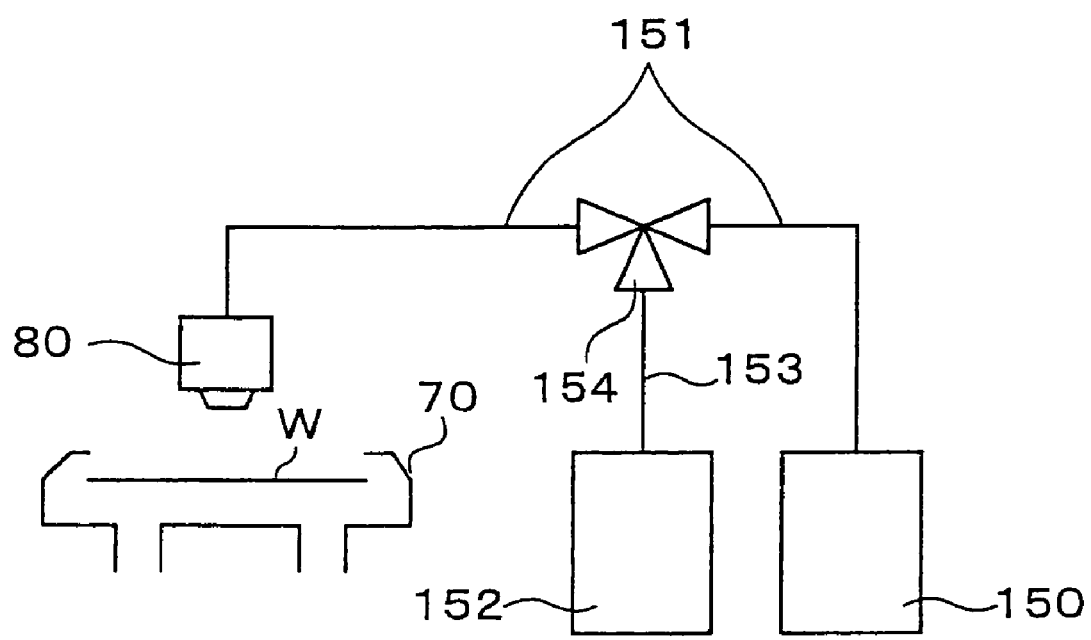
FIG. 22 is an explanatory view showing the structure of a supply system of another surfactant supply nozzle.

The surfactant may be supplied onto the wafer W from the aforesaid developing solution supply nozzle 80. In this case, such a structure may also be adopted, for example, as shown in FIG. 22 that a branch pipe 153 communicating with a buffer tank 152 for the surfactant is attached to a supply pipe 151 communicatingly connecting the developing solution supply nozzle 80 and a developing solution storage tank 150, and a three-way valve 154 is provided at a connection part between the branch pipe 153 and the supply pipe 151. This three-way valve 154 allows selective supply of the developing solution and the surfactant to the developing solution supply nozzle 80, and allows the discharge of the surfactant onto the wafer W at a predetermined timing as described above. Further, the surfactant may be added into the developing solution, and in this case, a predetermined amount of the surfactant may be added to the developing solution in advance or the surfactant may be added to the developing solution in the supply pipe 151 where the developing solution is on its way to be sent to the developing solution supply nozzle 80.

In the above-described embodiment, the surfactant is mixed in the developing solution or the surfactant is added thereto when the developing solution is loaded on the wafer W, but alternatively, the surfactant or vapor or mist of the surfactant may be supplied onto the wafer W before the developing solution is supplied onto the wafer W. This method can also inhibit the adhesion of the insoluble substances to a substrate.

The aforesaid surfactant may be mixed in the resist solution in advance, and the resist solution with the surfactant being thus mixed therein may be applied when the resist solution is applied to the wafer W in the resist coating units 17 and 19. This method can also inhibit the adhesion of the insoluble substances to the substrate.

Conventionally, the developing treatment is performed while the temperature of the wafer W and the temperature of the developing solution supplied to the wafer W are maintained at a room temperature, for example, around 23° C., but when, in the developing treatment, the temperature of the wafer W or the temperature of the developing solution is set to a room temperature or higher, for example, 25° C. to 80° C., more preferably 40° C. to 60° C. for the developing solution, and 40° C. to 200° C., more preferably 40° C. to 160° C. for the wafer W, the adhesion of the insoluble substances floating in the developing solution to the resist film can be inhibited. This is because, in the case when the repulsive force between the zeta potential of the insoluble substances and the potential of the resist film is weak, this repulsive force can be increased by increasing the temperature of the substrate or the developing solution.

As described above, since the conventional developing unit performs the substrate treatment at a room temperature, a unit for increasing the temperature of the substrate is not provided in the unit. Here, a unit shown in, for example, FIG. 23 can be proposed in order to perform the developing treatment by increasing the temperature of the substrate as proposed in the present invention.

Figure 23:
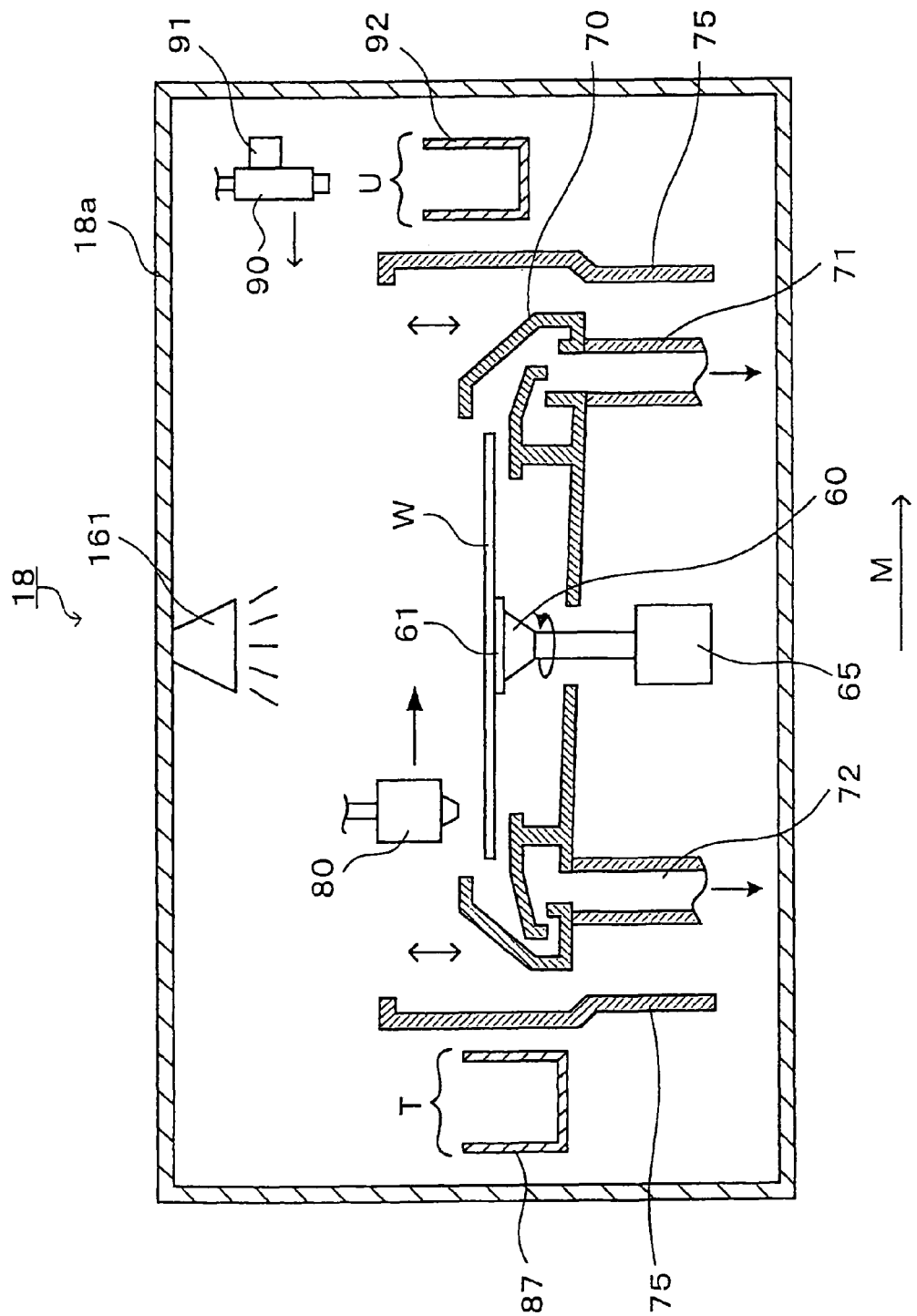
FIG. 23 is a side sectional view of a developing unit having a unit heating a substrate.

In this unit shown in FIG. 23, a lamp heating unit 161 is provided on a ceiling section inside the casing 18a. This makes it possible to heat, for example, the wafer W up to the room temperature or higher, for example, 40° C. to 200° C., more preferably 40° C. to 160° C. when the developing treatment of the wafer W is performed.

Incidentally, the temperature of the developing solution supplied to the wafer W can be raised by raising the temperature of a temperature adjusting fluid in a: temperature adjusting mechanism conventionally used for the developing solution supply nozzle 80, for example, a mechanism which supplies the temperature adjusting fluid to the nozzle to adjust the temperature of the developing solution.

Next, explanation will be given on an example of using a charged member in the same polarity as that of the zeta potential of the insoluble substances in the developing solution.

Figure 24:
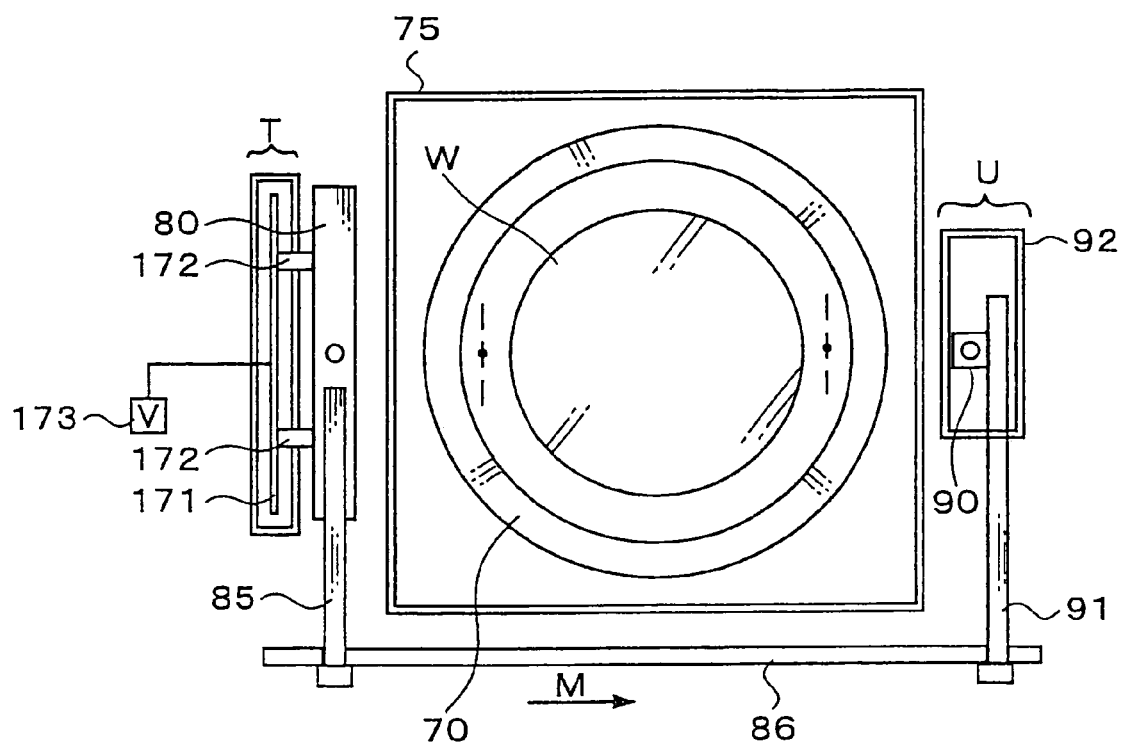
FIG. 24 is a plan view of a unit in which a charged member is attached to the developing solution supply nozzle.

FIG. 24 shows a plan view of an example of such a unit, in which a charged member 171 is attached to the developing solution supply nozzle 80 via a bracket 172 to be in parallel to this developing solution supply nozzle 80, with a certain distance being kept therefrom. The charged member 171 is set to the same length as that of the developing solution supply nozzle 80, and a lower surface thereof is also set to the same height position as that of the developing solution supply nozzle 80. A voltage from a power supply 173 is applied to the charged member 171. This enables the charged member 171 to be electrically charged to the same polarity as that of the zeta potential of the insoluble substances in the developing solution.

Figure 25:
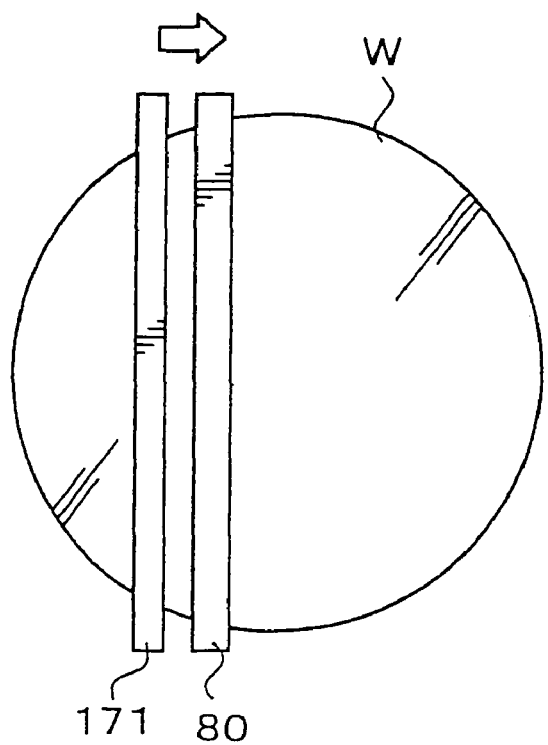
FIG. 25 is a plan view showing the state in which the charged member in FIG. 24 is scan-moved together with the developing solution supply nozzle above the wafer.
Figure 26:
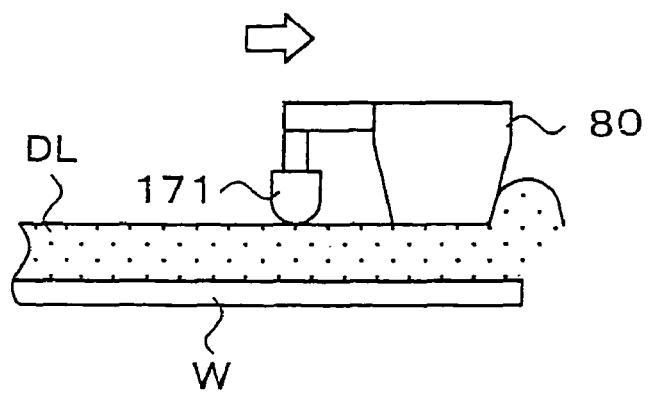
FIG. 26 is a side view showing the state in which the charged member in FIG. 24 is scan-moved together with the developing solution supply nozzle above the wafer.

The charged member 171 thus electrically charged to the same polarity as that of the zeta potential of the insoluble substances is used in the following manner. Specifically, after the developing solution is loaded on the wafer W by the developing solution supply nozzle 80, the arm 85 is moved so that the charged member 171 is scan-moved together with the developing solution supply nozzle 80 above the wafer W as shown in FIG. 25 and FIG. 26. At this time, the charged member 171 is brought into contact with a developing solution DL on the wafer W as shown in FIG. 26.

This causes the insoluble substances floating in the developing solution DL to move since they repel the charged member 171. The scan-move of this charged member 171 causes the insoluble substances to move in the developing solution DL and to be forced out from the edge portion of the wafer W together with the developing solution DL. Therefore, in this example, a considerable number of the insoluble substances are forced out of the wafer W together with the developing solution DL, through the use of the repellency between the charged member 171 and the insoluble substances. As a result, the adhesion of the insoluble substances to the resist film and the wafer W is inhibited.

Incidentally, in the case when the charged member 171, which is charged to the same polarity as that of the zeta potential of the insoluble substances in the developing solution, is moved as described above, the wafer W is preferably charged to the same polarity as that of the zeta potential of the insoluble substances as well. This is because, in this manner, the insoluble substances and the wafer W also repel each other so that the insoluble substances can be prevented from coming closer to the wafer W side. Consequently, the adhesion of the insoluble substances to the resist film and the wafer W can be more effectively prevented. Incidentally, the wafer W can be electrically charged to the same polarity as that of the zeta potential of the insoluble substances by using, for example, the direct-current power supply 64.

Moreover, in the case when the charged member 171 and the wafer W are electrically charged to the same polarity, the wafer W is preferably electrically charged so as to cause a potential of the wafer W to become higher than a potential of the charged member 171. This is because the insoluble substances are further prevented from coming closer to the wafer W side.

Figure 27:
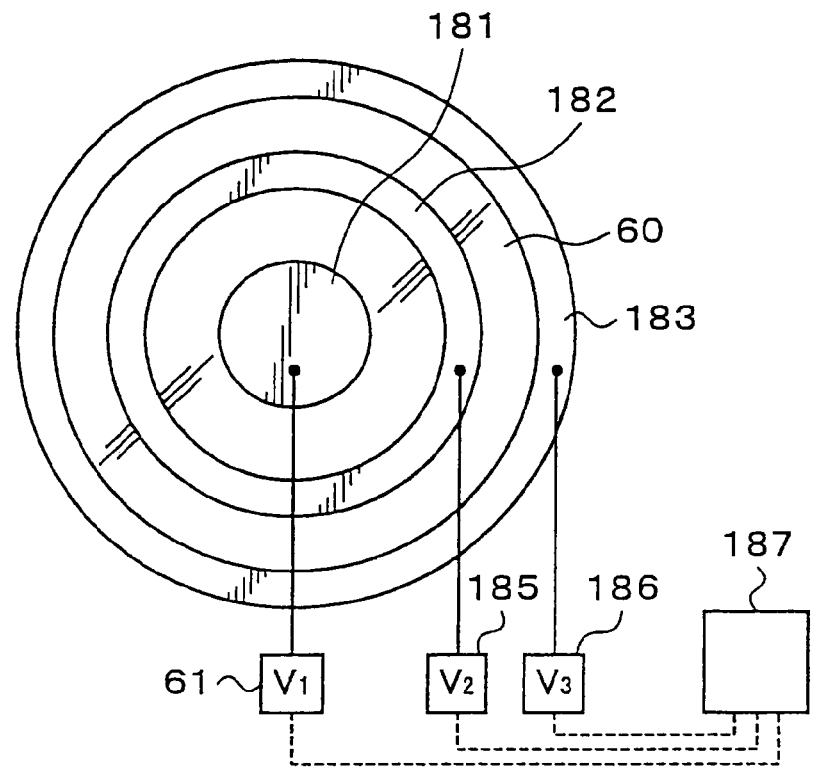
FIG. 27 is a plan view of a spin chuck having zone electrodes.

Another example shown in FIG. 27 can also be proposed. FIG. 27 shows an example of concentrically disposing zone electrodes 181, 182, and 183 on the surface of the spin chuck 60. The spin chuck 60 is the same in size as the wafer W placed thereon. The zone electrodes 181, 182, and 183 are arranged at predetermined spaced intervals. The zone electrodes 181, 182, and 183 are respectively connected to power supplies 184, 185, and 186 which apply voltages thereto, and a control unit 187 controls application timing and values of the applied voltages. The voltages can be applied in a pulsed manner. Note that CEN represents the center of the wafer W and EDG represents an edge portion of the wafer W in the drawing.

Figure 28:
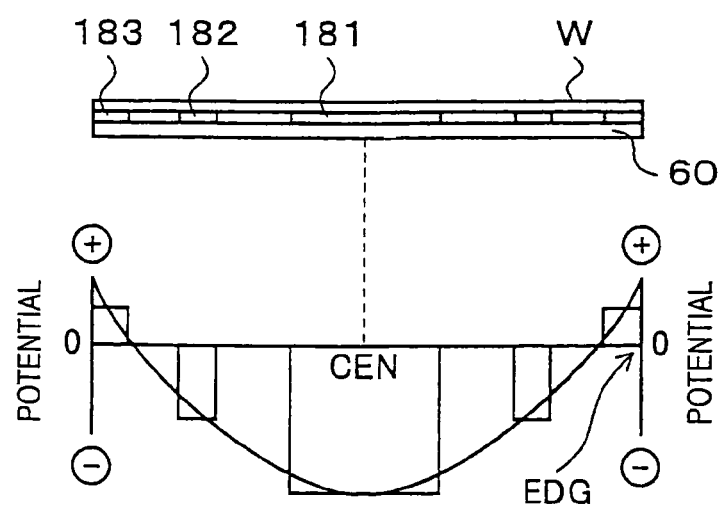
FIG. 28 is an explanatory view showing a potential gradient given to a substrate through the use of the zone electrodes.

Such a unit is used in the following manner. Specifically, as shown in FIG. 28, through the control by the control unit 187, for example, a region in the wafer W corresponding to the zone electrode 183 positioned at the utmost outer circumference is positively charged, a region corresponding to the zone electrode 182 on an inner side is then negatively charged, and a region corresponding to the zone electrode 181 positioned at the center part is more negatively charged, thereby giving a potential gradient to the wafer W.

Figure 29:
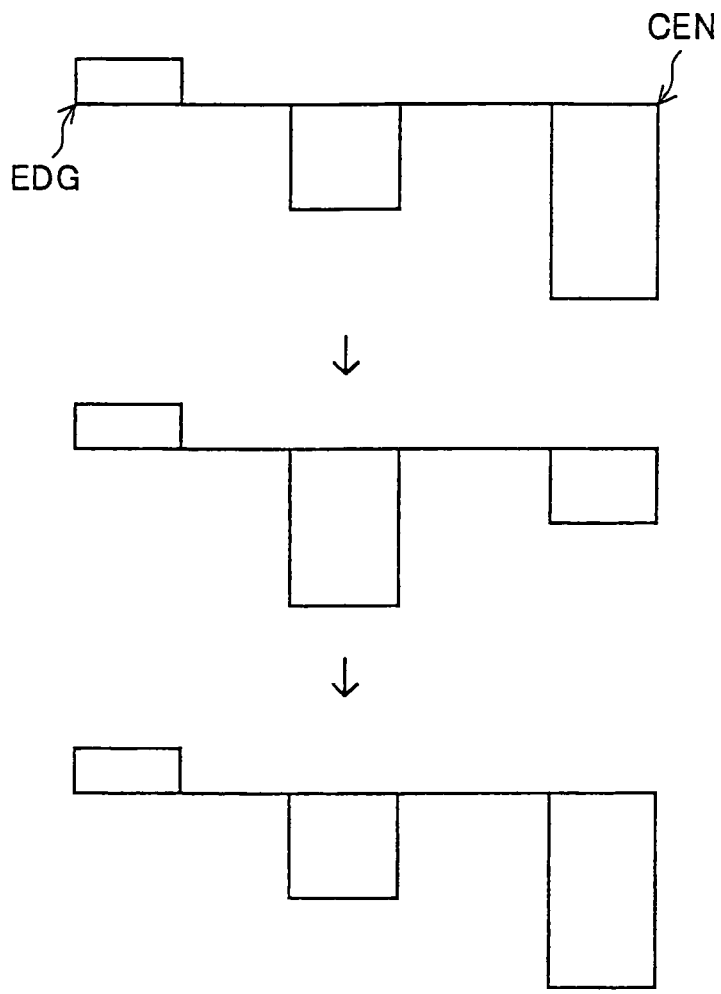
FIG. 29 is an explanatory view showing how potential values are changed with time by controlling the zone electrodes.

The voltage application from, for example, the zone electrodes 182 and 183 is controlled in this state to change the value of the applied voltage to each of these electrodes at every predetermined timing as shown in FIG. 29. For example, a strong voltage and a weak voltage are alternately applied to the zone electrodes 182 and 183. Note that the vertical axis represents a potential level in FIG. 29. At this time, the regions corresponding to the zone electrodes 182 and 183 are kept negatively charged.

Figure 30:
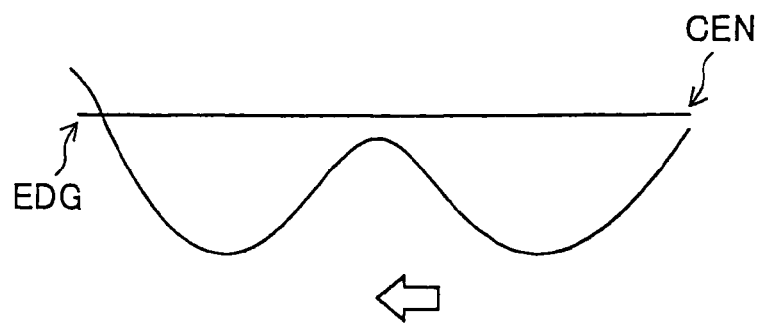
FIG. 30 is an explanatory view showing a wave motion due to the potential change with time.

When a time series potential change is thus caused in each of the regions in the wafer W by controlling the voltage application to the zone electrodes 181, 182, and 183, a wave motion is generated due to potential shift as shown in FIG. 30, so that the insoluble substances, which are in the developing solution on the wafer W, at a negatively charged zeta potential are forced out toward an outer circumference side of the wafer W due to the wave motion.

Thereafter, the developing solution is shaken off from the outer circumference of the wafer W by the rotation of the spin chuck 60 or the like, so that the adhesion of the insoluble substances to the resist film on the wafer W can be prevented.

Figure 31:
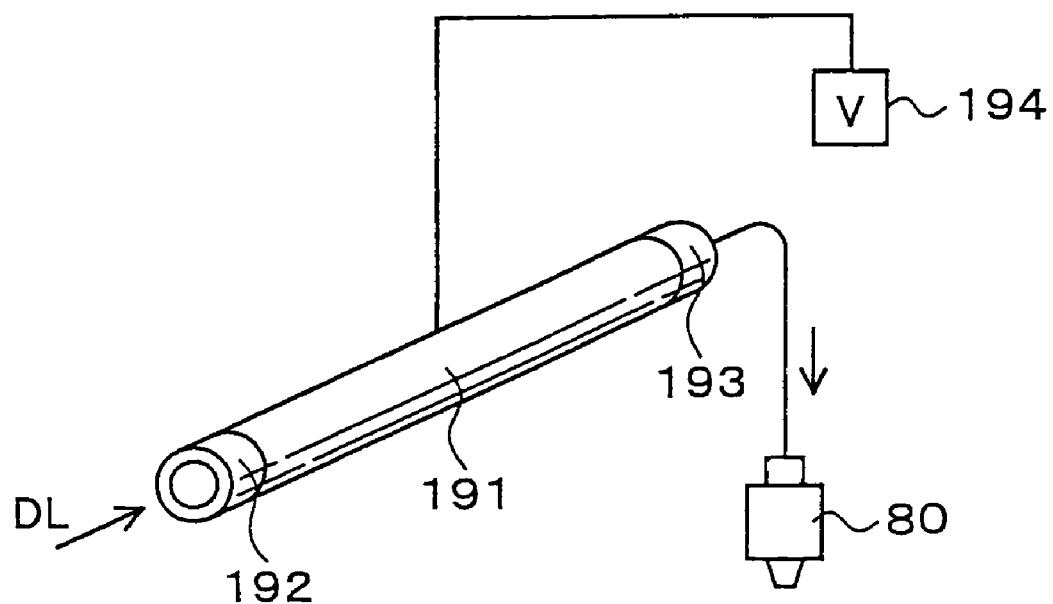
FIG. 31 is an explanatory view showing the structure for applying a voltage to a pipe of the developing solution supply nozzle.

A voltage may be applied to the developing solution which is to be supplied from the developing solution supply nozzle 80, at the stage prior to the discharge thereof from the developing solution supply nozzle 80. For example, as shown in FIG. 31, a pipe including a conductive material is used as a pipe 191 which constitutes a part of a supply pipe connected to the developing solution supply nozzle 80, and insulating members 192 and 193 are disposed in both end portions thereof. A power supply 194 applies a voltage to this pipe 191. With this structure, the developing solution DL is electrically charged when it passes through the pipe 191 and the developing solution DL kept in this state is supplied to the wafer W from the developing solution supply nozzle 80.

When the developing solution DL is electrically charged to the same polarity as that of the zeta potential of the insoluble substances, the repellency due to the same polarity can prevent the adhesion of the insoluble substances to the resist film even when the insoluble substances occur in the developing solution supplied onto the resist film on the wafer W at the developing treatment stage.

When the resist film formed on the wafer W has conductivity, this resist film itself is electrically charged so that the aforesaid repellency due to the same polarity can inhibit the adhesion of the insoluble substances floating in the developing solution to the resist film.

Figure 32:
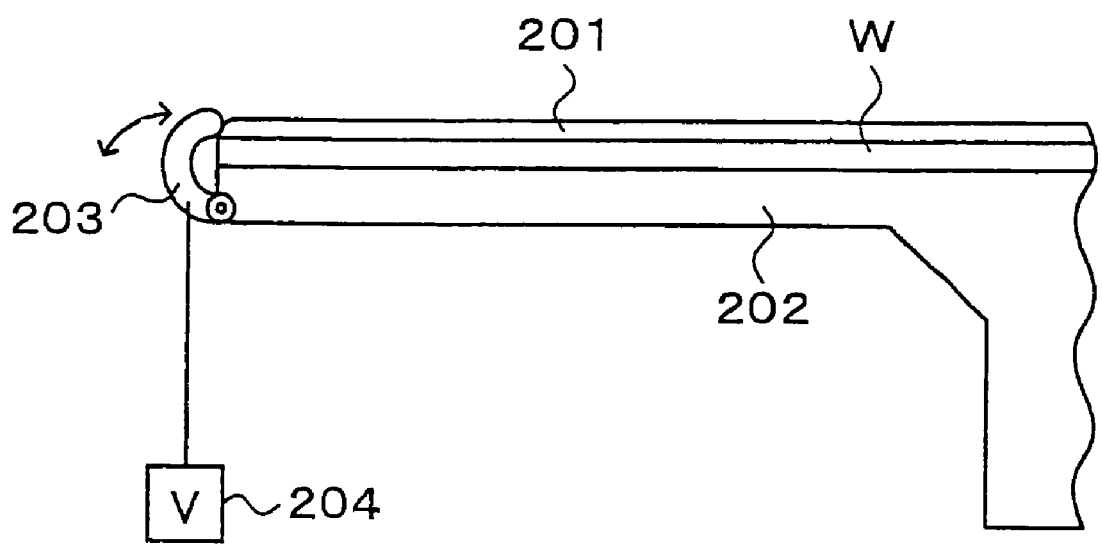
FIG. 32 is an explanatory view showing the structure for applying a voltage to a resist film on the wafer.

FIG. 32 shows a structure example when a voltage is thus applied to a resist film 201 on the wafer W, in which a clamp 203 is attached to an outer edge portion of a mounting table 202, for example, a spin chuck or the like for supporting the wafer W. This clamp 203 directly clamps an edge portion of the wafer W to support the wafer W on the mounting table 202. A power supply 204 applies a voltage to this clamp 203 itself or an electrode (not shown) disposed together with the clamp 203, thereby enabling the resist film 201 to be electrically charged at a potential in a predetermined polarity.

Figure 33:
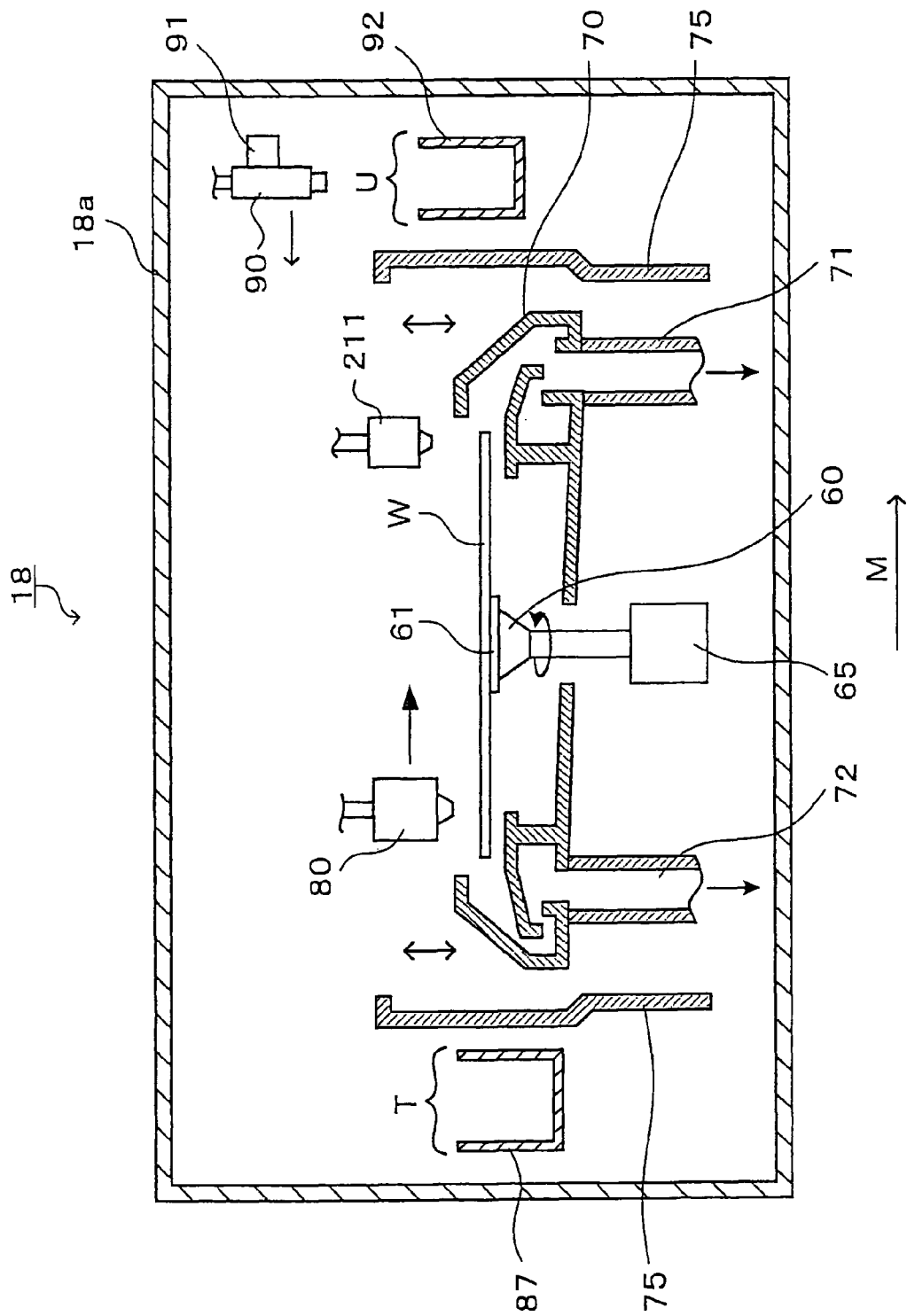
FIG. 33 is a side sectional view of a developing unit having a nozzle for supplying the wafer with a liquid larger in specific gravity than the developing solution.

A liquid, for example, HFE (hydrofluoroether) larger in specific gravity than the developing solution and giving no influence to a developing reaction may be supplied into the developing solution on the wafer W at the stage prior to the cleaning of the wafer W after the developing solution is supplied to the wafer W and the static development is finished. This can be achieved by providing in the developing unit 18 a nozzle 211 supplying this liquid, for example, as shown in FIG. 33.

Figure 34:
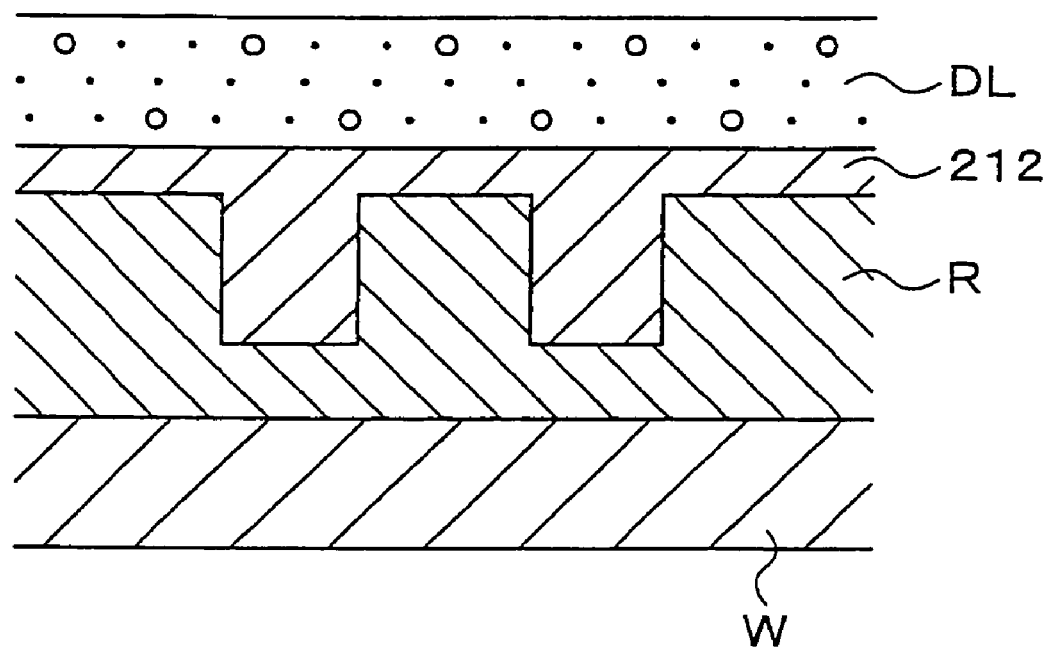
FIG. 34 is an explanatory view showing the state after the liquid larger in specific gravity than the developing solution is supplied to the developing solution on the resist film.

When the liquid larger in specific gravity than the developing solution is thus supplied into the developing solution, a layer 212 of this liquid can be formed between the resist film R and the developing solution DL in which the insoluble substances are floating, as shown in FIG. 34. This layer 212 can prevent the insoluble substances in the developing solution DL from adhering to the resist film R.

In the above-described embodiment, the present invention is applied to the developing method of the wafer W, but the present invention is also applicable to developing methods of substrates other than semiconductor wafers, for example, LCD substrates and mask reticle substrates for photomask.

As explained hitherto, according to the present invention, the zeta potential of the substrate surface is controlled to be a predetermined potential in the same polarity as that of the zeta potential of the insoluble substances in the developing solution, which enables the generation of a sufficient electrical repellent force between the insoluble substances and the substrate surface. Accordingly, the adhesion of the insoluble substances to the substrate can be prevented and development defects caused by this adhesion are reduced. Further, a cleaning time can be shortened owing to no adhesion of the insoluble substances so that a developing treatment time can be shortened. Incidentally, the substrate surface may also include a base of the resist film and an anti-reflection film, and the base may be either an oxide film or another kind of film. Moreover, the zeta potential of the substrate surface may be so controlled that the absolute value of the zeta potential of the substrate surface becomes 30 mV or larger. Note that the 'insoluble substances' dealt with in the present invention may be either those precipitated from the resist film or those entering the developing solution from the outside though originally existing in the developing solution.

As is previously stated, the developing treatment has the first step of loading the developing solution on the substrate, the second step of subjecting the substrate to the static development while the developing solution is loaded thereon, and the third step of supplying the cleaning liquid to the substrate having undergone the static development to clean the substrate, and the zeta potential of the substrate surface may be controlled over the period from the first step to the third step. The insoluble substances of the resist film begin to occur when the supply of the developing solution to the substrate is started and keep existing on the substrate until the substrate is cleaned. Therefore, the control of the potential of the substrate surface over the period from the first step to the third step as in this developing method makes it possible to more surely inhibit the adhesion of the insoluble substances to the substrate surface.

When the charged member electrically charged to an opposite polarity to that of the zeta potential of the insoluble substances floating in the developing solution is brought into contact with the developing solution, the insoluble substances in the developing solution are absorbed to the charged member to enable the collection of the insoluble substances. This can inhibit the adhesion of the insoluble substances to the substrate surface.

When the charged member is brought into contact with the developing solution at the time of the static development in which the insoluble substances occur most, the insoluble substrates can be collected by the charged member more effectively. When the charged member is brought into contact with the developing solution only in the second step, the supply of the developing solution and so on conducted by, for example, nozzles or the like in the first step can be carried out without being disturbed by the charged member.

The adhesion of the ionic surfactant so as to cause the substrate surface and the insoluble substances to be in the same polarity can prevent the adhesion of the insoluble substances to the substrate surface owing to the repulsive force generated between the substrate surface and the insoluble substances. As a result, development defects caused by the adhesion of the insoluble substances to the substrate surface can be reduced. Further, since the insoluble substances do not adhere to the substrate surface, the cleaning time is shortened, resulting in the reduction in the developing time.

The polymer nonionic surfactant may be added to the developing solution, in place of the ionic surfactant. The polymer nonionic surfactant is absorbed to particles and so on in a liquid and the repulsive force is generated in the tired polymer layers resulting from this absorption, and consequently, the polymer nonionic surfactant improves the dispersion stability of the particles and so on in the liquid. In the present invention, the nonionic surfactant is absorbed to the insoluble substances in the developing solution and the substrate surface through the use of this dispersion stabilizing effect, thereby forming a covering film on the insoluble substances and the substrate surface so that the adhesion between the insoluble substances and the substrate surface can be prevented.

The surfactant may be added in the first step. Note that the first step includes immediately before the first step and immediately after the first step. In such a developing method, since the surfactant is added to the developing solution in the first step when the insoluble substances begin to occur, the adhesion of the insoluble substances to the substrate surface can be prevented until the substrate is thereafter cleaned. Therefore, the adhesion of the insoluble substances to the substrate surface is more surely prevented.

The surfactant may be added not only in the first step but also in the third step. In the third step, the cleaning liquid is supplied onto the substrate to temporarily lower the concentration of the surfactant. According to this invention, since the surfactant is newly added in the third step to compensate for the decreased surfactant, which makes it possible to more surely prevent the residual insoluble substances on the substrate from adhering to the substrate.

The surfactant may be added only in the third step. The addition of the surfactant into the developing solution causes a slight change in quality of the developing solution. The addition of the surfactant not during the static development but at the time of the cleaning as in the present invention allows the static development to be free of the influence given by the addition of the surfactant, and also makes it possible to inhibit the adhesion of the insoluble substances to the substrate surface.

According to the developing unit of the present invention, a charging means is capable of electrically charging the zeta potential of the substrate surface to a predetermined potential in the same polarity as that of the zeta potential of the insoluble substances in the developing solution so that the electrical repulsive force can be generated between the insoluble substances and the substrate surface, thereby making it possible to prevent or inhibit the adhesion of the insoluble substances to the substrate surface. As a result, development defects of the substrate caused by the adhesion of the insoluble substances can be reduced. Further, since the insoluble substances do not adhere to the substrate surface, the time required for the cleaning process which is carried out after the static development of the substrate can be shortened so that the total developing treatment time can be shortened.

The provision of the control section which controls the voltage to be applied to the electrode plate enables free control of the zeta potential of the substrate surface in contact with the electrode plate. Consequently, the zeta potential of the substrate surface can be controlled to be such a potential in the same polarity as that of the zeta potential of the insoluble substances, having a repulsive force preventing the adhesion of the insoluble substances to the substrate surface.

Further, when the charged member is electrically charged to an opposite polarity to that of the zeta potential of the insoluble substances floating in the developing solution and is brought into contact with the developing solution, the insoluble substances floating in the developing solution are attracted and collected by the charged member. As a result, the adhesion of the insoluble substances to the substrate surface can be prevented. Incidentally, the charged member may have the same shape as that of the substrate so as to be able to collect the insoluble substances from the entire surface of the substrate.

According to the present invention, since the adhesion of the insoluble substances floating in the developing solution to the substrate surface can be prevented, the developing treatment is rationalized to improve yields. Further, since the cleaning time of the developing treatment can be shortened, the throughput of the substrate processing is improved.

Figure 35:
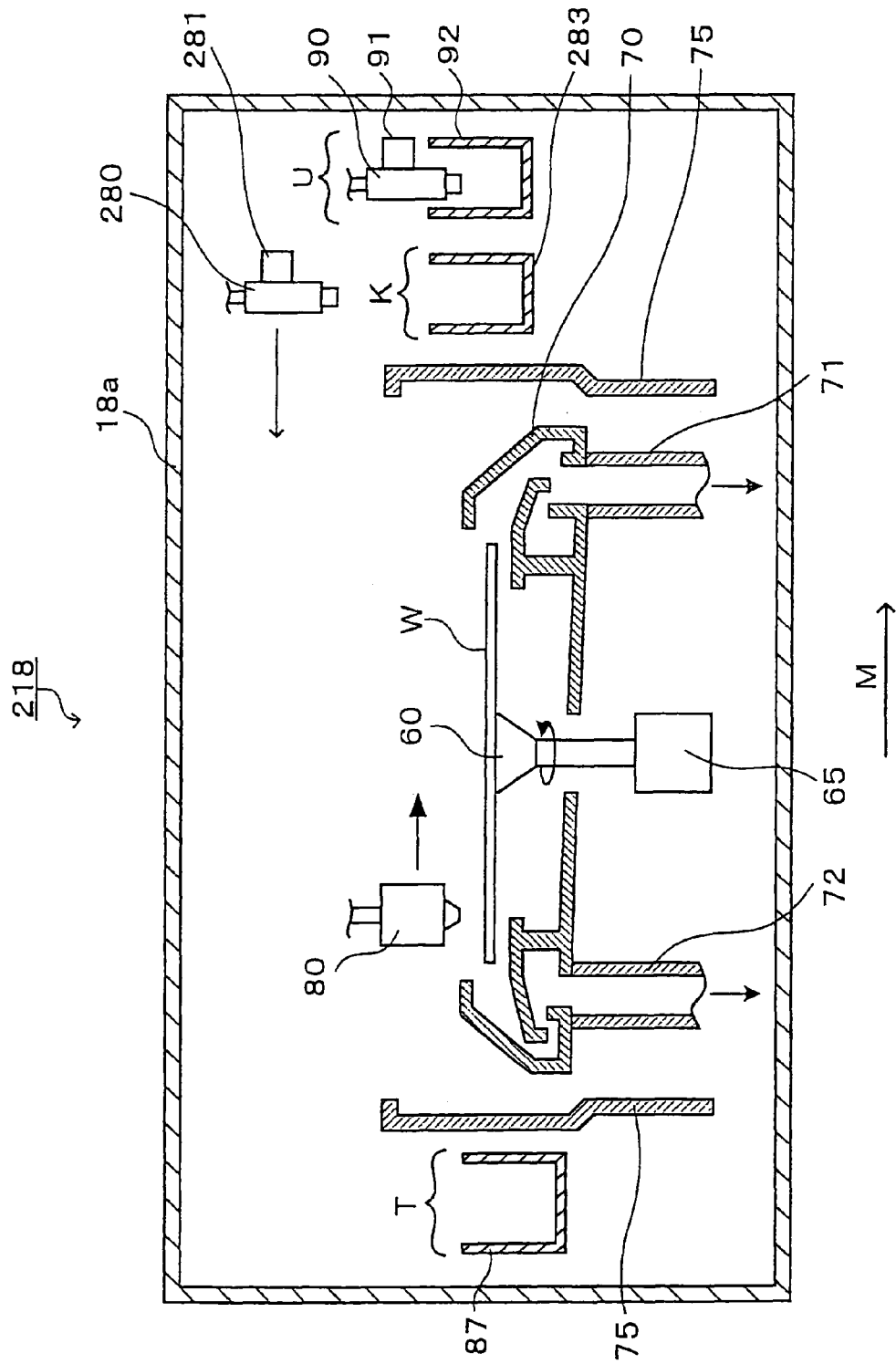
FIG. 35 is an explanatory view of a vertical section of a developing unit in another embodiment.
Figure 36:
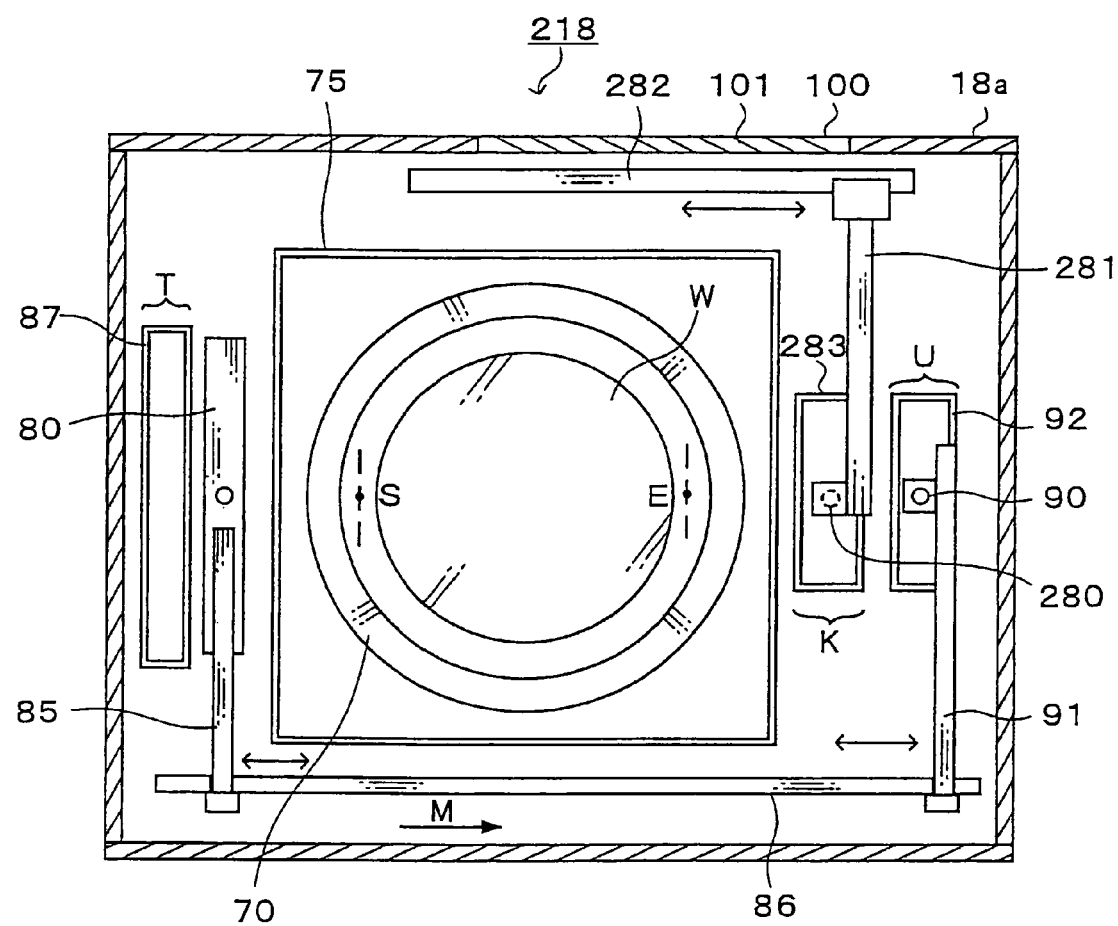
FIG. 36 is an explanatory view of a horizontal section of the developing unit in FIG. 35.

Next, another embodiment will be explained. A developing solution supply nozzle 80 supplying a developing solution to a wafer W can stand by in a stand-by section T in a casing 18a of a developing unit 218 shown in FIG. 35 and FIG. 36. In this embodiment, an alkaline aqueous solution, for example, TMAH(N(CH$_3$)$_4$OH) or the like is used as the developing solution.

A stand-by section K is disposed outside an outer cup 75 on a positive direction side of an M direction (a right side in FIG. 36), and an acid liquid supply nozzle 280 serving as an acid liquid supply section supplying an acid liquid, for example, hydrogen fluoride to the wafer W is on stand-by in this stand-by section K. The acid liquid supply nozzle 280 is formed in, for example, a cylindrical shape and is capable of discharging downward the hydrogen fluoride supplied from a not-shown hydrogen fluoride supply source.

The acid liquid supply nozzle 280 is supported by, for example, a nozzle arm 281, and this nozzle arm 281 is provided to be movable on a straight rail 282 extending in the M direction. The rail 282 is provided, for example, on an opposite side of a rail 86 for a developing solution supply nozzle 80 across a cup 70, and is laid from the stand-by section K to the vicinity of an edge portion of the cup 70 on a negative direction side of the M direction. The nozzle arm 281 supports the acid liquid supply nozzle 280 in such a manner that the acid liquid supply nozzle 280 passes above a center part of the cup 70. Therefore, the acid liquid supply nozzle 280 is capable of moving from the stand-by section K to a position above the center part of the wafer W on a spin chuck 60.

The rail 282 may be provided on the same side as the rail 86 relative to the cup 70. A storage tank 283 storing, for example, a predetermined solvent is provided in the stand-by section K so that the acid liquid supply nozzle 280 can be cleaned while a tip portion thereof is immersed in the solvent when it is on stand-by. This can prevent the acid liquid supply nozzle 280 from being corroded by hydrogen fluoride.

A developing method carried out in a developing unit 218 as structured above will be explained.

Figure 37:
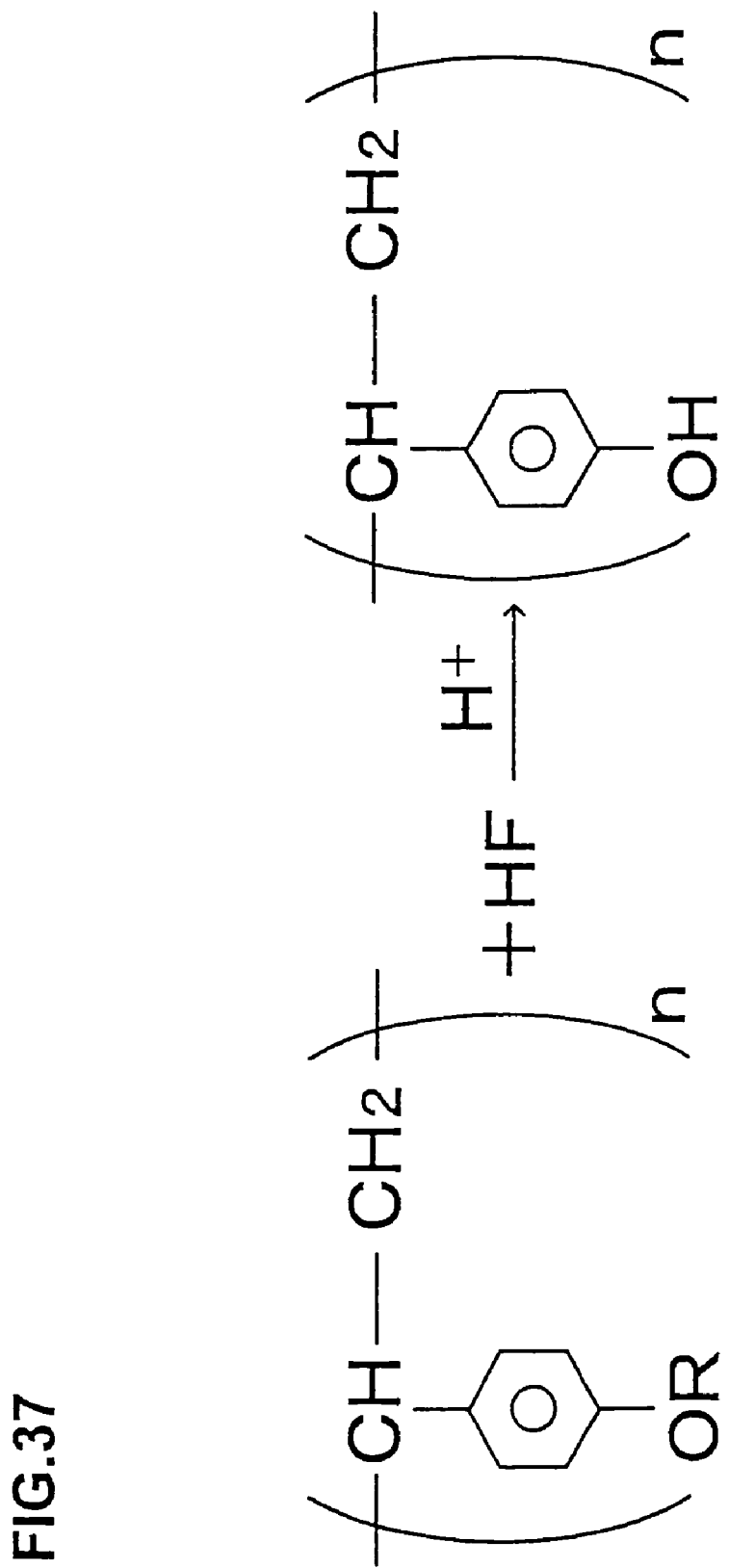
FIG. 37 is an explanatory view showing an elimination reaction of a protecting group of a resist to which hydrogen fluoride is added.

In the resist coating unit 17 where resist coating is carried out, a liquid positive resist including a polyvinyl phenol resin (before reaction in FIG. 37), for example, as shown in FIG. 37, a photoacid producing agent, an acid diffusion inhibitor, and so on is applied onto the wafer W, the polyvinyl phenol resin having a protecting group R (refer to a left side in FIG. 37), so that a resist film is formed on the wafer W. Incidentally, as the protecting group R, selected is, as previously described, a protecting group releasable with acid, having an insolubilizing function in the developing solution, for example, a t-butoxy carbonyl oxy group, an isoproxy carbonyl group, a tetrahydropyranyl group, a trimethylsilyl group, a t-butoxy carbonyl methyl group, or the like.

Then, the wafer W on which the resist film is formed is carried to the aligner (not shown), where the wafer W is irradiated with a light in a predetermined pattern. This light irradiation causes acid from the photoacid producing agent to be produced in the resist film at exposed portions, and the protecting group R in the resist film at the exposed portions is released from the principal chain due to this acid, and is substituted for by a hydroxyl group at these portions (refer to a right side in FIG. 37). The resist including this hydroxyl group has solubility in the alkaline developing solution.

Thereafter, after undergoing predetermined processing in the post-exposure baking unit 44 and the cooling unit 43, the wafer W is carried to the developing unit 218 to undergo developing treatment.

Figure 38:
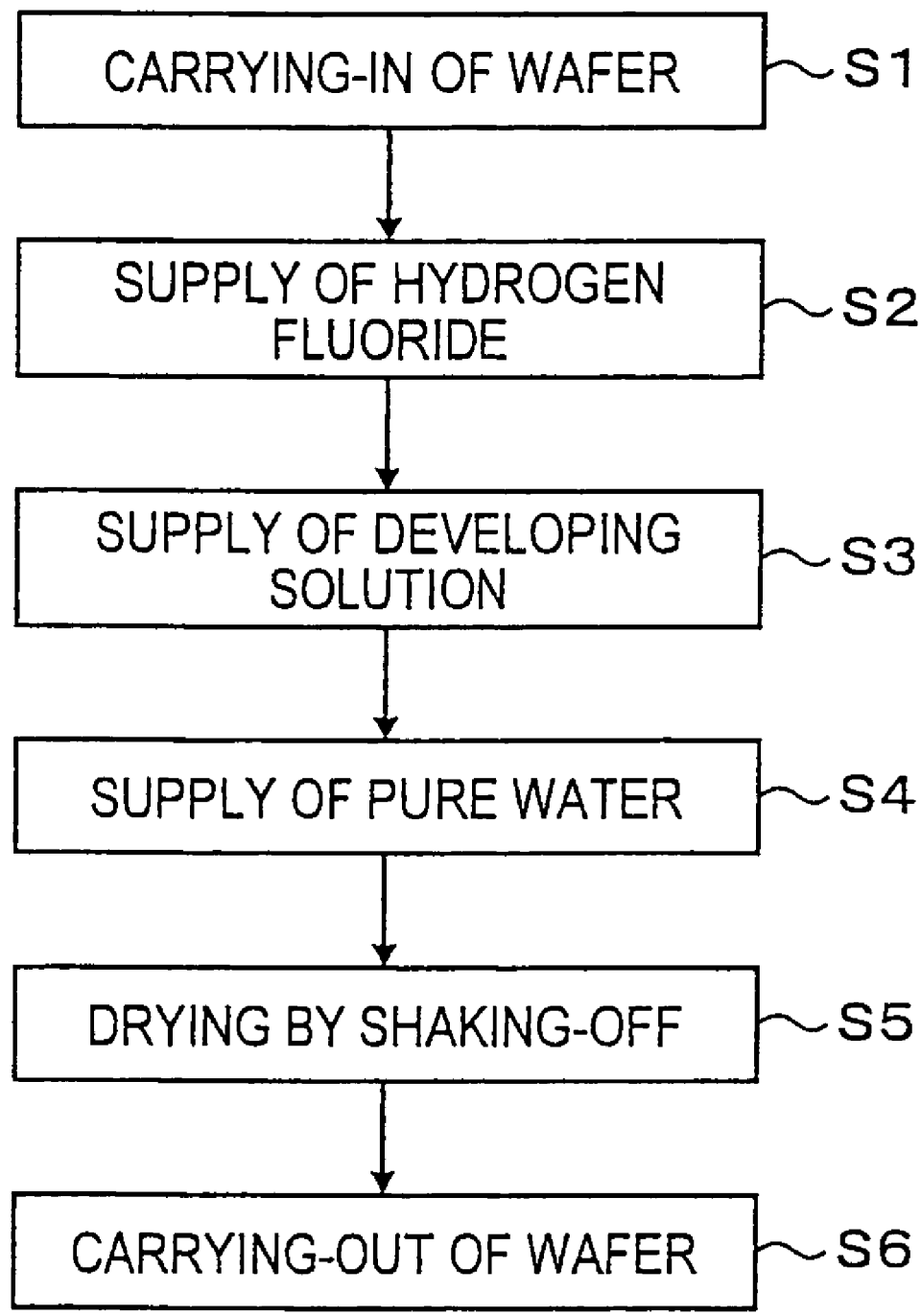
FIG. 38 is a flowchart of developing treatment.

The developing treatment performed in the developing unit 218 will be explained with reference to a flowchart in FIG. 38.

First, the wafer W is carried into the casing 18a through a transfer port 100 by the main carrier 13 and held on the spin chuck 60 by suction (Step S1). When the wafer W is held by suction, the acid liquid supply nozzle 280 moves to the position above the center part of the wafer W. At this time, the rotation of the wafer W is started at a predetermined rotation speed. Then, a predetermined amount of the hydrogen fluoride is discharged from the acid liquid supply nozzle 280 to the center part of the rotated wafer W so that the hydrogen fluoride is supplied to the entire surface of the wafer W (Step S2).

In Step S2, a protecting group R connected to a principal chain of the resist is released by acid of the hydrogen fluoride and is substituted for by a hydroxyl group at this portion, as shown in FIG. 37. This causes the release of the protecting group R in surface layers of unprocessed portions, that is, portions which are to be precipitated in the developing solution by the supply of the developing solution thereafter. This further causes the release of the protecting group R in boundaries between the exposed portions having undergone insufficient exposure and the unexposed portions. As a result, solubility of the resist in the developing solution in the boundaries with the surface layers of the unprocessed portions is improved. Incidentally, in the exposed portions, there sometimes remains the resist in which an elimination reaction of the protecting group R cannot be caused at the time of the exposure processing, and the supply of this hydrogen fluoride also causes the elimination reaction of the protecting group R of these exposed portions.

After a predetermined period of time elapses after the hydrogen fluoride is supplied to the wafer W, the rotation of the wafer W is stopped and the acid liquid supply nozzle 280 is returned to the stand-by section K Subsequently, the developing solution supply nozzle 80 moves to a start position S inside the cup 70 near an edge portion of the wafer W on the negative direction side of the M direction, and moves from this start position S to an end position E near an edge portion of the wafer W on the positive direction side of the M direction while discharging the developing solution (Step S3).

By this operation, a predetermined amount of the developing solution is loaded on the wafer W and the static development for a predetermined period of time is started. In this static development, the resist in the exposed portions dissolves in the developing solution. Further, the surface layer portions of the unexposed portions and the boundaries between the exposed portions and the unexposed portions, where the protecting group R is released by the acid supply, also dissolve in the developing solution. Meanwhile, portions of the unexposed portion other than the surface layer portions do not dissolve in the developing solution since they have the protecting group R. Thus, a predetermined resist pattern is formed on the wafer W.

When static development for a predetermined period of time is finished, a cleaning liquid supply nozzle 90 moves to the position above the center part of the wafer W and the wafer W is rotated, so that a cleaning liquid, for example, a pure water is supplied to the wafer W from the cleaning liquid supply nozzle 90 (Step S4). The developing solution on the wafer W is replaced with the pure water and the used developing solution is removed from the surface of the wafer W. Thereafter, the discharge of the pure water is stopped, the wafer W is rotated at a high speed, and the wafer W is dried by liquid shake-off (Step S5). When this drying process is finished, the wafer W is delivered from the spin chuck 60 to the main carrier 13, and is carried out of the developing unit 218 (Step S6), so that a series of the developing treatment is finished.

According to this embodiment, since the hydrogen fluoride being an acid liquid is supplied onto the wafer W before the developing solution is supplied thereto, the protecting group R connected to the principal chain of the resist is released and substituted for by the hydroxyl group in the surface layers of the unexposed portions when the developing treatment is started, thereby enabling the increase in solubility in the developing solution of the surface layers of the unexposed portions. Further, since, in the boundaries between the exposed portions having undergone an insufficient amount of exposure and the unexposed portions, the elimination reaction of the protecting group R can be promoted, solubility in the developing solution of the boundaries can be enhanced. Consequently, such a state does not occur that insoluble resist polymers disperse from the surface layers of the unexposed portions and the boundaries to float in the developing solution, which was conventionally the case, thereby making it possible to prevent resist particles whose particle size has grown due to cohesion of the resist polymers from re-adhering to the wafer W. Therefore, development defects caused by the re-adhesion of the insoluble substances such as the resist particles to the substrate can be reduced. In addition, a cleaning time for removing the adhering insoluble substances is not necessary, thereby enabling the reduction in the total developing treatment time.

In this embodiment, the developing solution is supplied immediately after the hydrogen fluoride is supplied to the wafer W, but the developing solution may be supplied after the wafer W supplied with the hydrogen fluoride is cleaned.

Figure 39:
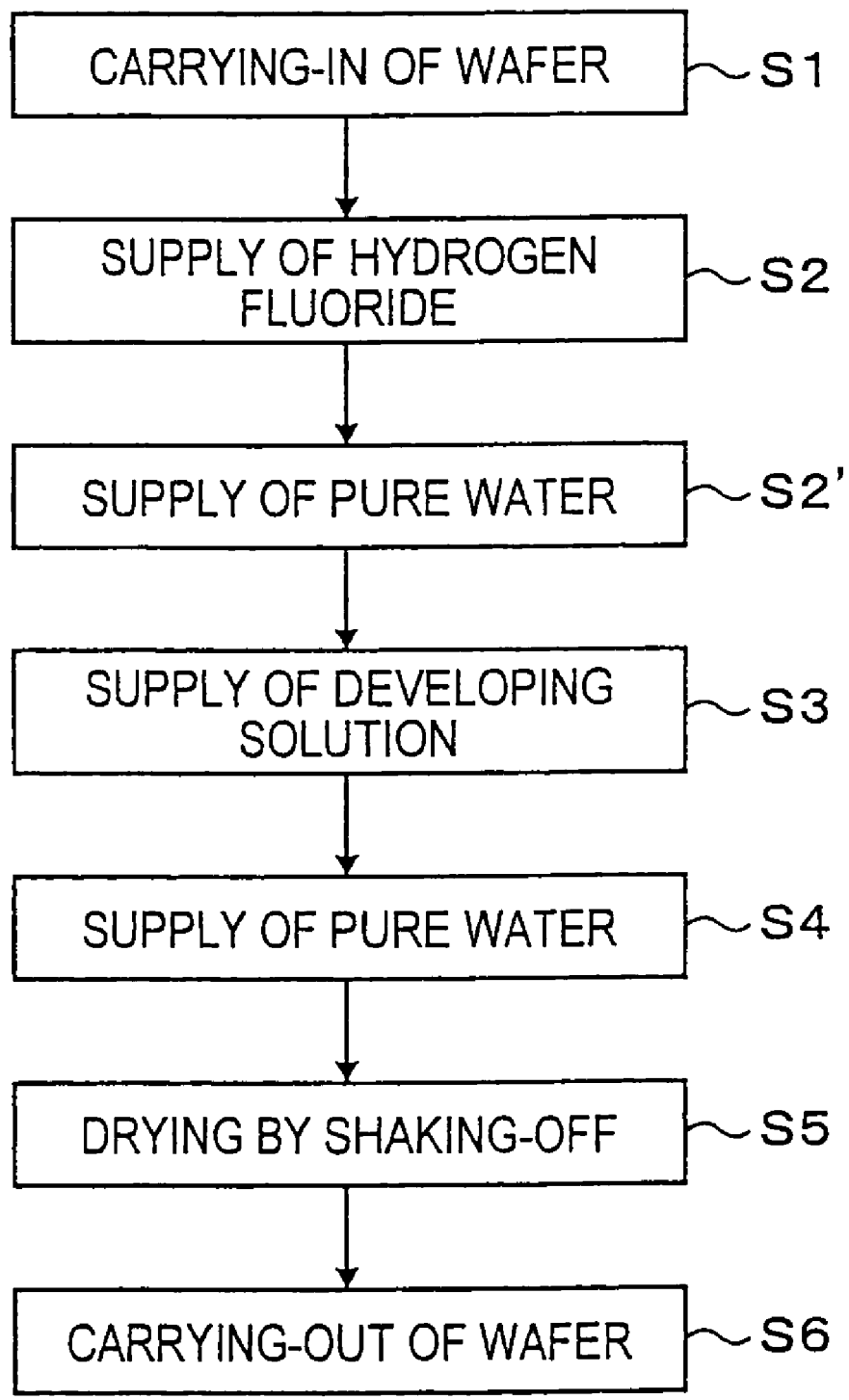
FIG. 39 is a flowchart showing another example of the developing treatment.

For example, after Step S2 in which the hydrogen fluoride is supplied is finished, the cleaning liquid supply nozzle 90 moves to the position above the center part of the wafer W to supply the rotated wafer W with the cleaning liquid, for example, the pure water (Step S2'), as shown in FIG. 39. The hydrogen fluoride on the wafer W is replaced with the pure water and is removed from the wafer W. In this case, it can be avoided that the acid liquid remains on the wafer W to give an adverse effect to a physical property of the developing solution which is to be supplied thereafter or to react with the developing solution, thereby producing impurities.

In the above-described embodiment, the hydrogen fluoride being the acid liquid is supplied before the developing solution is supplied to the wafer W, but the acid liquid may be supplied after the developing solution is supplied. In this case, the developing treatment is performed in the order of, for example, the supply of the developing solution, the supply of the acid liquid, and the supply of the pure water. Also in the case where the acid liquid is thus supplied after the developing solution is supplied, the insoluble resist polymers dispersed in the developing solution from the boundaries between the exposed portions and the unexposed portions and the surface layers of the unexposed portions are changed to be soluble, so that it can be prevented that the resist polymers cohere together thereafter to grow the particle size thereof and adhere to the wafer W. Incidentally, the developing solution may be further supplied after the supply of the acid liquid subsequent to the supply of the developing solution and the pure water may be supplied thereafter.

Moreover, it is also suitable that the acid liquid is supplied after the cleaning liquid is supplied and the cleaning liquid is further supplied thereafter for cleaning. Further, the acid liquid may be supplied concurrently at the time of rinsing with the cleaning liquid. In this case, the cleaning liquid may be supplied from the cleaning liquid supply nozzle 90 while the acid liquid is supplied from the acid liquid supply nozzle 280, or a liquid made by mixing the acid liquid and the cleaning liquid in advance may be supplied to the wafer W by connecting a pipe for the acid liquid which is connected to the acid liquid supply nozzle 280 to a pipe for the cleaning liquid.

The acid liquid supply nozzle 280 in the above-described embodiment supplies the hydrogen fluoride to the center part of the wafer W, but it may be the one having the same structure as that of the developing solution supply nozzle 80 and supplying the acid liquid to the entire surface of the wafer W by scan-moving above the wafer W. In this case, similarly to the aforesaid developing solution supply nozzle 80, the acid liquid supply nozzle 280 moves from one end portion of the wafer W to the other end portion thereof while discharging the hydrogen fluoride from a plurality of supply ports to supply the hydrogen fluoride to the entire surface of the wafer W. In this example, since the wafer W need not be rotated when the hydrogen fluoride is being supplied, only a small amount of the hydrogen fluoride is wasted, thereby enabling the reduction in a consumption amount of the hydrogen fluoride.

Figure 40:
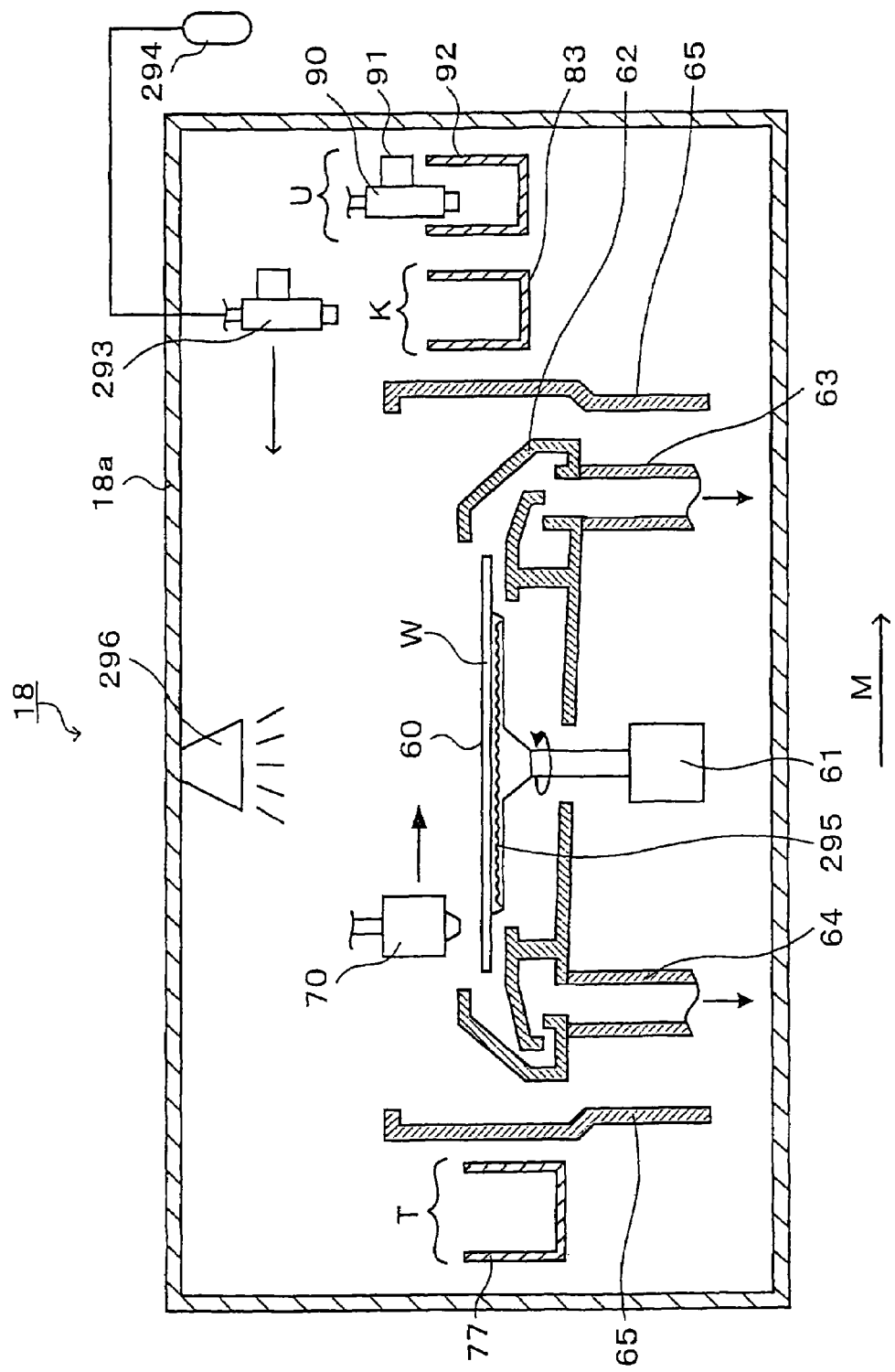
FIG. 40 is an explanatory view of a horizontal section of a developing unit according to still another embodiment.

In the above-described embodiment, the acid liquid is supplied to the center part of the wafer W through the use of the acid liquid supply nozzle 280, but an acid gas supply nozzle 293 supplying an acid gas to the wafer W may be used as shown in FIG. 40.

In the example in FIG. 40, the acid gas supply nozzle 293 is connected to an acid gas supply source 294, for example, a gas cylinder or the like so that the acid gas, for example, a chlorine gas can be supplied to the wafer W from the acid gas supply nozzle 293.

When the acid gas is thus supplied instead of supplying the acid liquid to the wafer W, the same effect as that brought about by the supply of the acid liquid is also obtainable, so that the occurrence of the insoluble substances can be inhibited.

Incidentally, when, at the time of the supply of the acid liquid and the supply of the acid gas, the wafer W as the substrate is heated in advance to a room temperature or higher for example, 25° C. to 80° C., more preferably, 40° C. to 60° C. to be in a higher temperature range, solubility is further increased so that the occurrence of the insoluble substances can be inhibited. In the case of supplying the acid liquid, the same effect is also obtainable when the supplied acid liquid itself is heated to a higher temperature range equal to or higher than a room temperature, for example, 25° C. to 80° C., more preferably 40° C. to 60° C. and this heated acid liquid is supplied to the wafer W.

The substrate such as the wafer W can be heated by providing a heating unit 295 such as a heater in the spin chuck 60 or providing a heating unit 296 such as a lamp on the ceiling portion inside the casing 18a, for example, as shown in FIG. 40. Incidentally, in the case of providing the heating unit 295 in the spin chuck 60, the spin chuck 60 preferably has the same size as that of the wafer W or larger.

Figure 41:
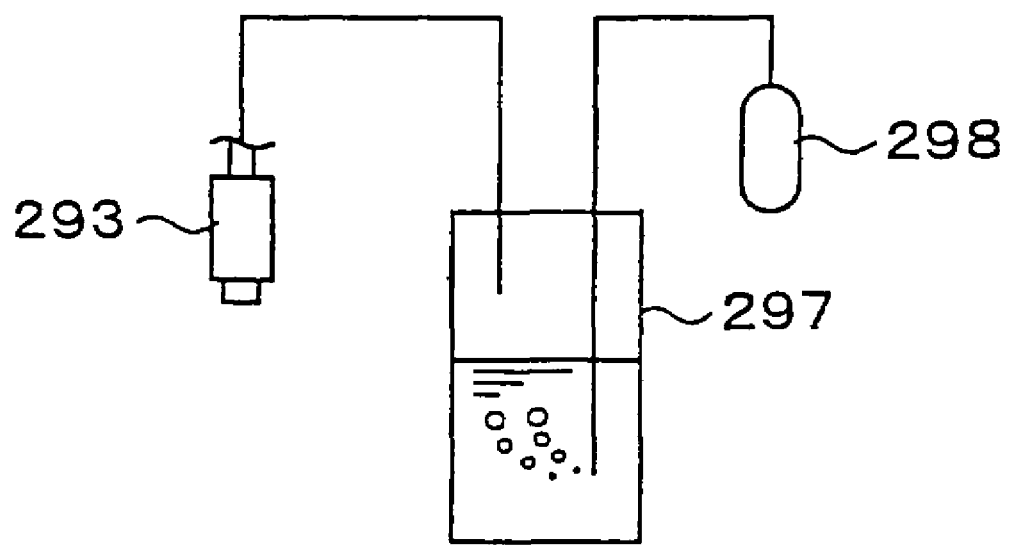
FIG. 41 is an explanatory view showing an example of an acid gas supplying unit.

In the example in FIG. 40, the acid gas supply nozzle 293 is directly connected to the acid gas supply source 294 to supply the gas such as a chloride gas which itself has acidity, but such a structure is also adoptable that, as shown in FIG. 41, the acid liquid is stored in a tank 297, an inert carrier gas, for example, a gas from a gas supply source 298 such as a nitrogen gas or an argon gas is supplied into the tank 297 to bubble the acid liquid in the tank 297, and mist or vapor of the acid liquid generated at this time is sent to the acid gas supply nozzle 293 by this carrier gas. Such a structure enables the supply of a gas containing the mist or vapor of the acid liquid to the wafer W.

In the above-described embodiment, the resist applied to the wafer W is the positive resist, but the present invention is also applicable to the case where the resist film is a negative resist, for example, a resist composed of a base resin+a photoacid producing agent+an acid-reactive cross-linking agent. This negative resist is insolbilized in the developing solution by a cross-linking reaction induced by acid. In this negative resist, the cross-linking reaction which is only insufficiently caused at the time of the exposure processing is induced by the supply of the acid at the time of the developing treatment so that solubility in the developing solution of the exposed portions is sufficiently lowered. Consequently, the resist at the exposed portions surely remains and only the resist at the unexposed portions dissolves in the developing solution, thereby forming a desired resist pattern.

As is explained hitherto, according to the present invention, the acid liquid is supplied so that the action of the acid can change solubility in the developing solution of the resist. More specifically, solubility of the resist at the boundaries between the exposed portions and the unexposed portions can be increased. Further, solubility of the resist at the surface layers of the unexposed portions can be increased. Accordingly, the insoluble substances such as the resist particles do not float in the developing solution which is supplied thereafter and thus the re-adhesion of the insoluble substances to the substrate is eliminated, which makes it possible to reduce development defects caused by the adhesion of the insoluble substances.

The acid liquid used in the present invention may be either organic acid or inorganic acid and, for example, hydrogen fluoride, hydrochloric acid, nitric acid, and a diluted liquid of each of them can be proposed. Incidentally, the stage prior to the supply of the developing solution to the substrate after the resist is applied thereto may be the stage either after the exposure or before the exposure as long as it is prior to the supply of the developing solution after the resist is formed.

The substrate may be cleaned (rinsed in a generally used term) after the acid liquid is supplied at the stage prior to the supply of the developing solution to the substrate after the resist is applied thereto. In this case, since the acid liquid supplied onto the substrate is removed from the surface of the substrate and the developing solution is supplied thereafter, for example, the influence given to the property of the developing solution by the acid can be avoided. Further, it can be also prevented that the developing solution reacts with the residual acid to produce impurities.

A liquid containing a large amount of hydroxyl group or hydrogen (for example, a bubbled ozonized water with acid being mixed therein) may be used instead of the acid liquid, even if it is neutral. This is because the use of such a liquid increases solubility of the resist so that the occurrence of the insoluble substances such as particles can be further inhibited.

The resist may be the positive resist including the protecting group releasable with acid, which has an insolubilizing function in the developing solution. In this case, the supply of the acid promotes the release of the protecting group to increase solubility of the resist polymers which are dispersed in the developing solution due to, for example, the so-called film-thickness reduction mentioned above. As a result, neither of such states arises, that is, the state that the resist polymers inferior in solubility do not dissolve in the developing solution to float therein, and the state that the resist particles and so on cohering together re-adhere to the substrate.

Figure 42:
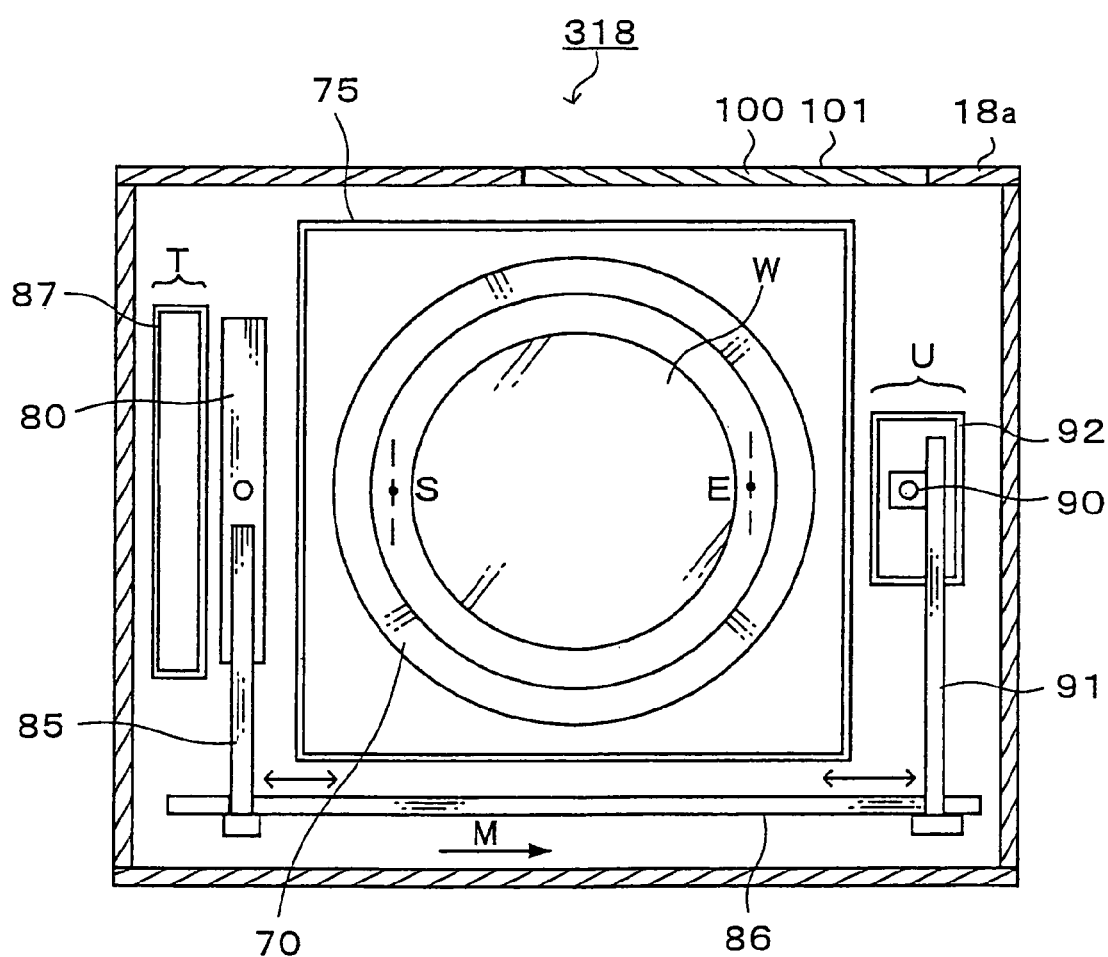
FIG. 42 is an explanatory view of a horizontal section of a developing unit in yet another embodiment.

Still another embodiment will be explained. FIG. 42 shows a developing unit 318 for carrying out a developing method according to the other embodiment. As a developing solution used in this embodiment, a strong alkaline developing solution of about pH 13, for example, TMAH(N(CH$_3$)$_4$OH) or the like is supplied from a developing solution supply nozzle 80.

A stand-by section U is provided outside an outer cup 75 on a positive direction side of an M direction (a right side in FIG. 42), and a cleaning liquid supply nozzle 90 serving as a pH adjusting liquid supply section which is capable of supplying, for example, two kinds of cleaning liquids to a wafer W is on stand-by in the stand-by section U.

Figure 43:
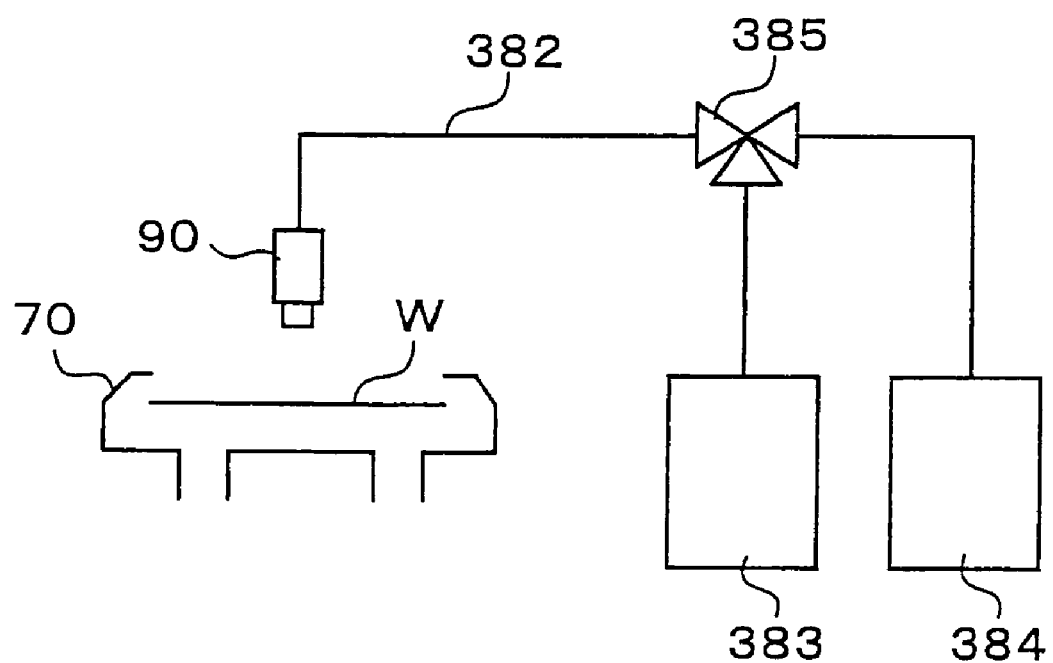
FIG. 43 is an explanatory view showing a supply system of a cleaning liquid supply nozzle.
Figure 44:
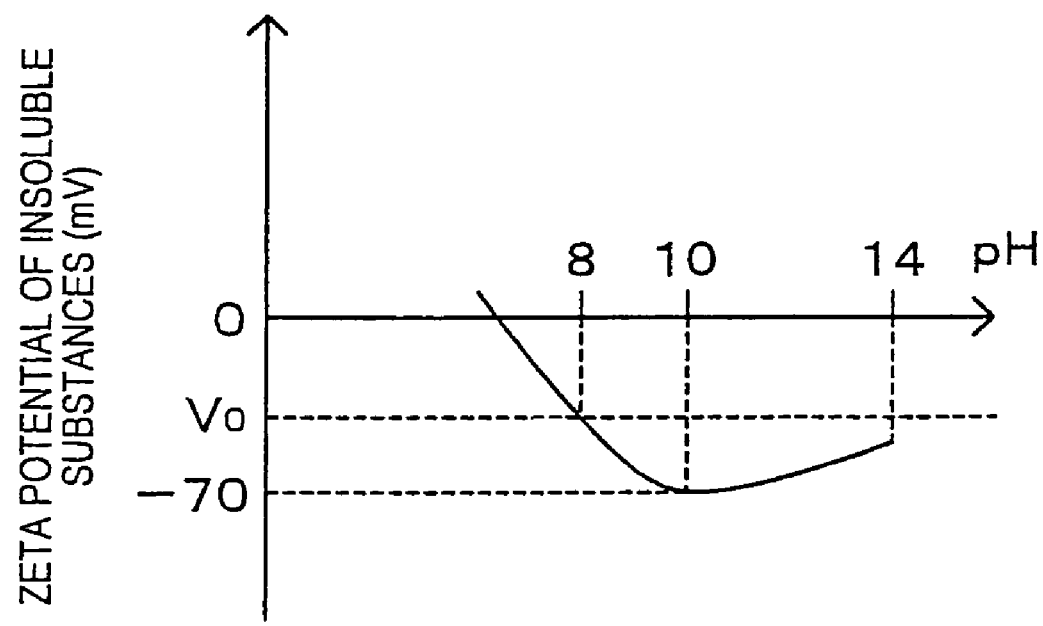
FIG. 44 is a graph showing a correlation curve between a zeta potential of insoluble substances in a liquid and a pH value of the liquid.

The cleaning liquid supply nozzle 90 is communicatingly connected to two storage tanks 383 and 384 by a pipe 382, for example, as shown in FIG. 43. In the storage tank 383, an alkaline cleaning liquid which is adjusted to have a predetermined pH value, for example, pH 10 is stored. The alkaline cleaning liquid is, for example, a pure water with the developing solution added thereto. The predetermined pH value is determined based on a correlation curve as shown in FIG. 44 which is obtained from an experiment in advance, the correlation curve showing the correlation between the zeta potential of insoluble substances floating in a liquid and the pH value of the liquid. A pH value at which an absolute value of the zeta potential of the insoluble substances becomes a maximum value is selected.

In the storage tank 384, for example, a neutral cleaning liquid, for example, a pure water is stored. As shown in FIG. 43, a three-way valve 385 is provided in the pipe 382 at a branch point to the storage tank 383 and the storage tank 384 so that the alkaline cleaning liquid and the pure water can be selectively supplied to the cleaning liquid supply nozzle 90.

A developing method carried out in the developing unit 318 as structured above will be explained.

The wafer W carried into the developing unit 318 is held on a spin chuck 60 by suction. When the wafer W is held by suction, a developing step of the wafer W is started. In this developing step, the developing solution supply nozzle 80 first moves to a start position S inside a cup 70 near an edge portion of the wafer W on a negative direction side of the M direction and moves from the start position S to an end position E near an edge portion of the wafer W on the positive direction side of the M direction while discharging the developing solution. By this operation, a predetermined amount of the developing solution is loaded on the wafer W and static development for a predetermined period of time is started. In this static development, most of a resist film in exposed portions dissolves in the developing solution, and a part of the resist film turns into the insoluble substances to float in the developing solution.

When the developing step is finished after the static development is performed for the predetermined period of time, a cleaning step of the wafer W is carried out. In the cleaning step, the cleaning liquid supply nozzle 90 first moves to a position above a center part of the wafer W and the wafer W is rotated at a predetermined speed. Then, the alkaline cleaning liquid is first discharged from the cleaning liquid supply nozzle 90, thereby supplying the alkaline cleaning liquid of pH 10 onto the wafer W. The developing solution on the wafer W is replaced with the alkaline cleaning liquid so that the liquid on the wafer W is maintained at pH 10. In this manner, the zeta potential of the insoluble substances in the liquid on the wafer is maintained, for example, at −70 mV as shown in FIG. 44 to maintain the absolute value of the zeta potential at the maximum value. During this period, the cohesion of the insoluble substances on the wafer W is inhibited and they are dispersed outside the wafer W by a centrifugal force.

After the alkaline cleaning liquid is supplied for a predetermined period of time, the three-way valve 385 is switched over so that the pure water is in turn supplied onto the wafer W. This supply of the pure water completely stops the development of the resist film and completely removes the insoluble substances remaining on the wafer W as well. After a predetermined period of time elapses, the supply of the pure water is stopped to finish the cleaning step, and then the wafer W is rotated at a high speed so that the wafer W is dried by shaking-off. When this drying step is finished, the wafer W is delivered from the spin chuck 60 to the main carrier 13 and the wafer W is carried out of the developing unit 318 so that a series of the developing treatment is finished.

According to this embodiment, since the alkaline cleaning liquid of pH 10 is supplied in the cleaning step and the absolute value of the zeta potential of the insoluble substances on the wafer W is maintained at the maximum value, an electrical repellent force among the insoluble substances is kept so that the cohesion of the insoluble substances can be prevented. Accordingly, the particle size growth of the insoluble substances and the adhesion of the insoluble substances to the wafer W and so on can be prevented. Consequently, development defects can be reduced. Further, since a cleaning time for removing the insoluble substances and so on adhering to the wafer W is not required, the total developing treatment time can be shortened.

In addition, since the pure water is supplied after the alkaline cleaning liquid is supplied, the development of the resist film can be completely stopped and the impurities such as the insoluble substances remaining on the wafer W can be completely removed.

In the embodiment described above, the pH value of the liquid on the wafer W is adjusted by supplying the wafer W with the alkaline cleaning liquid whose pH value is adjusted in advance, but the pH value of the liquid on the wafer W may be adjusted by supplying the cleaning liquid and a pH adjusting liquid separately.

Figure 45:
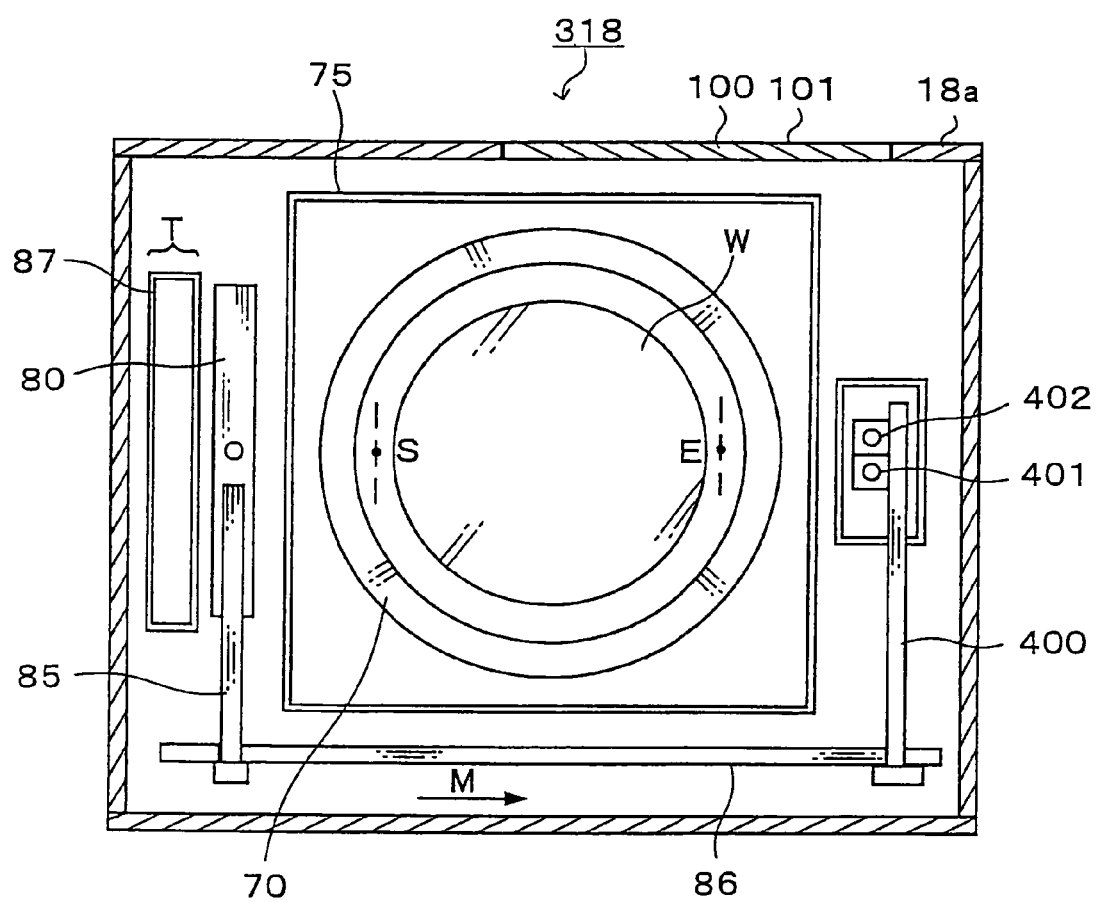
FIG. 45 is an explanatory view of a horizontal section showing a developing unit when it has a pH adjusting liquid supply nozzle.

FIG. 45 shows an example of such a structure. A rinse arm 400 supports a pure water supply nozzle 401 serving as a cleaning liquid supply section which supplies a cleaning liquid, for example, a pure water, and a pH adjusting liquid supply nozzle 402 serving as a pH adjusting liquid supply section which supplies a pH adjusting liquid, for example, a developing solution. The pure water supply nozzle 401 and the pH adjusting liquid supply nozzle 402 are supported by the rinse arm 400 as to be movable to a position above the vicinity of the center of the wafer W.

Figure 46:
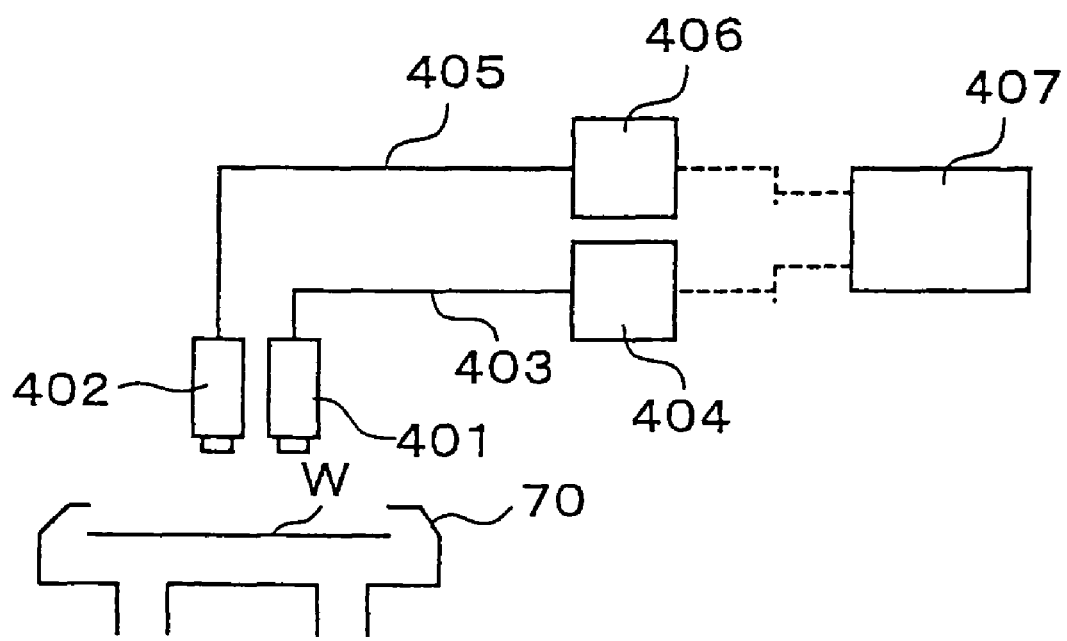
FIG. 46 is an explanatory view showing supply systems of the pH adjusting liquid supply nozzle and a pure water supply nozzle in FIG. 45.

The pure water supply nozzle 101 is communicatingly connected to a pure water supply unit 404 via a pipe 403, for example, as shown in FIG. 46, and the pH adjusting liquid supply nozzle 402 is communicatingly connected to a pH adjusting liquid supply unit 406 via a pipe 405. The pure water supply unit 404 and the pH adjusting liquid supply unit 406 have a pressure-sending mechanism such as a pump, a storage tank, and so on which are not shown so that the pure water and the pH adjusting liquid can be supplied to the respective nozzles 401 and 402 at predetermined flow rates and at predetermined timing. As the pH adjusting liquid, for example, an ammonia water is used.

The supply flow rates of the respective liquids from the pure water supply unit 404 and the pH adjusting liquid supply unit 406 are controlled by a control section 407. The control section 407 controls the supply flow rates of the respective liquids so that the liquid on the wafer W, for example, in the cleaning step has a set pH value, for example, pH 10.

Then, the pure water supply nozzle 401 and the pH adjusting liquid supply nozzle 402 move to the position above the vicinity of the center of the wafer W in the cleaning step which is carried out after the developing step, and the pure water and the pH adjusting liquid are discharged from the respective nozzles 401 and 402 onto the rotated wafer W at the predetermined flow rates. The liquids discharged onto the wafer W and mixed with each other are maintained, for example, at approximately pH 10 and the wafer W is cleaned in this state. After a predetermined period of time elapses, the supply of the pH adjusting liquid from the pH adjusting liquid supply nozzle 402 is stopped and only the supply of the pure water from the pure water supply nozzle 401 is carried out. Thereafter, the supply of the pure water is stopped and the wafer W is dried by shaking-off similarly to the above-described embodiment.

In this example, since the pure water and the pH adjusting liquid are discharged from the nozzles exclusively used for the respective liquids, both of the liquids are not mixed in the nozzles or pipes so that stable liquid supply can be constantly realized. Further, in order to supply only the pure water onto the wafer W, what is required is only stopping the supply of the pH adjusting liquid, and therefore, this switching-over operation can be performed smoothly. Incidentally, the pH adjusting liquid is not limited to $TMAH(N(CH_3)_4OH)$, and may be $NH_4$ or the like.

In the above-described embodiment, the pH value of the liquid on the wafer W is so adjusted that the absolute value of the zeta potential of the insoluble substances becomes the maximum value, but the pH value of the liquid on the wafer W may be so adjusted that the absolute value of the zeta potential of the insoluble substances becomes a value equal to or larger than a predetermined value at which the insoluble substances do not cohere together.

In such a case, for example, as shown in FIG. 44, a predetermined value $V_0$ being the minimum absolute value of the Zeta potential at which the insoluble substances do not cohere together and a pH range, for example, pH 8 to pH 14, in which the absolute value of the zeta potential of the insoluble substances can be maintained at a value equal to or larger than the predetermined value $V_0$ are obtained in advance. Then, the cleaning liquid whose pH value is adjusted to pH 8 which falls within the aforesaid pH range is supplied onto the wafer W in the cleaning step. This prevents the cohesion of the insoluble substances and inhibits the particle size growth of the insoluble substances and the adhesion of the insoluble substance to the wafer W, so that development defects can be reduced.

In the above-described embodiment, the present invention is applied to the developing method of the wafer W, but the present invention is also applicable to developing methods of substrates other than semiconductor wafers, for example, LCD substrates, mask reticle substrates for photomask, and so on.

According to the present invention, the particle size growth of the insoluble substances floating in the developing solution at the time of the developing treatment can be restrained and the adhesion of the insoluble substances to the substrate can be prevented so that development defects caused by this adhesion and so on can be reduced. Accordingly, yields can be improved. Further, since the cleaning time for removing the insoluble substances adhering to the substrate is not required, the developing treatment time is shortened to achieve improvement in throughput.

What is claimed is:

1. A developing unit performing a developing step of supplying a developing solution to a substrate and thereafter, a cleaning step of supplying a cleaning liquid onto the substrate, comprising:
   a pH adjusting liquid supply section supplying a pH adjusting liquid onto the substrate in order to adjust a pH value of a liquid on the substrate during said cleaning step to a predetermined pH value, wherein
   the predetermined pH value is set based on a correlation curve, prepared in advance, of the pH value of the liquid on the substate and a zeta potential of insoluble substances in the liquid, so as to make an absolute value of the zeta potential of the insoluble substances maximum.

2. A developing unit according to claim 1, further comprising:
   a cleaning liquid supply section supplying a cleaning liquid to said substrate, being disposed independently from said pH adjusting liquid supply section; and
   a control section controlling supply flow rates of the liquids respectively from said pH adjusting liquid supply section and said cleaning liquid supply section.

3. A developing unit performing a developing step of supplying a developing solution to a substrate and thereafter, a cleaning step of supplying a cleaning liquid onto the substrate, comprising:
   a pH adjusting liquid supply section supplying a pH adjusting liquid onto the substrate in order to adjust a pH value of a liquid on the substrate during said cleaning step to a predetermined pH value, wherein:
   the predetermined pH value is set based on a correlation curve, prepared in advance, of the pH value of the liquid on the substrate and a zeta potential of insoluble substances in the liquid, so as to make an absolute value of the zeta potential of the insoluble substances equal to a set value or higher; and
   the set value is equal to or higher than a lowest value at which the insoluble substances start to cohere together.

4. The developing unit according to claim 3, further comprising:
   a cleaning liquid supply section supplying a cleaning liquid to said substrate, being disposed independently from said pH adjusting liquid supple section; and
   a control section controlling supply flow rates of the liquids respectively from said pH adjusting liquid supply section and said cleaning liquid supply section.

* * * * *